United States Patent
Jeong et al.

(10) Patent No.: US 12,382,768 B2
(45) Date of Patent: Aug. 5, 2025

(54) DISPLAY DEVICE

(71) Applicant: Samsung Display Co., LTD., Yongin-si (KR)

(72) Inventors: Jang Gyoon Jeong, Jeollanam-do (KR); Ki Sun Jang, Yongin-si (KR); Won Hee Nam, Hwaseong-si (KR); Suk Beom You, Anyang-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 672 days.

(21) Appl. No.: 17/382,896

(22) Filed: Jul. 22, 2021

(65) Prior Publication Data

US 2022/0037394 A1  Feb. 3, 2022

(30) Foreign Application Priority Data

Jul. 28, 2020  (KR) .................. 10-2020-0093983

(51) Int. Cl.
*H10H 29/14* (2025.01)
*H10H 20/821* (2025.01)
*H10H 20/831* (2025.01)

(52) U.S. Cl.
CPC ........ *H10H 29/142* (2025.01); *H10H 20/821* (2025.01); *H10H 20/831* (2025.01)

(58) Field of Classification Search
None
See application file for complete search history.

(56) References Cited

U.S. PATENT DOCUMENTS

| | | |
|---|---|---|
| 10,854,672 B2 | 12/2020 | Cho et al. |
| 2011/0019420 A1 | 1/2011 | Kadotani et al. |
| 2014/0008694 A1* | 1/2014 | Yamada ............... H10H 20/854 257/99 |
| 2021/0082997 A1 | 3/2021 | Cho et al. |
| 2022/0005979 A1* | 1/2022 | Kang ................. H01L 25/0753 |
| 2022/0278253 A1* | 9/2022 | Yang ...................... H01L 33/62 |

FOREIGN PATENT DOCUMENTS

| | | |
|---|---|---|
| KR | 10-2016-0059569 | 5/2016 |
| KR | 10-2017-0141305 | 12/2017 |
| KR | 10-2019-0115160 | 10/2019 |
| KR | 10-2020-0037906 | 4/2020 |
| KR | 10-2020-0062458 | 6/2020 |
| KR | 10-2021-0103602 | 8/2021 |

OTHER PUBLICATIONS

International Search Report corresponding to International Application No. PCT/KR2021/009638 dated Nov. 2, 2021.
Written Opinion corresponding to International Application No. PCT/KR2021/009638 dated Nov. 2, 2021.

* cited by examiner

*Primary Examiner* — Yara B Green
*Assistant Examiner* — Tessa Elizabeth McNamee
(74) *Attorney, Agent, or Firm* — KILE PARK REED & HOUTTEMAN PLLC

(57) ABSTRACT

A display device includes a first electrode and a second electrode disposed on a substrate, spaced apart from each other in a first direction, and extending in a second direction; and a plurality of light-emitting elements disposed on the first and second electrodes and spaced apart from one another in the second direction, wherein the first electrode includes at least one first part having a greater width than the second electrode in the first direction and at least one second part having a smaller width than the at least one first part in the first direction.

20 Claims, 37 Drawing Sheets

DISPLAY DEVICE

CROSS-REFERENCE TO RELATED APPLICATION(S)

This application claims priority from Korean Patent Application No. 10-2020-0093983 under 35 U.S.C. § 119, filed in the Korean Intellectual Property Office (KIPO) on Jul. 28, 2020, the entire contents of which are incorporated herein by reference.

BACKGROUND

1. Technical Field

The disclosure relates to a display device.

2. Description of the Related Art

Display devices are becoming more important with developments in multimedia technology. Accordingly, various display devices such as an organic light-emitting diode (OLED) display device, a liquid crystal display (LCD) device, and the like have been used.

A typical display device includes a display panel such as an organic light-emitting display panel or a liquid crystal display (LCD) panel. A light-emitting display panel may include light-emitting elements. For example, light-emitting diodes (LEDs) include organic light-emitting diodes (OLEDs) using an organic material as a fluorescent material and inorganic LEDs using an inorganic material as a fluorescent material.

SUMMARY

Embodiments of the disclosure provide a display device having a new electrode structure and thereby having light-emitting elements arranged densely in particular regions.

Embodiments of the disclosure also provide a display device having a new electrode structure and thereby preventing the agglomeration of light-emitting elements.

However, embodiments of the disclosure are not restricted to those set forth herein. The above and other embodiments of the disclosure will become more apparent to one of ordinary skill in the art to which the disclosure pertains by referencing the detailed description of the disclosure given below.

According to an embodiment of the disclosure, a display device comprising a first electrode and a second electrode disposed on a substrate, spaced apart from each other in a first direction, and extending in a second direction; and a plurality of light-emitting elements disposed on the first and second electrodes and spaced apart from one another in the second direction, wherein the first electrode includes at least one first part having a greater width than the second electrode in the first direction and at least one second part having a smaller width than the at least one first part in the first direction.

A first side of the at least one first part of the first electrode and a first side of the at least one second part of the first electrode may face the second electrode and may be linearly aligned in the second direction, and a second side of the at least one first part of the first electrode may protrude in the first direction more than a second side of the at least one second part of the first electrode.

The plurality of light-emitting elements may include a first light-emitting element group including at least one light-emitting element that includes a first end portion disposed on the at least one first part of the first electrode and a second end portion disposed on the second electrode; and a second light-emitting element group including at least one light-emitting element that includes a first end portion disposed on the at least one second part of the first electrode and a second end portion disposed on the second electrode, and the first light-emitting element group may have a greater number of light-emitting elements per unit area than the second light-emitting element group.

The at least one first part of the first electrode may include a plurality of first parts, and the at least one second part may be disposed between the plurality of first parts.

The at least one second part of the first electrode may include a plurality of second parts, and the at least one first part may be disposed between the plurality of second parts.

A width of the at least one first part of the first electrode may vary in the second direction.

The first electrode may further include at least one third part having a smaller width than the at least one second part, and the at least one third part, the at least one second part, and the at least one first part may be sequentially arranged in the second direction.

The first electrode may further include at least one fourth part having a smaller width than the at least one first part and having a greater width than the at least one second part, and a width of the at least one fourth part may vary in the second direction.

The at least one first part of the first electrode may include a plurality of first parts, and the at least one second part of the first electrode may include a plurality of second parts, and the plurality of first parts and the plurality of second parts may be alternately arranged in the first direction.

The plurality of first parts may be disposed to adjoin one another, and the plurality of second parts may be disposed at boundaries between the plurality of first parts.

The display device may further comprise a third electrode disposed between the first and second electrodes and having a width equal to a width of the second electrode; and a fourth electrode disposed between the second and third electrodes and including at least one first part and at least one second part, wherein the plurality of light-emitting elements may be disposed on the first and third electrodes or on the second and fourth electrodes.

The display device may further comprise a first contact electrode disposed on the first electrode and electrically contacting the plurality of light-emitting elements; and a second contact electrode disposed on the second electrode and electrically contacting the plurality of light-emitting elements.

The plurality of light-emitting elements may include at least one first light-emitting element that includes a first end portion electrically contacting the first contact electrode and at least one second light-emitting element that includes a second end portion electrically contacting the second contact electrode, and the display device may further comprise a third contact electrode electrically contacting a second end portion of the at least one first light-emitting element and a first end portion of the second light-emitting element.

According to an embodiment of the disclosure, a display device comprising a plurality of subpixels, wherein each of the plurality of subpixels may include a first electrode which has a circular shape and overlaps a contact hole at a center of a corresponding one of the plurality of subpixels, a second electrode which includes an electrode hole to expose the first electrode and is disposed to surround, and be spaced apart from, the first electrode, and a plurality of light-emitting elements, which are disposed between the first and second electrodes, and the second electrode includes a first part and a second part having different widths with respect to the electrode hole.

The second electrode may have a polygonal shape, a width of the first part of the second electrode may be greater than a radius of the first electrode, and a width of the second part of the second electrode may be smaller than the width of the first part of the second electrode.

The first electrode may include a first outer part having a uniform width and facing an inner side of the electrode hole of the second electrode and at least one first protruding part protruding from the first outer part toward the contact hole, and the at least one first protruding part may be disposed to correspond to the first part of the second electrode.

The second electrode may include a second outer part surrounding the first outer part and at least one second protruding part protruding from the second outer part in an opposite direction to a direction in which the at least one first protruding part protrudes, to correspond to the at least one first protruding part.

The second electrode may include a second outer part surrounding the first outer part and at least one expanded part protruding from the second outer part in an opposite direction to a direction in which the at least one first protruding part protrudes, to correspond to the at least one first protruding part, and a size of the at least one expanded part may be greater than a size of the at least one first protruding part.

The plurality of subpixels may include a first subpixel, a second subpixel which is disposed in a first diagonal direction with respect to the first subpixel, and a third subpixel which is disposed in a second diagonal direction with respect to the first subpixel, and the second electrode of each of the first, second, and third subpixels may be electrically connected to one another at a boundary between the first, second, and third subpixels.

A size of each of the first and second electrodes of the first subpixel may be greater than a size of each of the first and second electrodes of the second subpixel.

According to the aforementioned and other embodiments of the disclosure, light-emitting elements may be arranged at a high density at a particular location by generating the flow of ink. Accordingly, the light-emitting elements with dipoles may be prevented from agglomerating in ink, and the number of light-emitting elements that fail to be disposed on electrodes and are lost may be reduced.

Multiple light-emitting element groups may be formed depending on the shape of the electrodes, and the luminance per unit area may be improved by improving electrical connections between the light-emitting element groups.

Other features and embodiments may be apparent from the following detailed description, the drawings, and the claims.

BRIEF DESCRIPTION OF THE DRAWINGS

The above and other embodiments and features of the disclosure will become more apparent by describing in detail embodiments thereof with reference to the attached drawings, in which.

DETAILED DESCRIPTION OF THE EMBODIMENTS

The disclosure will now be described in more detail hereinafter with reference to the accompanying drawings, in which some embodiments of the disclosure are shown. The disclosure may, however, be embodied in different forms and should not be construed as being limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," or the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly defined herein.

Hereinafter, some embodiments of the present disclosure will be described with reference to the accompanying drawings.

Figure 1:
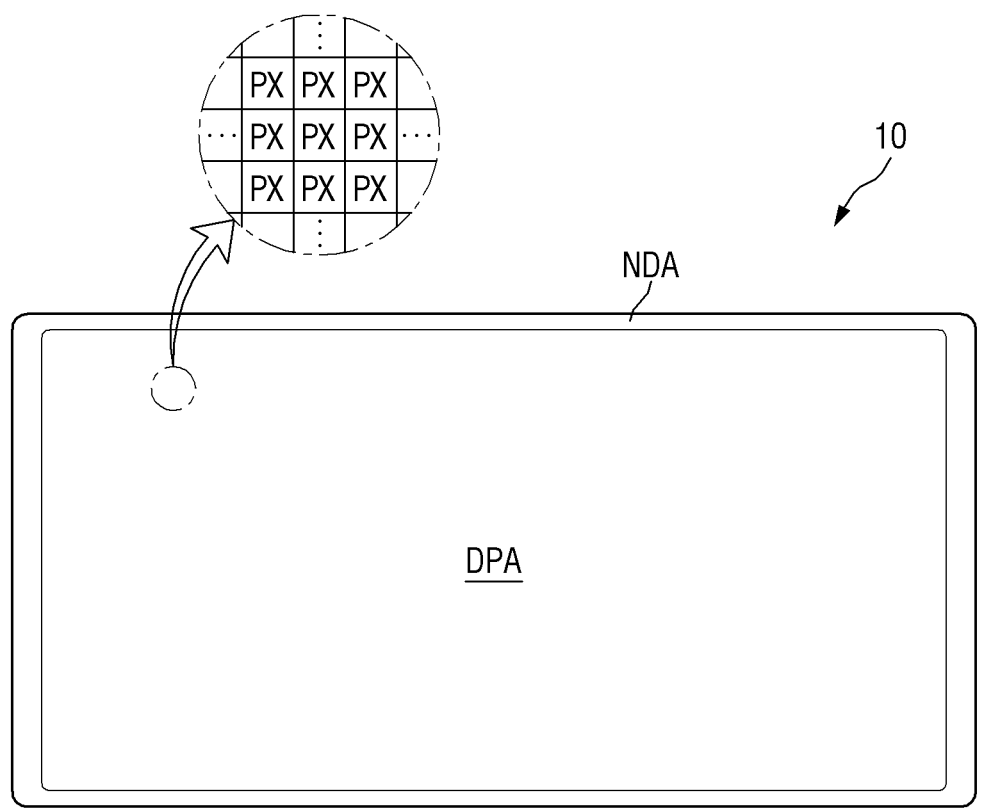
FIG. 1 is a schematic plan view of a display device according to an embodiment of the disclosure.

FIG. 1 is a schematic plan view of a display device according to an embodiment of the disclosure.

Referring to FIG. 1, a display device 10 displays a moving or still image. The display device 10 may refer to nearly all types of electronic devices that provide a display screen. Examples of the display device 10 may include a television (TV), a laptop computer, a monitor, a billboard, an Internet-of-Things (IoT) device, a mobile phone, a smartphone, a tablet personal computer (PC), an electronic watch, a smartwatch, a watchphone, a head-mounted display (HMD), a mobile communication terminal, an electronic notepad, an electronic book (e-book), a portable multimedia player (PMP), a navigation device, a gaming console, a digital camera, a camcorder, and the like.

The display device 10 includes a display panel that provides a display screen. Examples of the display panel of the display device 10 include an inorganic light-emitting diode (ILED) display panel, an organic light-emitting diode (OLED) display panel, a quantum-dot light-emitting diode (QLED) display panel, a plasma display panel (PDP), a field-emission display (FED) panel, and the like. The display panel of the display device 10 will hereinafter be described as being, for example, an ILED display panel, but the disclosure is not limited thereto. In other words, various other display panels are also applicable to the display panel of the display device 10.

The shape of the display device 10 may vary. For example, the display device 10 may have a rectangular shape that extends longer in a horizontal direction than in a vertical direction, a rectangular shape that extends longer in the vertical direction than in the horizontal direction, a square shape, a tetragonal shape with rounded corners, a non-tetragonal polygonal shape, or a circular shape. The shape of a display area DPA of the display device 10 may be similar to the shape of the display device 10. FIG. 1 illustrates that the display device 10 and the display area DPA both have a rectangular shape that extends longer in the horizontal direction than in the vertical direction.

The display device 10 may include the display area DPA and a non-display area NDA. The display area DPA may be an area in which a screen is displayed, and the non-display area NDA may be an area in which a screen is not displayed. The display area DPA may also be referred to as an active area, and the non-display area NDA may also be referred to as an inactive area. The display area DPA may occupy the middle part of the display device 10.

The display area DPA may include pixels PX. The pixels PX may be arranged in row and column directions. The pixels PX may have a rectangular or square shape in a plan view, but the disclosure is not limited thereto. As another example, the pixels PX may have a rhombus shape having sides that are inclined with respect to a particular direction. The pixels PX may be alternately arranged in a stripe fashion or a PENTILE™ fashion. Each of the pixels PX may include one or more light-emitting elements ED, which emit light of a particular wavelength range.

The non-display area NDA may be disposed around the display area DPA. The non-display area NDA may surround the entire display area DPA or part of the display area DPA. The display area DPA may have a rectangular shape, and the non-display area NDA may be disposed adjacent to four sides of the display area DPA. The non-display area NDA may form the bezel of the display device 10. Wires or circuit drivers included in the display device 10 may be disposed in the non-display area NDA, or external devices may be mounted in the non-display area NDA.

Figure 2:
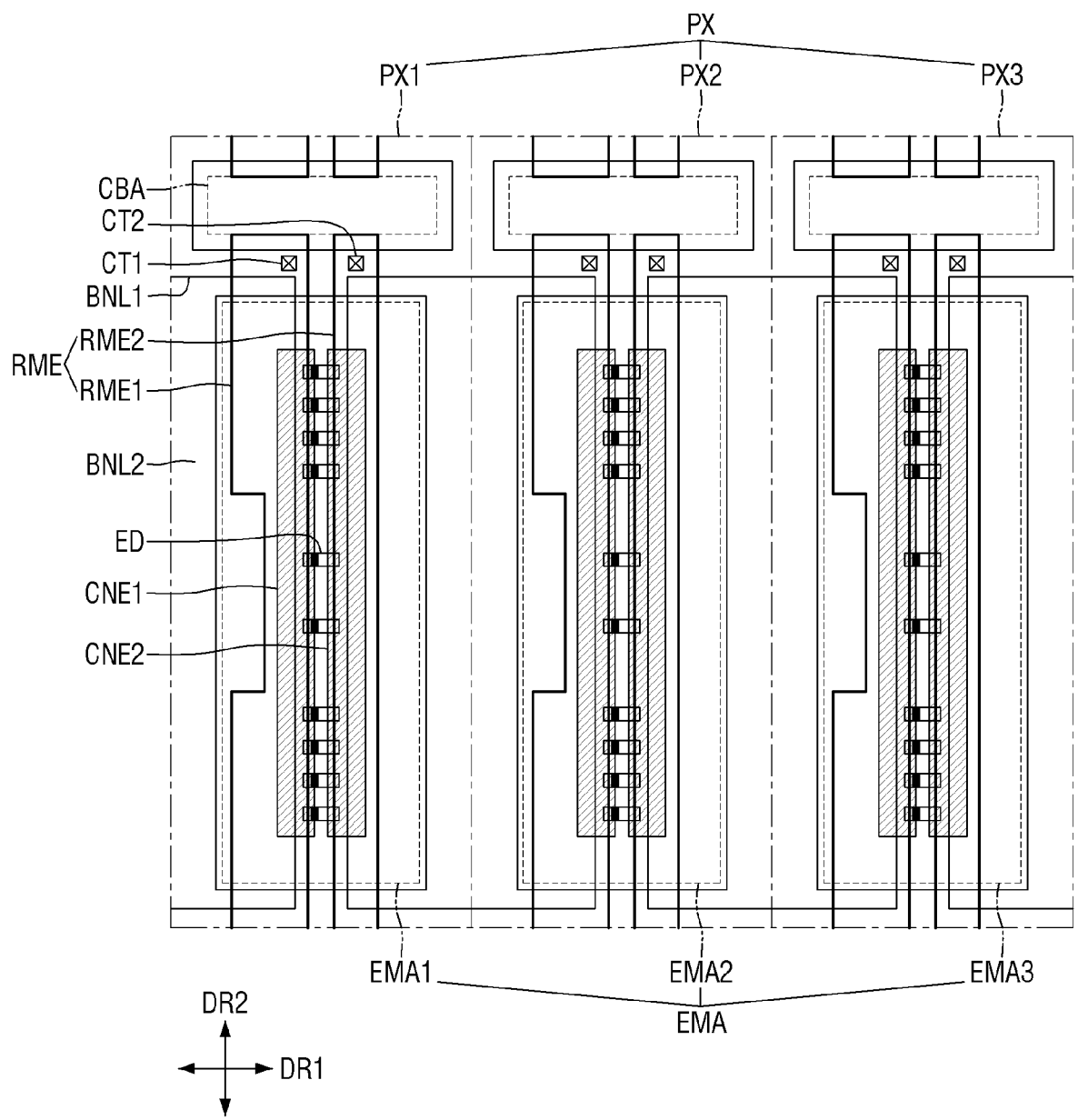
FIG. 2 is a schematic plan view of a pixel of the display device of FIG. 1.

FIG. 2 is a schematic plan view of a pixel of the display device of FIG. 1.

Referring to FIG. 2, a pixel PX may include subpixels PXn (where n is an integer of 1 to 3). For example, the pixel PX may include first, second, and third subpixels PX1, PX2, and PX3. The first, second, and third subpixels PX1, PX2, and PX3 may emit light of first, second, and third colors, respectively. For example, the first, second, and third colors may be blue, green, and red, respectively, but the disclosure is not limited thereto. As another example, the first, second, and third subpixels PX1, PX2, and PX3 may emit light of the same color. FIG. 2 illustrates that the pixel PX includes three subpixels PXn, but the disclosure is not limited thereto. For example, the pixel PX may include more than three subpixels PXn.

Each of the subpixels PXn may include an emission area EMA and a non-emission area. The emission area EMA may be an area in which light-emitting elements ED are disposed to emit light of a particular wavelength range, and the non-emission area may be an area from which no light is output because of the absence of the light-emitting elements ED. The emission area EMA may include regions where the light-emitting elements ED are disposed and regions around or adjacent to the light-emitting elements ED that light emitted by the light-emitting elements ED is output from.

However, the disclosure is not limited to this. As another example, the emission area EMA may also include regions that light emitted by the light-emitting elements ED and then reflected or refracted by other members is output from. The light-emitting elements ED may be disposed in each of the subpixels PX to form the emission area EMA.

First, second, and third emission areas EMA1, EMA2, and EMA3 of the first, second, and third subpixels PX1, PX2, and PX3 are illustrated as having substantially the same size, but the disclosure is not limited thereto. As another example, the first, second, and third emission areas EMA1, EMA2, and EMA3 of the first, second, and third subpixels PX1, PX2, and PX3 may have different sizes depending on the color or wavelength range of light emitted by the light-emitting elements ED.

Each of the subpixels PXn may further include a first area CBA, which is disposed in the non-emission area, and a second area, which accounts for the rest of the first area CBA. The first area CBA may be disposed on a side, in a second direction DR2, of the emission area EMA. The first area CBA may be disposed between emission areas EMA of two subpixels PXn that are adjacent to each other in the second direction DR2. For example, emission areas EMA and first areas CBA may be arranged in the display area DPA of the display device 10. For example, emission areas EMA may be arranged in rows in a first direction DR1, first areas CBA may be arranged in rows in the first direction DR1, and the emission areas EMA and the first areas CBA may be alternately arranged in the second direction DR2. A second bank BNL2 may be disposed between the first areas CBA and the emission areas EMA, and the distances between the first areas CBA, between the emission areas EMA, and between the first areas CBA and the emission areas EMA may vary depending on the width of the second bank BNL2. As light-emitting elements ED are not disposed in the first areas CBA, no light is output from the first areas CBA. Instead, parts of electrodes RME may be disposed in the first areas CBA. The electrodes RME may be divided in the first areas CBA, but the disclosure is not limited thereto. As another example, the electrodes RME may not be divided in the first areas CBA. The entire non-emission area EMA except for the first areas CBA may be defined as a second area, and the second area may account for the entire display area DPA except for the first areas CBA and the emission areas EMA.

Figure 3:
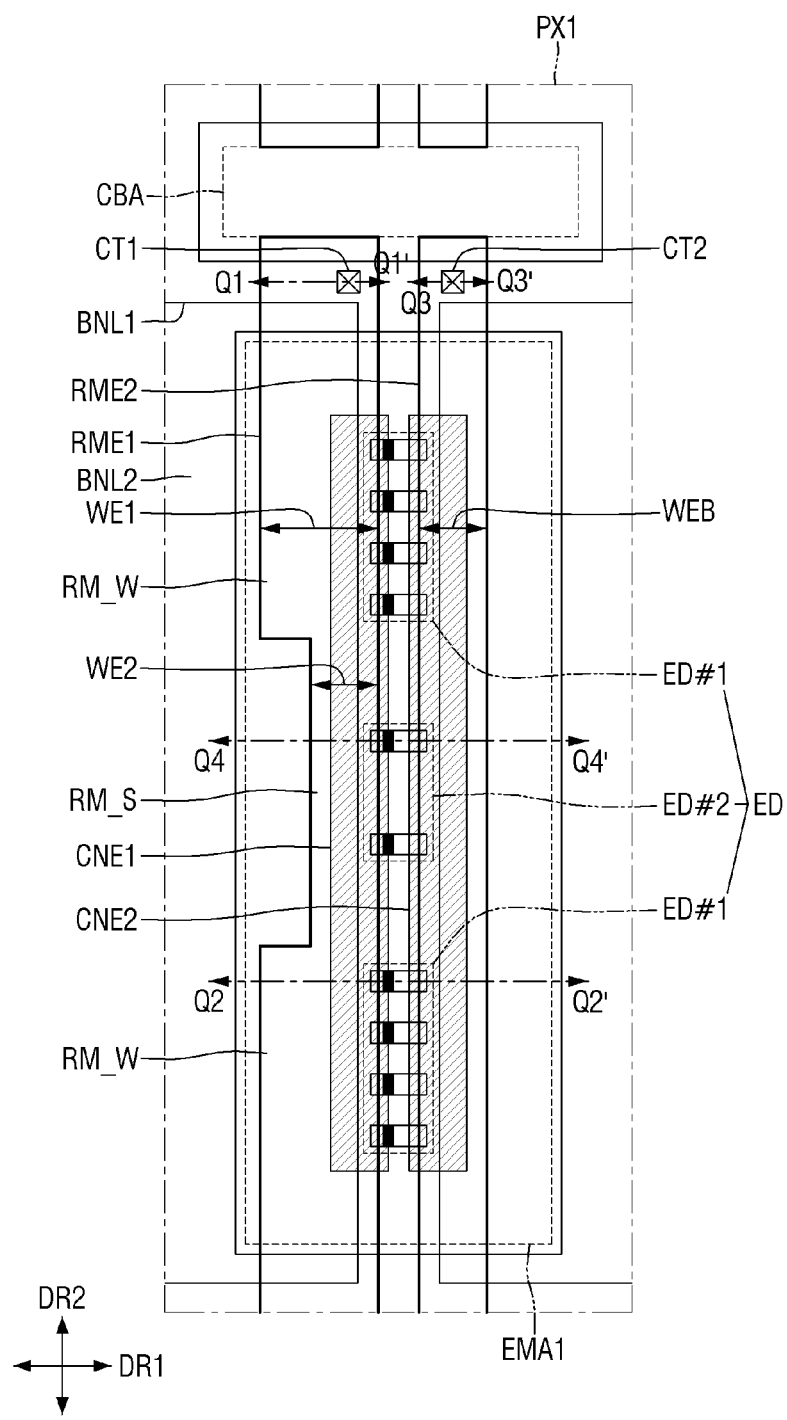
FIG. 3 is a schematic plan view of a first subpixel of FIG. 2.
Figure 4:
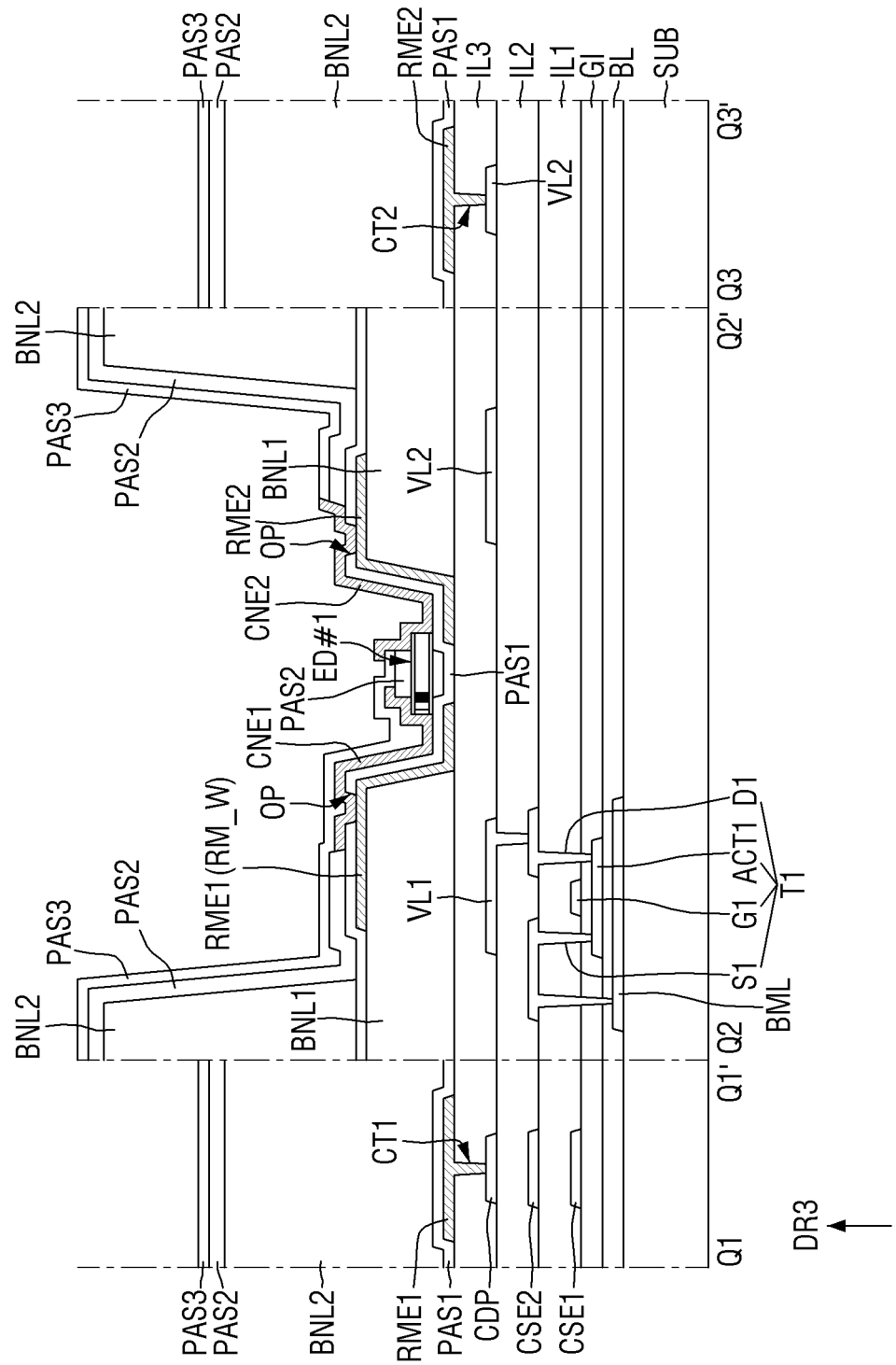
FIG. 4 is a schematic cross-sectional view taken along line Q1-Q1', Q2-Q2', and Q3-Q3' of FIG. 3.

FIG. 3 is a schematic plan view of a first subpixel of FIG. 2. FIG. 4 is a schematic cross-sectional view taken along line Q1-Q1', Q2-Q2', and Q3-Q3' of FIG. 3. FIG. 4 illustrates a cross-sectional view taken from one end to the other end of one of the light-emitting elements ED in one of the subpixels PXn of FIG. 2, particularly, in the first subpixel PX1.

Referring to FIGS. 3 and 4 and further to FIG. 2, the display device 10 may include a first substrate SUB and a semiconductor layer, conductive layers, and insulating layers, which are disposed on the first substrate SUB. The semiconductor layer, the conductive layers, and the insulating layers may form a circuit layer and a light-emitting layer of the display device 10.

The first substrate SUB may be an insulating substrate. The first substrate SUB may be formed of (or include) an insulating material such as glass, quartz, or a polymer resin. The first substrate SUB may be a rigid substrate or a flexible substrate that is bendable, foldable, or rollable.

A first conductive layer BML may be disposed on the first substrate SUB. The first conductive layer BML is disposed to overlap an active layer ACT1 of a first transistor T1. The first conductive layer BML includes a material capable of blocking light and may prevent light from being incident upon the active layer ACT1 of the first transistor T1. For example, the first conductive layer BML may be formed of an opaque metallic material capable of blocking the transmission of light, but the disclosure is not limited thereto. In some embodiments, the first conductive layer BML may not be provided.

A buffer layer BL may be disposed on the entire surfaces of the first conductive layer BML and the first substrate SUB. The buffer layer BL may be formed on the first substrate SUB, which is susceptible to moisture, to protect the first transistor T1 from moisture, and may perform a surface planarization function.

A semiconductor layer is disposed on the buffer layer BL. The semiconductor layer may include the active layer ACT1 of the first transistor T1, and the active layer ACT1 of the first transistor T1 may be disposed to overlap in part a gate electrode G1 of a second conductive layer that will be described below.

FIGS. 3 and 4 illustrate only the first transistor T1 among other transistors included in the first subpixel PX1, but the disclosure is not limited thereto. The display device 10 may include more than one transistor in each of the subpixels PXn. For example, the display device 10 may include two or three transistors in each of the subpixels PXn.

The semiconductor layer may include polycrystalline silicon, monocrystalline silicon, or an oxide semiconductor. In a case where the semiconductor layer includes an oxide semiconductor, the semiconductor layer may include conductor regions and a channel region disposed between the conductor regions. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO).

As another example, the semiconductor layer may include polycrystalline silicon, which may be formed by crystallizing amorphous silicon. In this case, the conductor regions of the active layer ACT1 may be impurity-doped regions.

A first gate insulating layer GI is disposed on the semiconductor layer and the buffer layer BL. The first gate insulating layer GI may function as a gate insulating film for each transistor.

The second conductive layer is disposed on the first gate insulating layer GI. The second conductive layer may include the gate electrode G1 of the first transistor T1 and a first capacitive electrode CSE1 of a storage capacitor. The gate electrode G1 may be disposed to overlap the channel region of the active layer ACT1 in a thickness direction D3. The first capacitive electrode CSE1 may be disposed to overlap a second capacitive electrode CSE2 that will be described below, in the thickness direction D3. For example, the first capacitive electrode CSE1 may be electrically connected to, and/or integrally formed with (or integral with), and the gate electrode G1.

A first interlayer insulating layer IL1 is disposed on the second conductive layer. The first interlayer insulating layer IL1 may function as an insulating film between the second conductive layer and layers disposed on the second conductive layer. The first interlayer insulating layer IL1 may be disposed to cover or overlap and protect the second conductive layer.

A third conductive layer is disposed on the first interlayer insulating layer ILL The third conductive layer may include a first source electrode S1 and a first drain electrode D1 of the first transistor T1, and the second capacitive electrode CSE2.

The first source electrode S1 and the first drain electrode D1 of the first transistor T1 may contact the doped regions of the active layer ACT1 through contact holes that penetrate the first interlayer insulating layer IL1 and the first gate insulating layer GI. The first source electrode S1 of the first transistor T1 may contact the first conductive layer BML through another contact hole.

The second capacitive electrode CSE2 is disposed to overlap the first capacitive electrode CSE1 in the thickness direction DR3. For example, the second capacitive electrode CSE2 may be integrally formed with, and electrically connected to, the first source electrode S1. A storage capacitor may be formed between the first and second capacitive electrodes CSE1 and CSE2.

Although not specifically illustrated, the third conductive layer may further include a data line, which applies a data signal to other transistors than the first transistor T1. The data line may be electrically connected to source/drain electrodes of each of the other transistors and may thus transmit a signal to the other transistors.

A second interlayer insulating layer IL2 is disposed on the third conductive layer. The second interlayer insulating layer IL2 may function as an insulating film between the third conductive layer and layers disposed on the third conductive layer. The second interlayer insulating layer IL2 may overlap and protect the third conductive layer.

A fourth conductive layer is disposed on the second interlayer insulating layer IL2. The fourth conductive layer may include a first voltage line VL1, a second voltage line VL2, and a first conductive pattern CDP. A high-potential voltage (or a first power supply voltage) to be provided to the first transistor T1 may be applied to the first voltage line VL1, and a low-potential voltage (or a second power supply voltage) to be provided to a second electrode RME2 may be applied to the second voltage line VL2.

The first and second voltage lines VL1 and VL2 of the fourth conductive layer may be disposed to overlap, in the thickness direction DR3, electrodes (RME1 and RME2), respectively, that will be described below. The first voltage line VL1 may extend in the second direction DR2 from a boundary of the first subpixel PX1 and may then be bent in part to be placed inside a first emission area EMA1 of the first subpixel PX1. The second voltage line VL2 may extend across the first emission area EMA1.

A first conductive pattern CDP may be electrically connected to the second capacitive electrode CSE2 and may be electrically connected to the first transistor T1. The first conductive pattern CDP may be electrically contact a first electrode RME1 that will be described below, and the first transistor T1 may transmit the first power supply voltage applied thereto from the first voltage line VL1 to the first electrode RME1. The fourth conductive data layer is illustrated as including a first voltage line VL1 and a second voltage line VL2, but the disclosure is not limited thereto. As another example, the fourth data conductive layer may include more than one first voltage line VL1 and more than one second voltage line VL2.

Each of the buffer layer BL, the first gate insulating layer GI, the first interlayer insulating layer ILL and the second interlayer insulating layer IL2 may include inorganic films that are alternately stacked. For example, each of the buffer layer BL, the first gate insulating layer GI, the first interlayer insulating layer ILL and the second interlayer insulating layer IL2 may be formed as a double layer or a multilayer in which one or more inorganic layers including at least one of silicon oxide ($SiO_x$), silicon nitride ($SiN_x$), and silicon oxynitride ($SiO_xN_y$) are alternately stacked, but the disclosure is not limited thereto. As another example, each of the buffer layer BL, the first gate insulating layer GI, the first interlayer insulating layer ILL and the second interlayer insulating layer IL2 may be formed as a single inorganic layer including at least one of silicon oxide, silicon nitride, and silicon oxynitride.

Each of the second, third, and fourth conductive layers may be formed as a single layer or a multilayer including at least one of molybdenum (Mo), aluminum (Al), chromium (Cr), gold (Au), titanium (TI), nickel (Ni), neodymium (Nd), copper (Cu), and an alloy thereof, but the disclosure is not limited thereto.

A third interlayer insulating layer IL3 is disposed on the fourth conductive layer. The third interlayer insulating layer IL3 may include an organic insulating material such as, for example, polyimide (PI), and may perform a surface planarization function.

As parts of a display element layer, first banks BNL1, electrodes (RME1 and RME2), light-emitting elements ED, contact electrodes (CNE1 and CNE2), and a second bank BNL2 are disposed on the third interlayer insulating layer IL3. Insulating layers (PAS1, PAS2, and PAS3) may also be disposed on the third interlayer insulating layer IL3.

The first banks BNL1 may be disposed directly on the third interlayer insulating layer IL3. The first banks BNL1 may extend in the first direction DR1, even into neighboring subpixels PXn of the first subpixel PX1 and may be disposed to be spaced apart from each other in the first direction DR1. Also, the first banks BNL1 may extend in the second direction DR2 to be disposed in the first subpixel PX1. For example, the first banks BNL1 may be formed to have a predetermined width in the first and second directions DR1 and DR2, parts of the first banks BNL1 may be disposed in the first emission area EMA1, and other parts of the first banks BNL1 may be disposed in the neighboring subpixels PXn, in the first direction DR1, of the first subpixel PX1. Also, the length, in the second direction DR2, of the first banks BNL1 may be greater than the length, in the second direction DR2, of the first emission area EMA1 so that parts of the first banks BNL1 may be disposed to overlap the second bank BNL2 in the non-emission area.

Multiple first banks BNL1 may be disposed in each of the subpixels PXn. For example, two first banks BNL1 may be disposed in part in the emission area EMA of each of the subpixels PXn, and the light-emitting elements ED may be disposed between the two first banks BNL1 that are spaced apart from each other in the first direction DR1. FIG. 3 illustrates that two first banks BNL1 are disposed in the emission area EMA of each of the subpixels PXn to form island patterns, but the disclosure is not limited thereto. The number of first banks BNL1 provided in the emission area EMA of each of the subpixels PXn may vary depending on the number of electrodes (RME1 and RME2) or the arrangement of light-emitting elements ED in each of the subpixels PXn.

The first banks BNL1 may protrude at least in part from the top surface of the third interlayer insulating layer IL3. Each of protruding parts of the first banks BNL1 may have inclined side surfaces, and light emitted from the light-emitting elements ED may be reflected by the electrodes (RME1 and RME2) disposed on the first banks BNL1 to be emitted in an upward direction from the third interlayer insulating layer IL3. The first banks BNL1 may provide an area in which the light-emitting elements ED are arranged, and may function as reflective walls that upwardly reflect light emitted from the light-emitting elements ED. The side surfaces of each of the first banks BNL1 may be linearly inclined, but the disclosure is not limited thereto. Each of the first banks BNL1 may have a semicircular or semielliptical shape with a curved outer surface. The first banks BNL1 may include an organic insulating material such as polyimide, but the disclosure is not limited thereto. In some embodiments, the first banks BNL1 may not be provided.

The electrodes (RME1 and RME2) may extend in a direction and may be disposed in each of the subpixels PXn. The electrodes (RME1 and RME2) may extend in the second direction DR2 and may be spaced apart from one another in the first direction DR1. In each of the subpixels PXn, for example, in the first subpixel PX1, first and second electrodes RME1 and RME2 may be disposed to be spaced apart from each other in the first direction DR1, but the disclosure is not limited thereto. For example, the number and the locations of electrodes (RME1 and RME2) disposed in each of the subpixels PXn may vary depending on the number of light-emitting elements ED disposed in each of the subpixels PXn.

The first and second electrodes RME1 and RME2 may be disposed in the first emission area EMA1 and may be disposed in part beyond the first emission area EMA1 to overlap the second bank BNL2 in the thickness direction D3. The electrodes (RME1 and RME2) may extend in the second direction DR2 in the first subpixel PX1 and may be separated from electrodes (RME1 and RME2) of the neighboring subpixel PXn in the second direction DR2 in the first area CBA.

The arrangement of electrodes (RME1 and RME2) may be obtained by forming electrode lines that extend in the second direction DR2 and dividing the electrode lines after the arrangement of the light-emitting elements ED. The electrode lines may be used during the fabrication of the electrode lines to form an electric field in the subpixel PXn to align the light-emitting elements ED during the fabrication of the display device 10. For example, the light-emitting elements ED may be sprayed onto the electrode lines via inkjet printing, and once ink including the light-emitting elements ED is sprayed onto the electrode lines, an electric field is formed by applying alignment signals to the electrode lines. The light-emitting elements ED scattered in the ink receives a dielectrophoretic force from the electric field and may thus be arranged on the electrodes (RME1 and RME2). After the arrangement of the light-emitting elements ED, the electrode lines are divided into electrodes (RME1 and RME2) to be disposed in each of the subpixels PXn.

The electrodes (RME1 and RME2) may be electrically connected to the fourth conductive layer so that signals for causing the light-emitting elements ED to emit light may be applied to the electrodes (RME1 and RME2). The first electrode RME1 may electrically contact the first conductive pattern CDP through a first contact hole CT1, which penetrates the third interlayer insulating layer IL3. The second electrode RME2 may electrically contact the second voltage line VL2 through a second contact hole CT2, which penetrates the third interlayer insulating layer IL3. The first electrode RME1 may be electrically connected to the first transistor T1 via the first conductive pattern CDP so that the first power supply voltage may be applied to the first electrode RME1, and the second electrode RME2 may be electrically connected to the second voltage line VL2 so that the second power supply voltage may be applied to the second electrode RME2.

The electrodes (RME1 and RME2) may be electrically connected to the light-emitting elements ED. The electrodes (RME1 and RME2) may be connected to both end portions of each of the light-emitting elements ED through the contact electrodes (CNE1 and CNE2), respectively, and may transmit electrical signals received from the third conductive layer to the light-emitting elements ED. Since the electrodes (RME1 and RME2) are disposed to be divided between different subpixels PXn, light-emitting elements ED of one subpixel PXn may emit light separately from light-emitting elements ED of another subpixel PXn.

The first and second contact holes CT1 and CT2 are illustrated as being formed at locations that overlap the second bank BNL2, but the disclosure is not limited thereto. For example, the first and second contact holes CT1 and CT2 may be located in the first emission area EMA1 surrounded by the second bank BNL2.

The electrodes (RME1 and RME2) may be disposed on a pair of first banks BNL1 that are spaced apart from each other. The electrodes (RME1 and RME2) may be disposed on sides, in the first direction DR1, of the first banks BNL1 to be arranged on inclined side surfaces of the first banks BNL1. For example, the width, in the first direction DR1, of the electrodes (RME1 and RME2) may be smaller than the width, in the first direction DR1, of the first banks BNL1. The electrodes (RME1 and RME2) may be disposed to overlap at least one side surface of each of the first banks BNL1 to reflect light emitted from the light-emitting elements ED.

The distance, in the first direction DR1, between the electrodes (RME1 and RME2) may be smaller than the distance between the first banks BNL1. At least parts of the electrodes (RME1 and RME2) may be disposed directly on the third interlayer insulating layer IL3 on the same plane.

The electrodes (RME1 and RME2) may include a conductive material with high reflectance. For example, the electrodes (RME1 and RME2) may include a metal with high reflectance such as silver (Ag), copper (Cu), or aluminum (Al) or may include an alloy of aluminum (Al), nickel (Ni), or lanthanum (La). The electrodes (RME1 and RME2) may reflect light, which was emitted from the light-emitting elements ED to travel toward the sides of the first banks BNL1, in an upward direction from the first subpixel PX1.

However, the disclosure is not limited to this, and the electrodes (RME1 and RME2) may further include a transparent conductive material. For example, the electrodes (RME1 and RME2) may include a material such as ITO, IZO, or indium tin zinc oxide (ITZO). In some embodiments, each of the electrodes (RME1 and RME2) may form a structure in which a transparent conductive material and a metal with high reflectance are stacked into more than one layer or may be formed as a single layer including a transparent conductive material and a metal with high reflectance. For example, each of the electrodes (RME1 and RME2) may have a stack of ITO/Ag/ITO, ITO, ITO/Ag/IZO, or ITO/Ag/ITZO/IZO.

Each of the first and second electrodes RME1 and RME2 may include a portion having different widths. For example, the first electrode RME1 may include the first parts RM_W and the second part RM_S, which has a smaller width than the first parts RM_W and has a width identical to a width WEB of the second electrode RME2. The second electrode RME2 may have a uniform width, i.e., the width WEB, and may extend in the second direction DR2, but the first electrodes RME1 may extend in the second direction DR2 and may have different widths in the second direction DR2 as first and second parts RM_W and RM_S are alternately arranged repeatedly therein.

For example, the first parts RM_W of the first electrode RME1 may have a first width WE1 which may be the maximum width of the first electrode RME1, and the second part RM_S may have a second width WE2, which may be equal to the width WEB of the second electrode RME2. Specifically, the first electrode RME1 may extend in the second direction DR2 and may have a shape whose width changes. The second part RM_S, which has the width equal to the width WEB of the second electrode RME2, may be disposed adjacent to the center of the first emission area EMA1, the first parts RM_W, which have a greater width than the width WEB of the second electrode RME2, i.e., the first width WE1, may be connected to both sides, in the second direction DR2, of the second part RM_S. Sides of the first parts RM_W and the second part RM_S that face the second electrode RME2 may be aligned with one another, and opposing sides of the first parts RM_W and the second part RM_S may be arranged in a staggered manner. For example, the outer side of the first electrode RME1 may be bent in part depending on the locations of the first parts RM_W and the second part RM_S, and the distance between the first and second electrodes RME1 and RME2 may be uniformly maintained.

As will be described below, the light-emitting elements ED may be disposed on the first and second electrodes RME1 and RME2, and the location and the alignment direction of the light-emitting elements ED scattered in ink may be changed by an electric field EL of FIG. 7, which is formed on the electrodes (RME1 and RME2). Similarly, electrical signals applied to the electrodes (RME1 and RME2) to form the electric field EL may generate induced electric charges in ink molecules located on the electrodes (RME1 and RME2). Ink molecules with induced electric charges may move by receiving a force from the electric field EL, and droplets may flow inside the ink. The flow of the droplets may affect the location and the alignment direction of the light-emitting elements ED and may be controlled in accordance with the area or the width of the electrodes (RME1 and RME2). In the display device 10, one of the electrodes (RME1 and RME2), for example, the first electrode RME1, may have a different width in part from another electrode, i.e., the second electrode RME2, and the flow of ink may be controlled such that the ink may move in a particular direction in the process of arranging the light-emitting elements. In this manner, the alignment of the light-emitting elements ED at a particular location may be induced.

Accordingly, the number or density of light-emitting elements ED on each of the first parts RM_W of the first electrode RME1 may differ from the number or density of light-emitting elements ED on the second part RM_S. The first electrode RME1 is illustrated as having one second part RM_S and two first parts RM_W connected to the second part RM_S, but the disclosure is not limited thereto. The first electrode RME1 may be modified into various other shapes to properly control the arrangement of the light-emitting elements ED, and this will be described below in detail.

A first insulating layer PAS1 is disposed on the electrodes (RME1 and RME2) and the first banks BNL1. The first insulating layer PAS1 may be disposed to cover or overlap the first banks BNL1 and the first and second electrodes RME1 and RME2 and to expose parts of the top surfaces of the first and second electrodes RME1 and RME2. Openings OP may be formed in the first insulating layer PAS1 to expose parts of the top surfaces of the electrodes (RME1 and RME2) disposed on the first banks BNL1, and the contact electrodes (CNE1 and CNE2) may electrically contact the electrodes (RME1 and RME2) through the openings OP.

For example, the first insulating layer PAS1 may be formed to have a recessed top surface between the first and second electrodes RME1 and RME2. As the first insulating layer PAS1 may be disposed to overlap the first and second electrodes RME1 and RME2, the first insulating layer PAS1 may be formed to be recessed between the first and second electrodes RME1 and RME2, but the disclosure is not limited thereto. The first insulating layer PAS1 may protect the first and second electrodes RME1 and RME2 and may insulate the first and second electrodes RME1 and RME2 from each other. Also, the first insulating layer PAS1 may prevent the light-emitting elements ED from directly contacting and being damaged by other elements.

The second bank BNL2 may be disposed on the first insulating layer PAS1. In a plan view, the second bank BNL2 may include parts that extend in the first direction DR1 and parts that extend in the second direction DR2 and may thus be arranged in a lattice pattern. The second bank BNL2 may be disposed along the boundaries of each of the subpixels PXn to define each of the subpixels PXn. Also, the second bank BNL2 may be disposed to surround the emission area EMA and the first area CBA of each of the subpixels PXn to separate the emission area EMA and the first area CBA of each of the subpixels PXn. Parts of the second bank BNL2 that extend in the second direction DR2, between the emission areas EMA of the subpixels PXn, may have a greater width than parts of the second bank BNL2 that extend in the second direction DR2, between the first areas CBA of the subpixels PXn. The distance between the first areas CBA of the subpixels PXn may be smaller than the distance between the emission areas EMA of the subpixels PXn.

The second bank BNL2 may be formed to have a greater height than the first banks BNL1. The second bank BNL2 may prevent ink from spilling over between different subpixels PXn in an inkjet printing process during the fabrication of the display device 10 and may divide ink having the light-emitting elements ED scattered therein between different subpixels PXn to prevent mixture of the ink. As each of the first banks BNL1 are disposed to extend across a pair of adjacent subpixels PXn in the first direction DR1, the parts of the second bank BNL2 that extend in the second direction DR2 may be disposed in part on the first banks BNL1. The second bank BNL2, similar to the first banks BNL1, may include polyimide, but the disclosure is not limited thereto.

The light-emitting elements ED may be disposed on the first insulating layer PAS1. Multiple light-emitting elements ED may be disposed to be spaced apart from one another in the direction in which the electrodes (RME1 and RME2) extend, i.e., in the second direction DR2 and may be aligned substantially parallel to one another. Respective light-emitting elements ED may extend in a direction, and the direction in which the electrodes (RME1 and RME2) extend may form a substantially right angle with the direction in which the respective light-emitting elements ED extend. However, the disclosure is not limited to this. As another example, the light-emitting elements ED may be arranged diagonally with respect to the direction in which the electrodes (RME1 and RME2) extend.

Each of the light-emitting elements ED may include semiconductor layers that are doped to have different conductivity types. As each of the light-emitting elements ED includes a plurality of semiconductor layers, the light-emitting elements ED may be aligned so that first end portions of each of the light-emitting elements ED may face a particular direction depending on the direction of an electric field formed on the electrodes (RME1 and RME2). Also, each of the light-emitting elements ED may include a light-emitting layer 36 (of FIG. 6) and may thus emit light of a particular wavelength range. Light-emitting layers 36 of different light-emitting elements ED may emit light of different wavelength ranges depending on the material(s) thereof, but the disclosure is not limited thereto. As another example, different light-emitting elements ED may emit light of the same color.

Multiple layers may be arranged in each of the light-emitting elements ED in a direction perpendicular to the top surface of the first substrate SUB. The light-emitting elements ED may be arranged such that a direction in which the light-emitting elements ED extend may be parallel to the first substrate SUB, and the semiconductor layers included in each of the light-emitting elements ED may be sequentially arranged in a direction parallel to the top surface of the first substrate SUB. However, the disclosure is not limited to this. As another example, the layers included in each of the light-emitting elements ED may be arranged in a direction perpendicular to the first substrate SUB.

The light-emitting elements ED may be disposed on the electrodes (RME1 and RME2) between the first banks BNL1. For example, the first end portions of the light-emitting elements ED may be disposed on the first electrode RME1, and the second end portions of the light-emitting elements ED may be disposed on the second electrode RME2. The length of the light-emitting elements ED may be greater than the distance between the first and second electrodes RME1 and RME2, and both end portions of each of the light-emitting elements ED may be disposed on the first and second electrodes RME1 and RME2.

Both end portions of each of the light-emitting elements ED may electrically contact the contact electrodes (CNE1 and CNE2). As an insulating film 38 (of FIG. 6) is not formed at both ends of each of the light-emitting elements ED to expose parts of the semiconductor layers of each of the light-emitting elements ED, the exposed semiconductor layers may contact the contact electrodes (CNE1 and CNE2), but the disclosure is not limited thereto. As another example, at least part of the insulating film 38 may be removed so that parts of side surfaces of the semiconductor layers of each of the light-emitting elements ED may be exposed. The exposed side surfaces of the semiconductor layers may directly contact the contact electrodes (CNE1 and CNE2).

As the display device 10 may have the light-emitting elements ED arranged in each of the subpixels PXn at different densities in different parts of the corresponding subpixel PXn, the light-emitting elements ED may be classified into multiple light-emitting element groups. For example, the light-emitting elements ED may be classified into first light-emitting element groups ED #1, which are groups of light-emitting elements ED disposed on first parts RM_W of the first electrode RME1, and a second light-emitting element group ED #2, which is a group of light-emitting elements ED disposed on a second part RM_S of the first electrode RME1. The first end portions of the light-emitting elements ED included in each of the first light-emitting element groups ED #1 may be disposed on one of the first parts RM_W of the first electrode RME1, and the first end portions of the light-emitting elements ED included in the second light-emitting element group ED #2 may be disposed on the second part RM_S of the first electrode RME1. The first light-emitting element groups ED #1 may have a greater number and higher density of light-emitting elements ED than the second light-emitting element group ED #2.

The terms "the density of light-emitting elements" and "the light-emitting element density of a light-emitting element group," as used herein, are terms associated with the number of light-emitting elements disposed on the electrodes (RME1 and RME2) and may define the number or distribution of light-emitting elements disposed in each arbitrary area defined on the electrodes (RME1 and RME2). For example, the light-emitting element density of the first light-emitting element groups ED #1, i.e., the number of light-emitting elements ED disposed on each of the first parts RM_W of the first electrode RME1, may be defined as the number of light-emitting elements ED disposed in a unit area including one of the first parts RM_W of the first electrode RME1 and a corresponding part of the second electrode RME2. Each of the light-emitting element density of each of the first light-emitting element groups ED #1 and the light-emitting element density of the second light-emitting element group ED #2 may be calculated as the number of light-emitting elements ED per unit area including parts (RM_W and RM_S) of the electrodes (RME1 and RME2). The term "density" does not necessarily refer to an absolute value but may be defined for comparing the number of light-emitting elements ED in one particular region with the number of light-emitting elements ED in another particular region.

As already mentioned above, the first electrode RME1 may include the first parts RM_W and the second part RM_S, which have different widths from each other, and width changes in the first electrode RME1 may induce the light-emitting elements ED to be densely arranged in a particular direction. In a case where the second electrode RME2 has a uniform width, the light-emitting elements ED may be induced to move toward the first parts RM_W of the first electrode RME1 that are relatively thick. The intensity of an electric field EL formed on the electrodes (RME1 and RME2) may vary depending on the width of the first electrode RME1, and the light-emitting elements ED may move in a particular direction in accordance with the flow of ink having the light-emitting elements ED scattered therein, depending on the width of the first electrode RME1.

Figure 5:
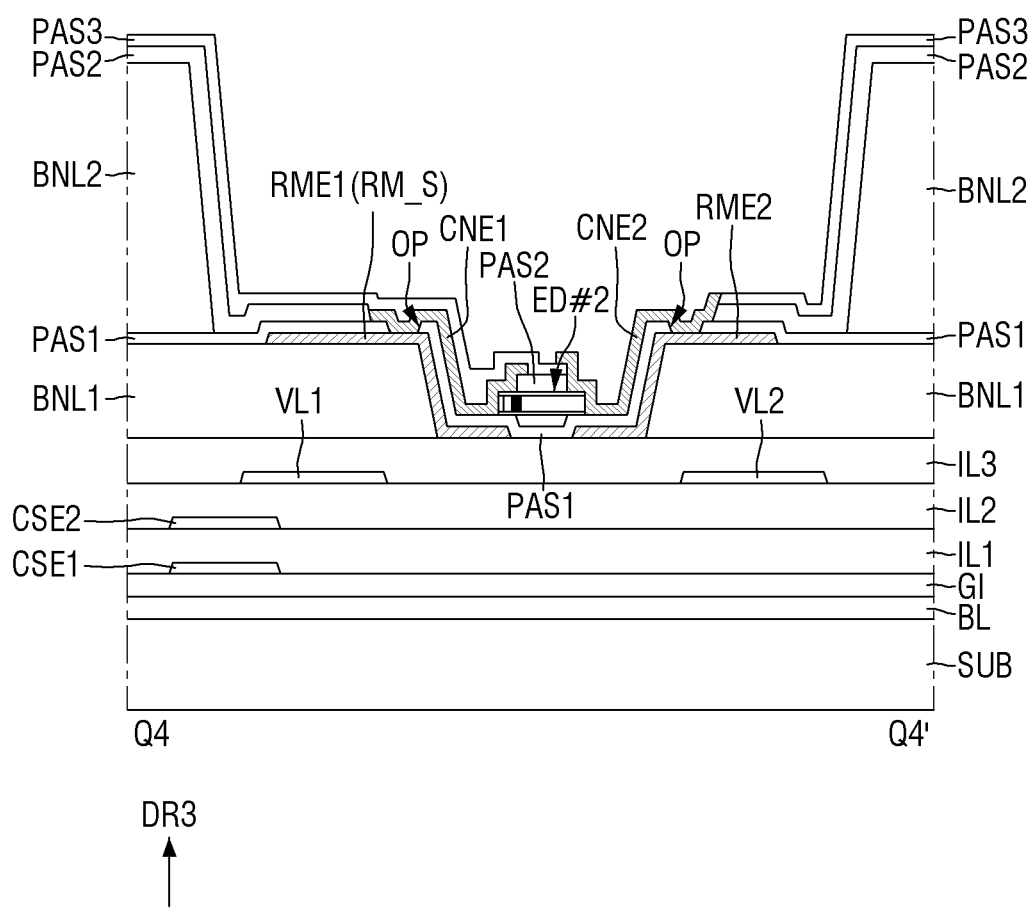
FIG. 5 is a schematic cross-sectional view taken along line Q4-Q4' of FIG. 3.

The light-emitting elements ED disposed in each subpixel PXn may be arranged on the electrodes (RME1 and RME2) at different densities for different parts of the first electrode RME1, rather than being arranged at a uniform density. The first light-emitting element groups ED #1 may have a greater light-emitting element density than the second light-emitting element group ED #2, and the arrangement of the first light-emitting elements ED #1 and the second light-emitting element group ED #2 may vary depending on the shape of the first electrode RME1, i.e., the locations of the first parts RM_W and the second part RM_S. For example, in a case where two first parts RM_W are located on both sides, in the second direction DR2, of the center of the first emission area EMA1, as illustrated in FIG. 3, two first light-emitting elements ED #1 may be provided on upper and lower sides of the center of the first emission area EMA1. The second light-emitting element group ED #2, which includes some light-emitting elements ED, may be arranged at the center of the first emission area EMA1, but the number of light-emitting elements ED included in the second light-emitting element group ED #2 may be smaller than the number of light-emitting elements ED included in each of the first light-emitting element groups ED #1. The first light-emitting elements groups ED #1 may be understood as having a relatively high density because of being disposed on the first parts RM_W and the second light-emitting element group ED #2 may be understood as having a relatively low density because of being disposed on the second part RM_S. However, the disclosure is not limited to this. As another example, light-emitting element groups (ED #1 and ED #2) having different light-emitting element densities may be formed on the first parts RM_W, depending on the shape of the first parts RM_W. For example, the first light-emitting element groups ED #1 and the second light-emitting element group ED #2 may be distinguished from one another by their light-emitting element densities, regardless of their locations on the first electrode RME1. (See also FIG. 5, which is a schematic cross-sectional view taken along line Q4-Q4' of FIG. 3.)

Both end portions of each of the light-emitting elements ED may be electrically connected to the electrodes (RME1 and RME2), respectively, and may thus receive electrical signals from the underlying conductive layers and emit light of a particular wavelength range.

The display device 10 may control the density of light-emitting elements ED disposed on the electrodes (RME1 and RME2) by controlling the shapes of the electrodes (RME1 and RME2), particularly, the first and second widths WE1 and WE2 of one of the electrodes (RME1 and RME2). Each of the subpixels PXn may be controlled to have a uniform brightness per unit area thereof depending on the arrangement and the density of light-emitting elements ED disposed in the emission area EMA thereof. Also, the luminance of each of the subpixels PXn may be further improved by inducing the light-emitting elements ED to be arranged in each of the subpixels PXn such that serial connections may be formed between different first light-emitting element groups ED #1.

A second insulating layer PAS2 may be disposed in part on the first insulating layer PAS1 and the light-emitting elements ED. For example, the second insulating layer PAS2 may be disposed to surround parts of outer surfaces of the light-emitting elements ED, but not cover or overlap the first end portions and the second end portions of the light-emitting elements ED. Also, the second insulating layer PAS2 may be disposed even on the first banks BNL1 and the second bank BNL2. For example, the second insulating layer PAS2 may be disposed not only on the light-emitting elements ED but also on the first banks BNL1 and the second bank BNL2 to expose both end portions of each of the light-emitting elements ED and parts of the first insulating layer PAS1 where the electrodes RME1 and RME2 are disposed. During the fabrication of the display device 10, the second insulating layer PAS2 may be initially disposed on the first insulating layer PAS1 and on the second bank BNL2 and may then be partially removed to expose both end portions of each of the light-emitting elements ED.

Parts of the second insulating layer PAS2 disposed on the light-emitting elements ED may extend in the second direction DR2, over the first insulating layer PAS1, and may thus form linear or island patterns in the first subpixel PX1. The second insulating layer PAS2 may protect and fix the light-emitting elements ED during the fabrication of the display device 10. Also, the second insulating layer PAS2 may be disposed to fill the spaces between the light-emitting elements ED and the first insulating layer PAS1.

Contact electrodes (CNE1 and CNE2) and a third insulating layer PAS3 may be disposed on the second insulating layer PAS2. First and second contact electrodes CNE1 and CNE2 may be disposed in part on the first and second electrodes RME1 and RME2, respectively. The first contact electrode CNE1 may be disposed on the first electrode RME1, the second contact electrode CNE2 may be disposed on the second electrode RME2, and the first and second contact electrodes CNE1 and CNE2 may extend in the second direction DR2. The first and second contact electrodes CNE1 and CNE2 may be spaced apart from, and face, each other in the first direction DR1 and may form linear patterns in the first emission area EMA1.

The contact electrodes (CNE1 and CNE2) may electrically contact the light-emitting elements ED and the electrodes (RME1 and RME2). Each of the light-emitting elements ED may have the semiconductor layers exposed at both ends thereof, and the first and second contact electrodes CNE1 and CNE2 may electrically contact the light-emitting elements ED at both ends of each of the light-emitting elements ED where the semiconductor layers of each of the light-emitting elements ED are exposed. The first end portions of the light-emitting elements ED may be electrically connected to the first electrode RME1 via the first contact electrode CNE1, and the second end portions of the light-emitting elements ED may be electrically connected to the second electrode RME2 via the second contact electrode CNE2.

FIGS. 3 and 4 illustrate that a first contact electrode CNE1 and a second contact electrode CNE2 are disposed in each of the subpixels PXn, but the disclosure is not limited thereto. For example, the numbers of first contact electrodes CNE1 and second contact electrodes CNE2 provided in each of the subpixels PXn may vary depending on the numbers of first electrodes RME1 and second electrodes RME2 provided in each of the subpixels PXn.

The contact electrodes (CNE1 and CNE2) may include a conductive material. For example, the contact electrodes (CNE1 and CNE2) may include ITO, IZO, ITZO, or aluminum (Al). For example, the contact electrodes (CNE1 and CNE2) may include a transparent conductive material, and light emitted from the light-emitting elements ED may travel toward the electrodes (RME1 and RME2) through the contact electrodes (CNE1 and CNE2). However, the disclosure is not limited to this example.

A third insulating layer PAS3 may be disposed between the first and second contact electrodes CNE1 and CNE2. The third insulating layer PAS3 may be disposed not only on the first contact electrode CNE1 but also on the second insulating layer PAS2 in regions other than a region where the second contact electrode CNE2 is disposed. The third insulating layer PAS3 may be disposed on the electrodes (RME1 and RME2) on the entire surfaces of the first and second insulating layers PAS1 and PAS2 except for a region where the second contact electrode CNE2 is disposed. The third insulating layer PAS3 may insulate the first and second contact electrodes CNE1 and CNE2 so that the first and second contact electrodes CNE1 and CNE2 may not directly contact each other. For example, the first and second contact electrodes CNE1 and CNE2 may be disposed on different layers. The first contact electrode CNE1 may be disposed directly on the second insulating layer PAS2, and the second contact electrode CNE2 may be disposed in part directly on the third insulating layer PAS3. The first and second contact electrodes CNE1 and CNE2 may be disposed directly on the first insulating layer PAS1 in regions where both end portions of each of the light-emitting elements ED are exposed because of the absence of the second and third insulating layers PAS2 and PAS3.

The third insulating layer PAS3 may be disposed between the first and second contact electrodes CNE1 and CNE2 and may thus insulate the first and second contact electrodes CNE1 and CNE2 from each other. As already mentioned above, in some embodiments, the third insulating layer PAS3 may not be provided, in which case, the first and second contact electrodes CNE1 and CNE2 may be disposed on the same layer.

Although not specifically illustrated, an insulating layer may be further disposed on the second insulating layer PAS2, the third insulating layer PAS3, and the contact electrodes (CNE1 and CNE2) to overlap the second insulating layer PAS2, the third insulating layer PAS3, and the contact electrodes (CNE1 and CNE2). The insulating layer may be disposed on the entire surface of the first substrate SUB to protect the elements disposed on the first substrate SUB from an external environment.

The first, second, and third insulating layers PAS1, PAS2, and PAS3 may include an inorganic insulating material or an organic insulating material. For example, the first, second, and third insulating layers PAS1, PAS2, and PAS3 may include an inorganic insulating material such as silicon oxide, silicon nitride, silicon oxynitride, aluminum oxide (AlO$_x$), or aluminum nitride (AlN$_x$), but the disclosure is not limited thereto. In another example, the first, second, and third insulating layers PAS1, PAS2, and PAS3 may include an organic insulating material such as an acrylic resin, an epoxy resin, a phenolic resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin, but the disclosure is not limited thereto.

Figure 6:
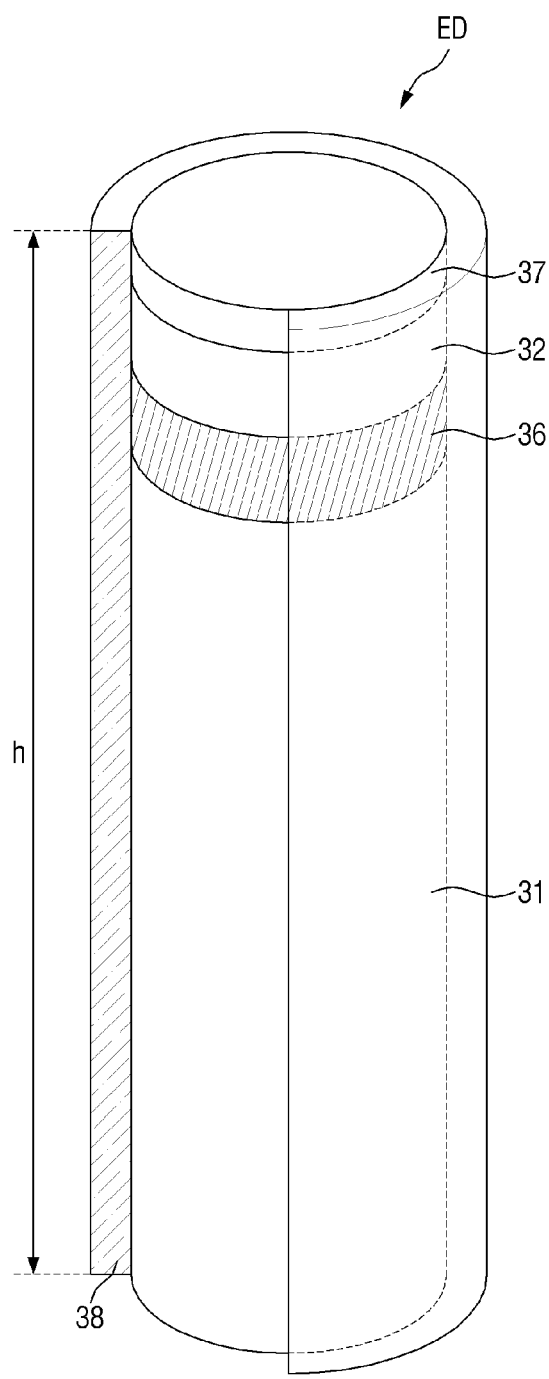
FIG. 6 is a schematic perspective view of a light-emitting element according to an embodiment of the disclosure.

FIG. 6 is a perspective view of a light-emitting element according to an embodiment of the disclosure.

Referring to FIG. 6, a light-emitting element ED may be a light-emitting diode (LED), particularly, an LED having a size in a range of nanometers to micrometers and formed of an inorganic material. If an electric field is formed in a particular direction between two opposite electrodes, the LED may be aligned between the two electrodes where polarities are formed. The light-emitting element ED may be aligned by the electric field formed between the two electrodes.

The light-emitting element ED may have a shape that extends in a direction. The light-emitting element ED may have the shape of a cylinder, a rod, a wire, or a tube, but the shape of the light-emitting element ED is not particularly limited. As another example, the light-emitting element ED may have the shape of a polygonal column such as a regular cube, a rectangular parallelepiped, or a hexagonal column or may have a shape that extends in a direction but with a partially inclined outer surface. Semiconductors included in the light-emitting element ED may be sequentially disposed or stacked in the direction in which the light-emitting element ED extends.

The light-emitting element ED may include semiconductor layers doped with impurities of an arbitrary conductivity type (e.g., a p-type or an n-type). The semiconductor layers may receive electrical signals from an external power source to emit light of a particular wavelength range.

Referring to FIG. 6, the light-emitting element ED may include a first semiconductor layer 31, a second semiconductor layer 32, the light-emitting layer 36, an electrode layer 37, and the insulating film 38.

The first semiconductor layer 31 may include an n-type semiconductor. In a case where the light-emitting element ED emits light of a blue wavelength range, the first semiconductor layer 31 may include a semiconductor material Al$_x$Ga$_y$In$_{1-x-y}$N (where 0≤x≤1, 0≤y≤1, and 0≤x+y≤1). The semiconductor material Al$_x$Ga$_y$In$_{1-x-y}$N may be at least one of AlGaInN, GaN, AlGaN, InGaN, AlN, and InN that are doped with an n-type dopant. The first semiconductor layer 31 may be doped with an n-type dopant, and the n-type dopant may be Si, Ge, or Sn. For example, the first semiconductor layer 31 may be n-GaN doped with an n-type dopant such as Si. The first semiconductor layer 31 may have a length of about 1.5 μm to about 5 μm, but the disclosure is not limited thereto. A first end portion of the light-emitting element ED may be part of the light-emitting element ED where the first semiconductor layer 31 is located relative to the light-emitting layer 36.

The second semiconductor layer 32 may be disposed on the light-emitting layer 36. The second semiconductor layer 32 may include a p-type semiconductor. In a case where the light-emitting element ED emits light of a blue or green wavelength range, the second semiconductor layer 32 may include a semiconductor material Al$_x$Ga$_y$In$_{1-x-y}$N (where 0≤x≤1, 0≤y≤1, and 0≤x+y≤1). For example, the semiconductor material Al$_x$Ga$_y$In$_{1-x-y}$N may be at least one of AlGaInN, GaN, AlGaN, InGaN, AlN, and InN that are doped with a p-type dopant. The second semiconductor layer 32 may be doped with a p-type dopant, and the p-type dopant may be Mg, Zn, Ca, Se, or Ba. For example, the second semiconductor layer 32 may be p-GaN doped with a p-type dopant such as Mg. The second semiconductor layer 32 may have a length of about 0.05 μm to about 0.10 μm, but the disclosure is not limited thereto. A second end portion of the light-emitting element ED may be part of the light-emitting element ED where the second semiconductor layer 32 is located relative to the light-emitting element 36.

FIG. 6 illustrates that the first and second semiconductor layers 31 and 32 are formed as single layers, but the disclosure is not limited thereto. As another example, each of the first and second semiconductor layers 31 and 32 may include more than one layer such as, for example, a clad layer or a tensile strain barrier reducing (TSBR) layer, depending on the material of the light-emitting layer 36.

The light-emitting layer 36 may be disposed between the first and second semiconductor layers 31 and 32. The light-emitting layer 36 may include a single- or multi-quantum well structure material. In a case where the light-emitting layer 36 includes a material having a multi-quantum well structure, the light-emitting layer 36 may have a structure in which multiple quantum layers and multiple well layers are alternately stacked. The light-emitting layer 36 may emit light by combining electron-hole pairs in accordance with electrical signals applied thereto via the first and second semiconductor layers 31 and 32. In a case where the light-emitting layer 36 emits light of a blue wavelength range, the quantum layers may include a material such as AlGaN or AlGaInN. In a case where the light-emitting layer 36 has a multi-quantum well structure in which multiple quantum layers and multiple well layers are alternately stacked, the quantum layers may include a material such as AlGaN or AlGaInN, and the well layers may include a material such as GaN or AlInN. For example, in a case where the light-emitting layer 36 includes AlGaInN as its quantum layer(s) and AlInN as its well layer(s), the light-emitting layer 36 may emit blue light having a central wavelength in a range of about 450 nm to about 495 nm.

However, the disclosure is not limited to this. As another example, the light-emitting layer 36 may have a structure in which a semiconductor material having a large band gap energy and a semiconductor material having a small band gap energy are alternately stacked or may include group-III or group-V semiconductor materials depending on the wavelength of light to be emitted. The type of light emitted by the light-emitting layer 36 is not particularly limited. The light-emitting layer 36 may emit light of a red or green wavelength range if desired, instead of blue light. The light-emitting layer 36 may have a length of about 0.05 μm to about 0.10 μm, but the disclosure is not limited thereto.

Light may be emitted not only from the circumferential surface, in a length direction, of the light-emitting element ED, but also from both sides of the light-emitting element ED. The directionality of the light emitted from the light-emitting layer 36 is not particularly limited.

The electrode layer 37 may be an ohmic contact electrode, but the disclosure is not limited thereto. As another example, the electrode layer 37 may be a Schottky contact electrode. The light-emitting element ED may include at least one electrode layer 37. FIG. 6 illustrates that the light-emitting element ED includes an electrode layer 37, but the disclosure is not limited thereto. As another example, the light-emitting element ED may include more than one electrode layer 37, or the electrode layer 37 may not be provided. However, the following description of the light-emitting element ED may also be directly applicable to a light-emitting element ED having more than one electrode layer 37 or having a different structure from the light-emitting element ED of FIG. 6.

The electrode layer 37 may reduce the resistance between the light-emitting element ED and electrodes (or contact electrodes) in case that the light-emitting element ED is electrically connected to the electrodes (or the contact electrodes). The electrode layer 37 may include a conductive metal. For example, the electrode layer 37 may include at least one of Al, Ti, In, gold (Au), Ag, ITO, IZO, and ITZO. Also, the electrode layer 37 may include a semiconductor material doped with an n- or p-type dopant. However, the disclosure is not limited to this.

The insulating film 38 may be disposed to surround the first and second semiconductor layers 31 and 32 and the electrode layer 37. For example, the insulating film 38 may be disposed to surround at least the light-emitting layer 36 and may extend in the direction in which the light-emitting element ED extends. The insulating film 38 may protect the first semiconductor layer 31, the light-emitting layer 36, the second semiconductor layer 32, and the electrode layer 37. For example, the insulating film 38 may be formed to surround the sides of the first semiconductor layer 31, the light-emitting layer 36, the second semiconductor layer 32, and the electrode layer 37, but to expose both end portions, in the length direction, of the light-emitting element ED.

FIG. 6 illustrates that the insulating film 38 is formed to extend in the length direction of the light-emitting element ED and to cover or overlap the sides of the first semiconductor layer 31, the light-emitting layer 36, the second semiconductor layer 32, and the electrode layer 37, but the disclosure is not limited thereto. The insulating film 38 may cover the sides of only the light-emitting layer 36 and some of the first and second semiconductor layers 31 and 32 or may cover only part of the side of the electrode layer 37 so that the side of the electrode layer 37 may be partially exposed. The insulating film 38 may be formed to be rounded in a cross-sectional view in a region adjacent to at least one end of the light-emitting element ED.

The thickness of the insulating film 38 may be about 10 nm to about 1.0 μm, but the disclosure is not limited thereto. Preferably, the thickness of the insulating film 38 may be about 40 nm.

The insulating film 38 may include a material with insulating properties such as, for example, silicon oxide, silicon nitride, silicon oxynitride, aluminum nitride, or aluminum oxide. FIG. 6 illustrates that the insulating film 38 is formed as a single layer, but the disclosure is not limited thereto. As another example, the insulating film 38 may be formed as a multilayer including a stack of multiple layers. Accordingly, the insulating film 38 may prevent any short circuit that may occur in case that the light-emitting layer 36 is placed in direct contact with electrodes that transmit electrical signals directly to the light-emitting element ED. Also, since the insulating film 38 includes the light-emitting layer 36 to protect the outer surface of the light-emitting element ED, any degradation in the emission efficiency of the light-emitting element ED may be prevented.

The outer surface of the insulating film 38 may be subjected to surface treatment. The light-emitting element ED may be sprayed on electrodes while being scattered in predetermined ink. Here, the surface of the insulating film 38 may be hydrophobically or hydrophilically treated to keep the light-emitting element ED scattered in ink without agglomerating with other neighboring light-emitting elements ED. For example, the insulating film 38 may be surface-treated with a material such as stearic acid or 2,3-naphthalene dicarboxylic acid.

A height h of the light-emitting element ED may be about 1 μm to about 10 μm, about 2 μm to about 6 μm, or about 3 μm to about 5 μm, but the disclosure is not limited thereto. The diameter of the light-emitting element ED may be about 30 nm to about 700 nm, and the aspect ratio of the light-emitting element ED may be about 1.2 to about 100, but the disclosure is not limited thereto. As another example, different light-emitting elements ED may have different diameters depending on the compositions of their respective light-emitting layers 36. Preferably, the diameter of the light-emitting element ED may be about 500 nm.

As already mentioned above, since the electrodes (RME1 and RME2) have different widths, the electrodes (RME1 and RME2) may properly induce light-emitting elements 30 to be arranged and aligned at a particular location. The behavior of light-emitting elements ED in ink will hereinafter be described.

Figure 7:
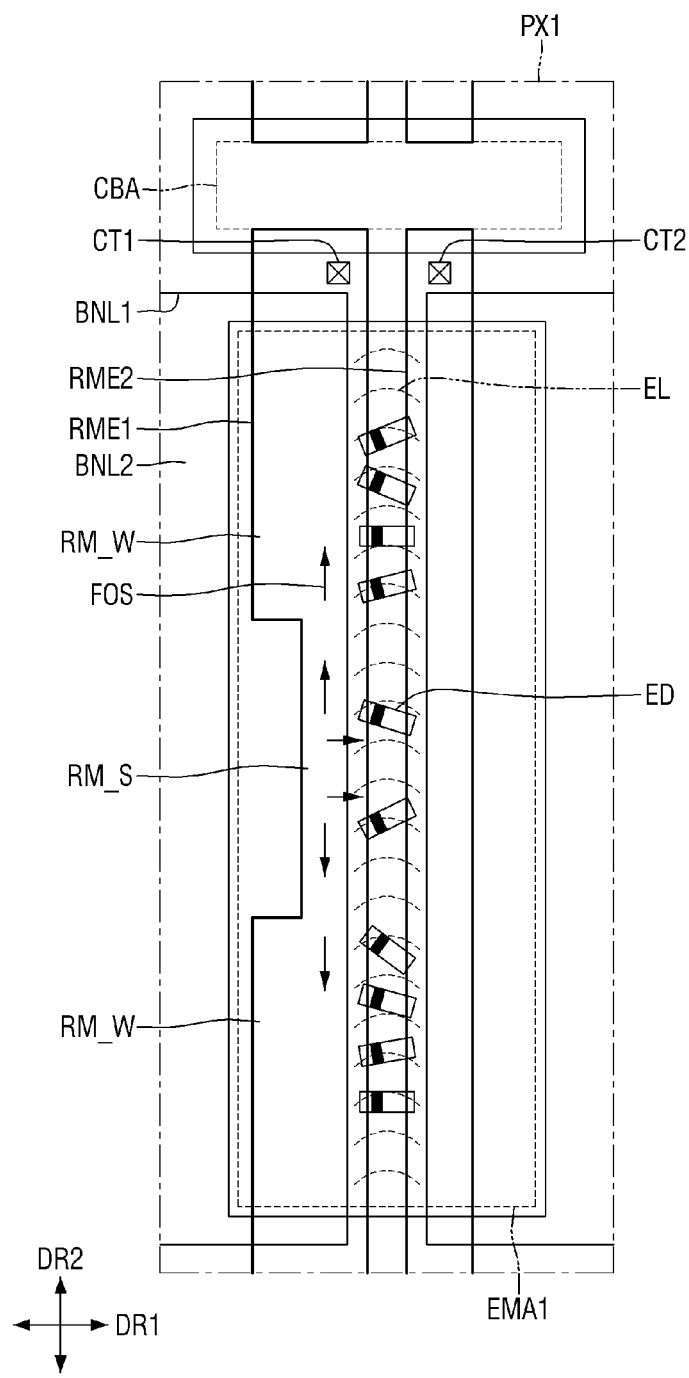
FIG. 7 is a schematic plan view illustrating the movement of light-emitting elements movements during the fabrication of the display device of FIG. 1.

FIG. 7 is a schematic plan view illustrating the movement of light-emitting elements during the fabrication of the display device of FIG. 1. FIG. 7 illustrates the behavior of light-emitting elements ED on different parts of the electrodes (RME1 and RME2) in the first emission area EMA1.

Referring to FIG. 7, ink including the light-emitting elements ED is sprayed onto the electrodes (RME1 and RME2), and the light-emitting elements ED may be arranged by forming an electric field EL on the electrodes (RME1 and RME2). In response to alignment signals being applied to the first and second electrodes RME1 and RME2, which are spaced apart from each other, the electric field EL may be formed on the electrodes (RME1 and RME2) to face a particular direction. The light-emitting elements ED, each having semiconductor layers doped with dopants of different conductivity types, may have dipoles in molecules and may be arranged on the electrodes (RME1 and RME2) by receiving a dielectrophoretic force from the electric field EL within the ink.

Electrical signals applied to the electrodes (RME1 and RME2) may have different signs and may generate induced electric charges in the solvent molecules of the ink, directly above the electrodes (RME1 and RME2). The solvent molecules may have electric charges, similarly to the light-emitting elements ED, and receive an electric force from the electric field EL. Accordingly, the electric field EL not only may change the location and the alignment direction of the light-emitting elements ED with dipoles, but also may cause the flow of droplets of the ink such that the solvent molecules of the ink may be oriented in outward directions from the electrodes (RME1 and RME2).

Here, in a case where the first and second electrodes RME1 and RME2 have different widths, the flow of the solvent molecules of the ink may be oriented in a particular direction. For example, a wider electrode, i.e., the first electrode RME1, may cause a greater intensity of solvent molecules oriented in an outward direction, and the flow of solvent molecules toward the first electrode RME1 may generally be formed on the first and second electrodes RME1 and RME2. As a result, the light-emitting elements ED scattered in the ink may be arranged on the electrodes (RME1 and RME2) by the electric field EL, and at the same time, may be induced to move to the first electrode RME1, which has a relatively large width, due to the flow of the solvent molecules.

As ink having the light-emitting elements ED is sprayed into the first emission area EMA1 surrounded by the second bank BNL2, and the electric field EL is generated on the electrodes (RME1 and RME2), the light-emitting elements ED may be arranged on the first and second electrodes RME1 and RME2. Here, the ink may flow from the second part RM_S of the first electrode RME1 toward the first parts RM_W of the first electrode RME1, which have a greater width than the second part RM_S, and as a result, the light-emitting elements ED may be guided to be oriented toward the first parts RM_S.

Since the light-emitting elements ED may be arranged by generating the flow of ink, the light-emitting elements ED may be further densely arranged at a particular location, as compared to the case of arranging the light-emitting elements ED only using the electric field EL. Also, the agglomeration of the light-emitting elements ED may be alleviated by the flow of ink, and the number of light-emitting elements ED that fail to be arranged on the electrodes (RME1 and RME2) and are lost may be reduced. Particularly, multiple first light-emitting element groups ED #1 may be formed depending on the locations of the first parts RM_W of the first electrode RME1, and the luminance per unit area of each of the subpixels PXn may be improved by improving electrical connections between the multiple first light-emitting element groups ED #1, in each of the subpixels PXn.

Display devices according to other embodiments of the disclosure will hereinafter be described.

Figure 8:
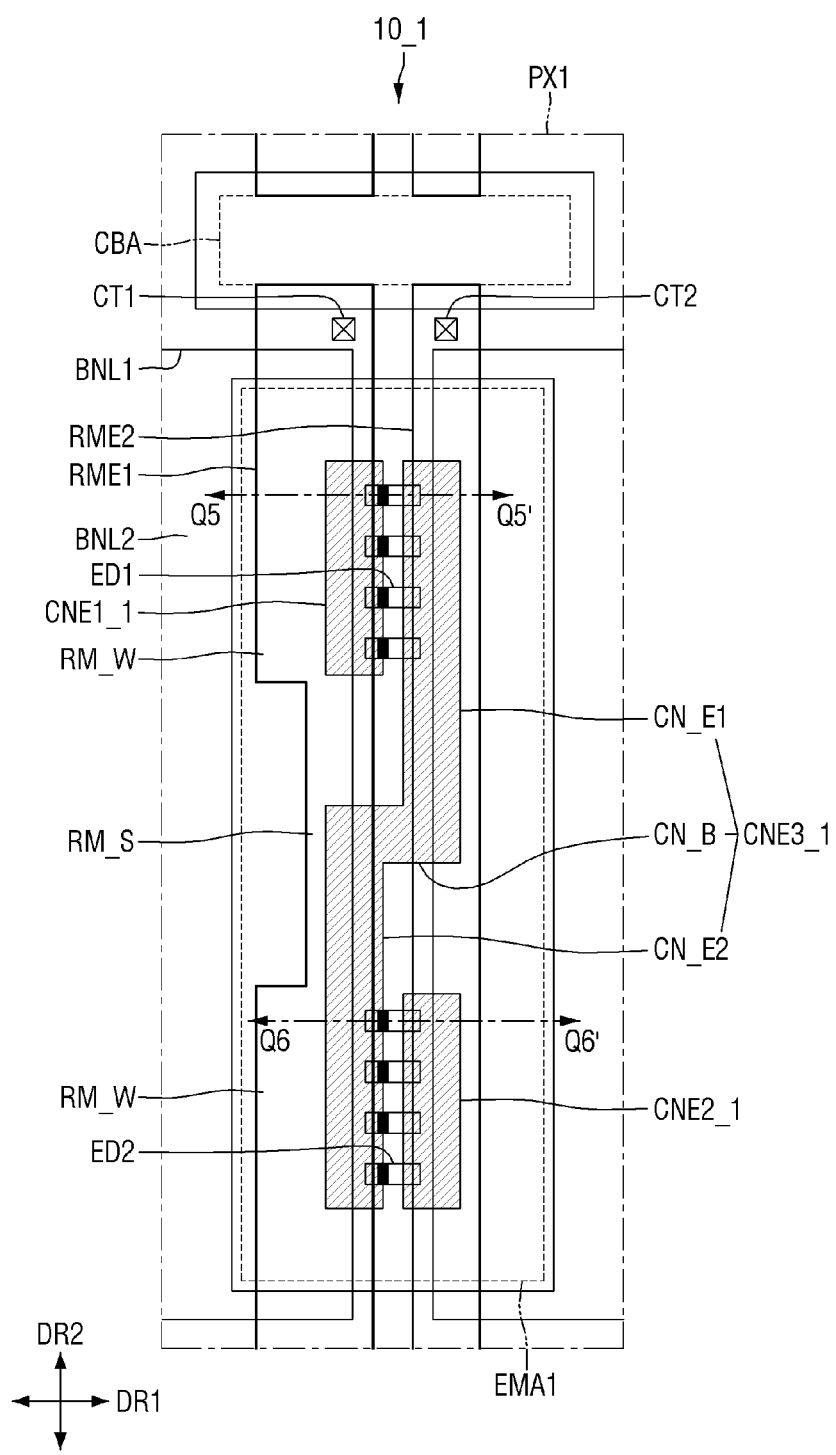
FIG. 8 is a schematic plan view of a subpixel of a display device according to another embodiment of the disclosure.
Figure 9:
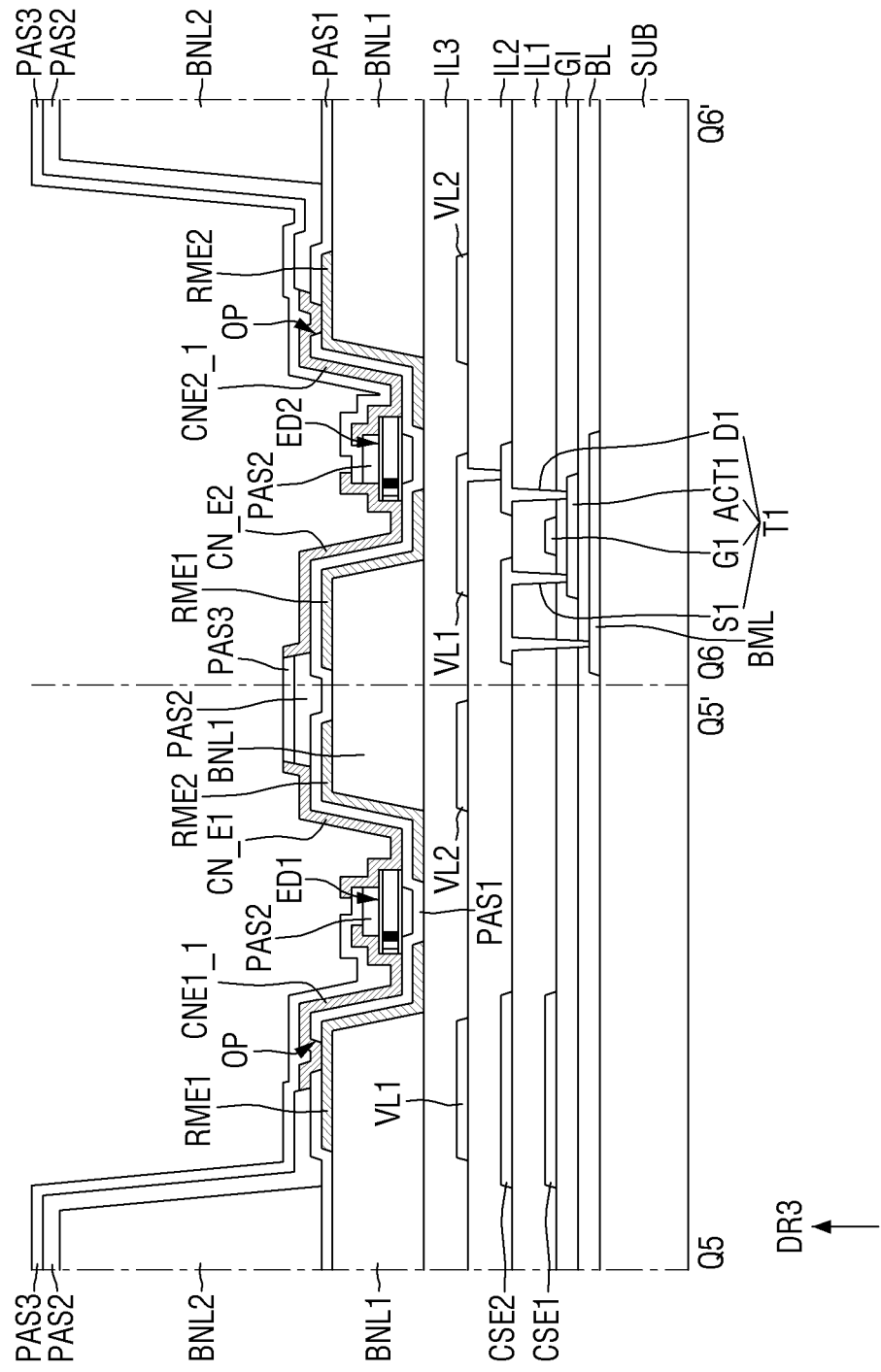
FIG. 9 is a schematic cross-sectional view taken along line Q5-Q5' and Q6-Q6' of FIG. 8.

FIG. 8 is a schematic plan view of a subpixel of a display device according to another embodiment of the disclosure. FIG. 9 is a schematic cross-sectional view taken along line Q5-Q5' and Q6-Q6' of FIG. 8. FIG. 9 illustrates a cross-sectional view taken from one end to the other end of one of first light-emitting elements ED1 of FIG. 8 and from one end to the other end of one of second light-emitting elements ED2 of FIG. 8.

Referring to FIGS. 8 and 9, a display device 10_1 includes a relatively large number of contact electrodes and may thus improve electrical connections between light-emitting element groups disposed in separate regions. For example, the display device 10_1 may include first and second contact electrodes CNE1_1 and CNE2_1 and may further include a third contact electrode CNE3_1, which is different from the first and second contact electrodes CNE1_1 and CNE2_1. The first and second contact electrodes CNE1_1 and CNE2_1 may be disposed on first and second electrodes RME1 and RME2, respectively, and may electrically contact light-emitting elements (ED1 and ED2). The third contact electrode CNE3_1 may be disposed on both the first and second electrodes RME1 and RME2 and may electrically connect, in series, light-emitting element groups ED #1 located in different regions. The display device 10_1 differs from the display device 10 of FIG. 3 at least in that the third contact electrode CNE3_1 is further provided to connect some of the light-emitting elements (ED1 and ED2) in series. Descriptions of elements or features that have already been described above will be omitted, and the light-emitting elements and contact electrodes (CNE1_1, CNE2_1, and CNE3_1) will hereinafter be described.

As described above, the light-emitting elements (ED1 and ED2) may include first light-emitting element groups ED #1, which have a high light-emitting element density. If the number of light-emitting elements (ED1 and ED2) included in a second light-emitting element group ED #2 is minimized (or reduced) by controlling the shape of a second part RM_S of the first electrode RME1 or the intensity of alignment signals, multiple first light-emitting element groups ED #1 may be arranged at locations that are apart from each other. For example, a first subpixel PX1 may include first light-emitting elements ED1 and second light-emitting elements ED2, and the first light-emitting elements ED1 and the second light-emitting elements ED2 may be included in the first light-emitting element groups ED #1. In a case where the first electrode RME1 includes two first parts RM_W, the first light-emitting elements ED1 and the second light-emitting elements ED2, as the first light-emitting element groups ED #1, may be disposed at locations that are spaced apart from one another. The first light-emitting elements ED1 may be disposed on one side, in a second direction DR2, of a first emission area EMA1 of the first subpixel PX1, and the second light-emitting elements ED2 may be disposed on the other side, in the second direction DR2, of the first emission area EMA1. In a case where the second light-emitting element group ED #2 is not provided on the second part RM_S, a connecting part CN_B of the third contact electrode CNE3_1, which connects the first light-emitting elements ED1 and the second light-emitting elements ED2, may be disposed on the second part RM_S.

First end portions of the first light-emitting elements ED1 and first end portions of the second light-emitting elements ED2 may be disposed on the first parts RM_W of the first electrode RME1, and second end portions of the first light-emitting elements ED1 and second end portions of the second light-emitting elements ED2 may be disposed on the second electrode RME2. The first end portions of the first light-emitting elements ED1 may be electrically connected to the first electrode RME1 via the first contact electrode CNE1_1, which is disposed on the first electrode RME1. The second end portions of the second light-emitting elements ED2 may be electrically connected to the second electrode RME2 via the second contact electrode CNE2_1, which is disposed on the second electrode RME2. The second end portions of the first light-emitting elements ED1 and the first end portions of the second light-emitting elements ED2 may contact the third contact electrode CNE3_1. The third contact electrode CNE3_1 may include a first extension part CN_E1, which is disposed on the second electrode RME2 and contacts the second end portions of the first light-emitting elements ED1, a second extension part CN_E2, which is disposed on the first electrode RME1 and contacts the first end portions of the second light-emitting elements ED2, and the connecting part CN_B, which connects the first and second extension parts CN_E1 and CN_E2. The first and second extension parts CN_E1 and CN_E2, similar to the first and second contact electrodes CNE1_1 and CNE2_1, may extend in the second direction DR2 to be spaced apart from each other. The connecting part CN_B may extend in a first direction DR1, on the second part RM_S of the first electrode RME1, where the light-emitting elements (ED1 and ED2) are not disposed, to connect the first and second extension parts CN_E1 and CN_E2, which are arranged in a staggered manner. Since almost none of the light-emitting elements (ED1 and ED2) are disposed on the second part RM_S, a space in which the connecting part CN_B of the third contact electrode CNE3_1 is to be arranged may be secured.

The second end portions of the first light-emitting elements ED1 may be connected to the first end portions of the second light-emitting elements ED2 via the third contact electrode CNE3_1. As the third contact electrode CNE3_1, unlike the first and second contact electrodes CNE1_1 and CNE2_1, does not directly contact the first and second electrodes RME1 and RME2, electrical signals applied to electrodes (RME1 and RME2) may not be transmitted to the third contact electrode CNE3_1. Electrical signals applied to the first electrode RME1 may flow to the second electrode RME2 via the first light-emitting elements ED1, the third contact electrode CNE3_1, and the second light-emitting elements ED2, and the first light-emitting elements ED1 and the second light-emitting elements ED2 may be connected in series. Since multiple first light-emitting element groups ED #1, which are disposed in separate regions, may be connected in series depending on the shape of the first electrode RME1, the luminance per unit area of the display device 10_1 may be improved.

Figure 10:
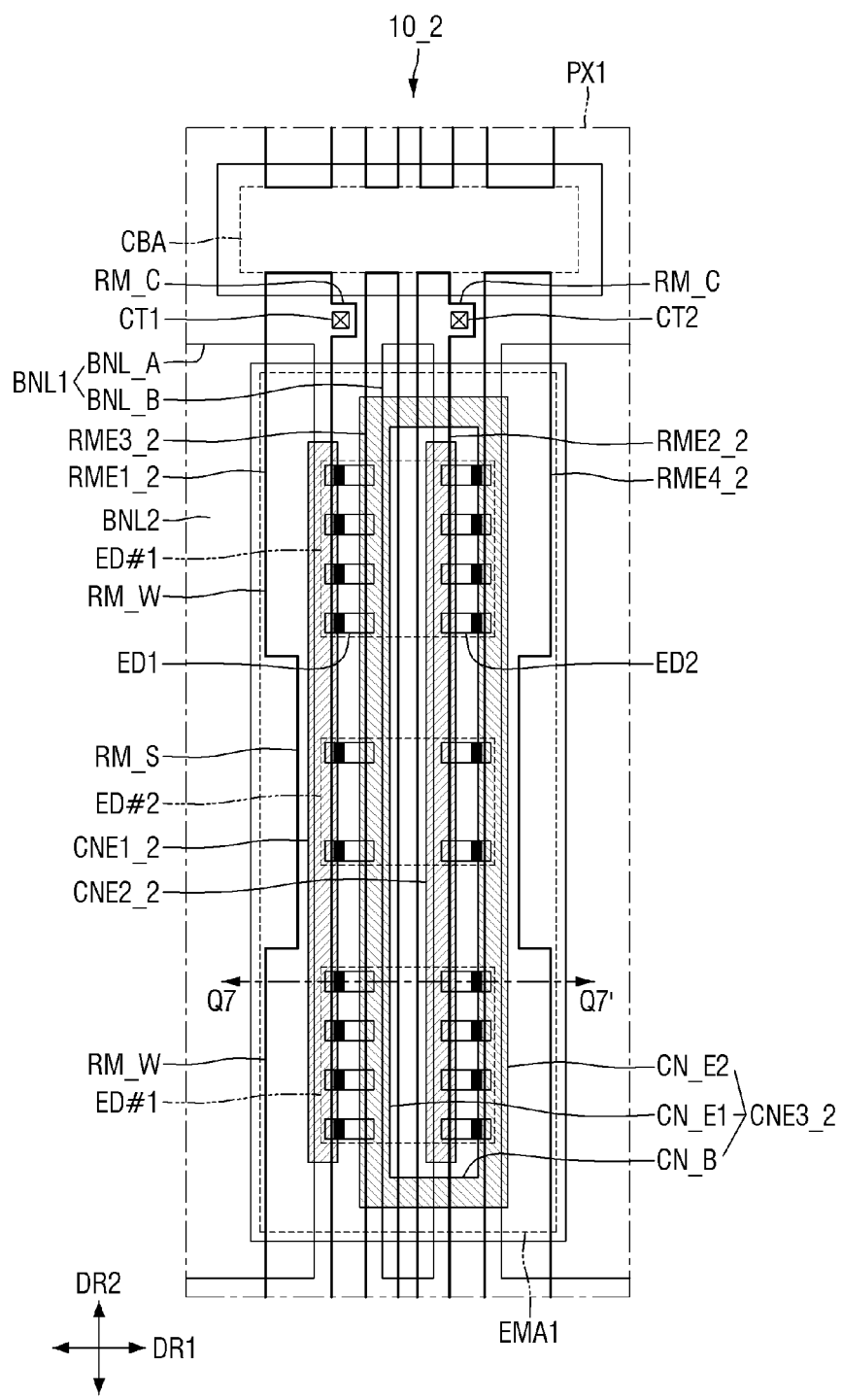
FIG. 10 is a schematic plan view of a subpixel of a display device according to another embodiment of the disclosure.
Figure 11:
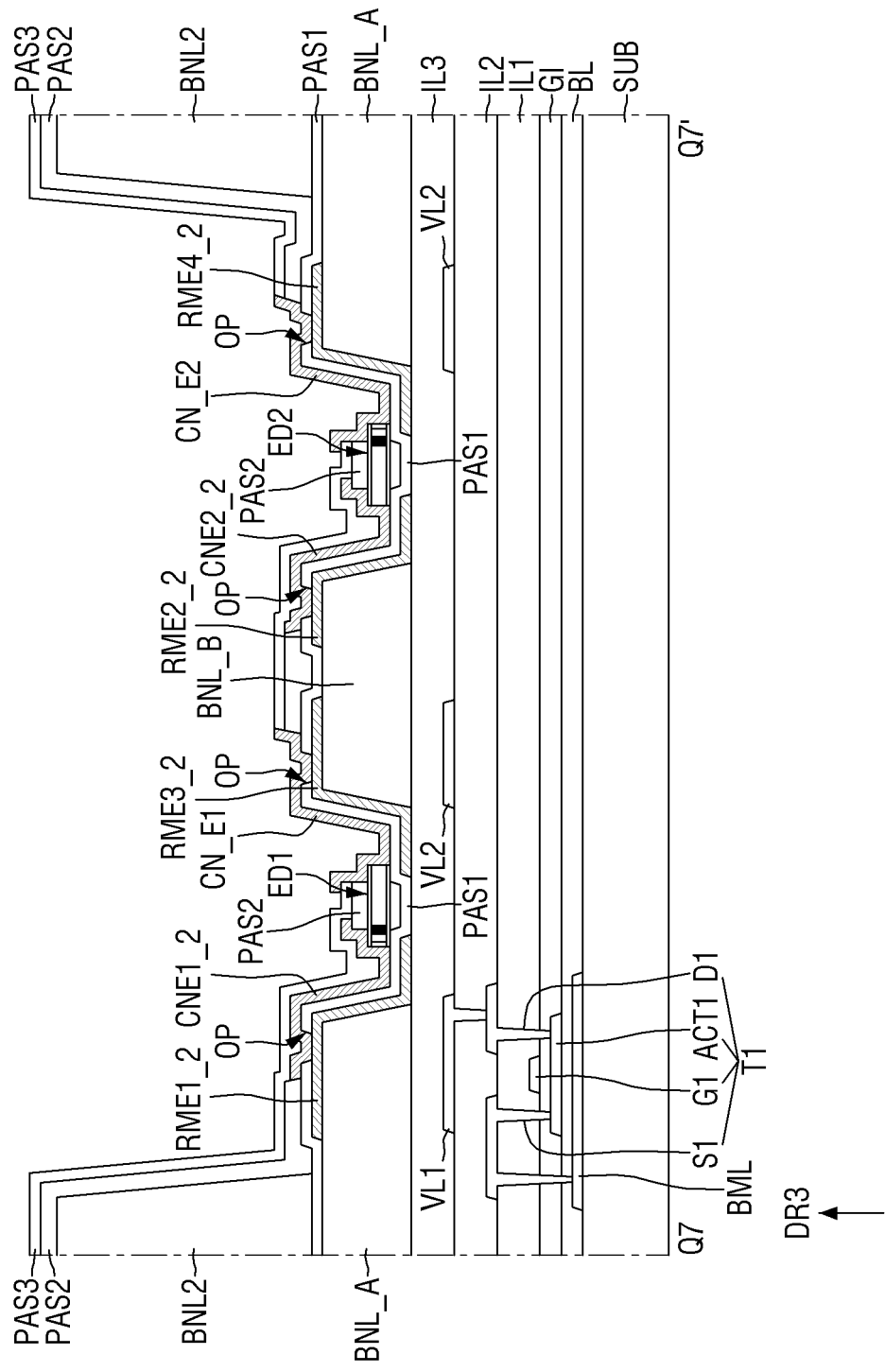
FIG. 11 is a schematic cross-sectional view taken along line Q7-Q7' of FIG. 10.

FIG. 10 is a schematic plan view of a subpixel of a display device according to another embodiment of the disclosure. FIG. 11 is a schematic cross-sectional view taken along line Q7-Q7' of FIG. 10. FIG. 11 illustrates a cross-sectional view taken from one end to the other end of one of first light-emitting elements ED1 of FIG. 10 and from one end to the other end of one of second light-emitting elements ED2 of FIG. 10.

Referring to FIGS. 10 and 11, a display device 10_2 may include a relatively large number of electrodes (RME1_2, RME2_2, RME3_2, and RME4_2), and a relatively large number of light-emitting elements (ED1 and ED2) may be disposed between the electrodes (RME1_2, RME2_2, RME3_2, and RME4_2) of the display device 10_2. The light-emitting elements (ED1 and ED2) may include first light-emitting elements ED1 and second light-emitting elements ED2, which are disposed on different electrodes from the first light-emitting elements ED1, and the first light-emitting elements ED1 and the second light-emitting elements ED2 may be connected in series via a third contact electrode CNE3_2. The display device 10_2 differs from the display device 10 or 10_1 in that a relatively large number of electrodes (RME1_2, RME2_2, RME3_2, and RME4_2) may be provided in a first subpixel PX1 of the display device 10_2.

First banks BNL1 may include first sub-banks BNL_A, which are each disposed across a pair of subpixels PXn, and a second sub-bank BNL_B, which are disposed between the first sub-bank BNL_A. The second sub-bank BNL_B, which extends in a second direction DR2, may be disposed in the middle of a first emission area EMA1 of the first subpixel PX1, and the first sub-banks BNL_A may be disposed on both sides, in a first direction DR1, of the second sub-bank BNL_B. The first banks BNL1 differ from the first banks BNL1 of FIG. 3 in that they include the first sub-banks BNL_A, which are arranged in the same pattern as the first banks BNL1 of FIG. 3 and further include the second sub-bank BNL_B, which is disposed between the first sub-banks BNL_A.

First and fourth electrodes RME1_2 and RME4_2 may be disposed on different first sub-banks BNL_A to extend in the second direction DR2. The first electrode RME1_2 may be disposed on a left first sub-bank BNL_A on the left side of the center of the first emission area EMA1, and the fourth electrode RME4_2 may be disposed on a right first sub-bank BNL_A on the right side of the center of the first emission area EMA1. The first electrode RME1_2 may be substantially identical to the first electrode RME1 of FIG. 3 except that it further includes an electrode contact RM_C that overlaps a first contact hole CT1. The fourth electrode RME4_2 may be symmetrical with the entire first electrode RME1_2, except for the electrode contact RM_C, with respect to the center of the first emission area EMA1, and the first and fourth electrodes RME1_2 and RME4_2 may be spaced apart from each other in the first direction DR1.

Second and third electrodes RME2_2 and RME3_2 may have a similar shape to the electrodes (RME1 and RME2) of FIG. 3 and may be disposed between the first and fourth electrodes RME1_2 and RME4_2. The second and third electrodes RME2_2 and RME3_2 may be disposed on both sides, in the first direction Dr1, of the second sub-bank BNL_B to be spaced apart from each other. The second electrode RME2_2 may be spaced apart from the fourth electrode RME4_2 in the first direction DR1 and may be disposed on the right side of the second sub-bank BNL_B, and the third electrode RME3_2 may be spaced apart from the first electrode RME1_2 in the first direction DR1 and may be disposed on the left side of the second sub-bank BNL_B. The second electrode RME2_2 may include an electrode contact RM_C that overlaps a second contact hole CT2. On the contrary, the third electrode RME3_2 may not be directly and electrically connected to a fourth conductive layer. The third electrode RME3_2, like the fourth electrode RME4_2, may receive electrical signals via the third contact electrode CNE3_2.

As each of the first and fourth electrodes RME1_2 and RME4_2 includes first parts RM_W and a second part RM_S, the light-emitting elements (ED1 and ED2) may be classified into first light-emitting element groups ED #1 and a second light-emitting element group ED #2. The light-emitting elements (ED1 and ED2) may include first light-emitting elements ED1, which are disposed on the first and third electrodes RME1_2 and RME3_2, and second light-emitting elements ED2, which are disposed on the second and fourth electrodes RME2_2 and RME4_2. The first light-emitting elements ED1 and the second light-emitting elements ED2 may be divided between different light-emitting element groups (ED #1 and ED #2), i.e., the first light-emitting element groups ED #1, which are disposed on the first parts RM_W, and the second light-emitting element group ED #2, which is disposed on the second part RM_S.

The light-emitting elements (ED1 and ED2) may have a particular alignment direction, which is the direction faced by the first end portions of the light-emitting elements (ED1 and ED2), where first semiconductor layers 31 are disposed. In the display device 10_2, the direction faced by the first end portions of the first light-emitting elements ED1 and the direction faced by the first end portions of the second light-emitting elements ED2 may be opposite to each other. For example, the first end portions of the first light-emitting elements ED1 may be disposed on the third electrode RME3_2, and the second end portions of the first light-emitting elements ED1 may be disposed on the first electrode RME1_2. Thus, the first light-emitting elements ED1 may be arranged such that the first end portions thereof may face one side, in the first direction DR1, of the first subpixel PX1. On the contrary, the first end portions of the second light-emitting elements ED2 may be disposed on the second electrode RME2_2, and the second end portions of the second light-emitting elements ED2 may be disposed on the fourth electrode RME4_2. Thus, the second light-emitting elements ED2 may be arranged such that the first end portions thereof may face the other side, in the first direction DR1, of the first subpixel PX1.

A first contact electrode CNE1_2 may be disposed on the first electrode RME1_2 to contact the second end portions of the first light-emitting elements ED1. A second contact electrode CNE2_2 may be disposed on the second electrode RME2_2 to contact the first end portions of the second light-emitting elements ED2. The first and second contact electrodes CNE1_2 and CNE2_2 may receive power supply voltages for driving the light-emitting elements (ED1 and ED2), via a first transistor T1 and a second voltage line VL2, respectively.

A third contact electrode CNE3_2 may be disposed on the third and fourth electrodes RME3_2 and RME4_2. The third contact electrode CNE3_2 may include first and second extension parts CN_E1 and CN_E2, which are disposed on the third or fourth electrode RME3_2 or RME4_2, and connecting parts CN_B, which connect the first and second extension parts CN_E1 and CN_E2. The first and second extension parts CN_E1 and CN_E2 of the third contact electrode CNE3_2 may be disposed on the third and fourth electrodes RME3_2 and RME4_2, respectively, and the connecting parts CN_B may extend in the first direction DR1 to connect the first and second extension parts CN_E1 and CN_E2. The third contact electrode CNE3_2 may be disposed to surround the second contact electrode CNE2_2 in a plan view. The first and second extension parts CN_E1 and CN_E2 may contact the third or fourth electrode RME3_2 or RME4_2 and the first end portions of the light-emitting elements (ED1 and ED2).

The first light-emitting elements ED1 and the second light-emitting elements ED2 may be connected in series via the third contact electrode CNE3_2, and as the third contact electrode CNE3_2 contacts the third and fourth electrodes RME3_2 and RME4_2, the third and fourth electrodes RME3_2 and RME4_2 may be electrically and/or directly connected to the underlying circuit layer, instead of remaining floated.

Figure 12:
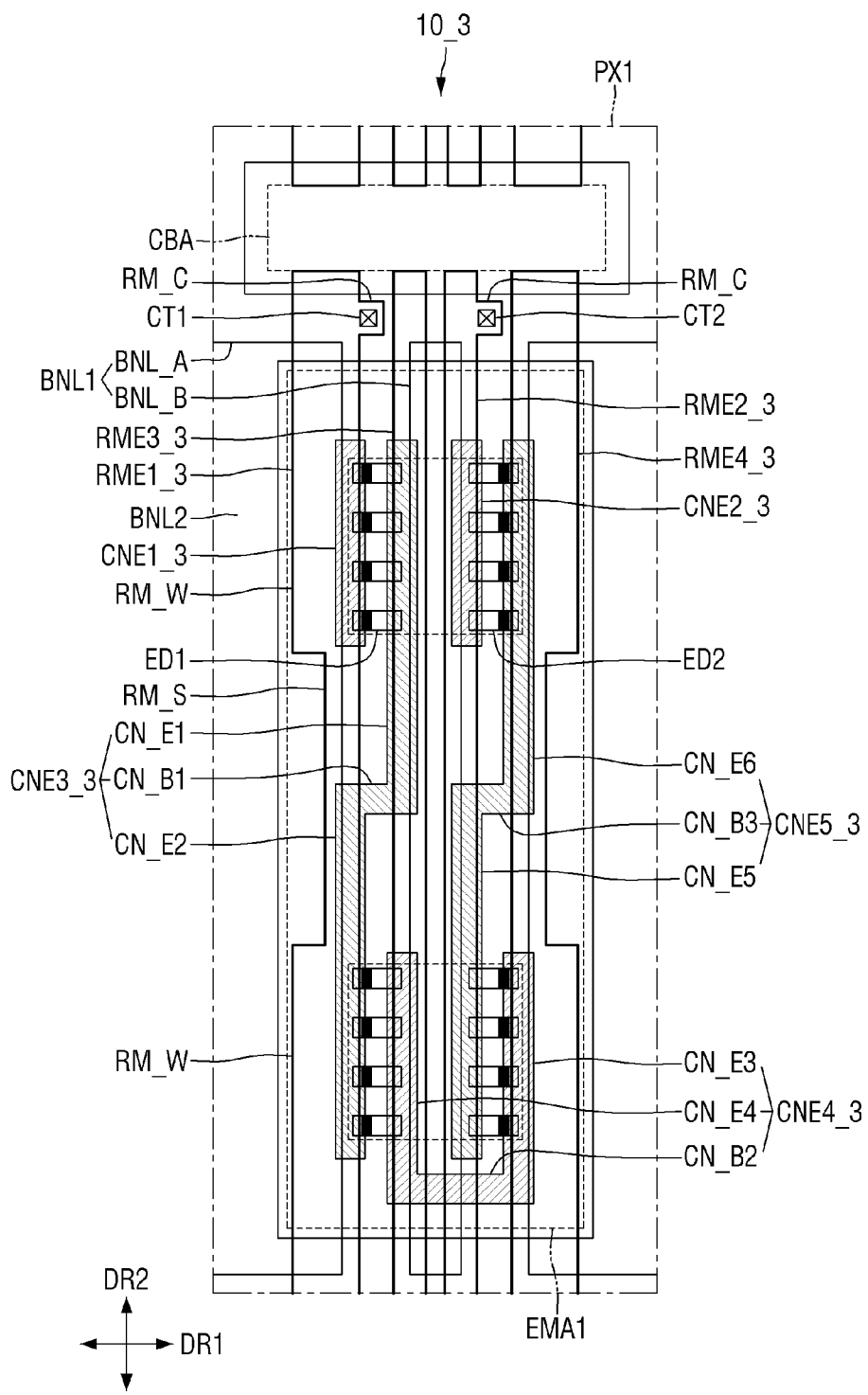
FIG. 12 is a schematic plan view of a first subpixel of a display device according to another embodiment of the disclosure.

FIG. 12 is a schematic plan view of a first subpixel of a display device according to another embodiment of the disclosure.

Referring to a first subpixel PX1 of a display device 10_3 of FIG. 12, first light-emitting elements ED1 and second light-emitting elements ED2 may be divided between multiple first light-emitting element groups ED #1, and the first light-emitting element groups ED #1 may be connected in series via a relatively large number of contact electrodes. The display device 10_3 differs from the display device 10_2 of FIG. 11 at least in the shape of contact electrodes. Some of the contact electrodes of the display device 10_3, similar to the third contact electrode CNE3_1 of FIG. 8, may be disposed across a second part RM_S of a first electrode RME1_3.

Specifically, a first contact electrode CNE1_3 may contact second end portions of first light-emitting elements ED1 disposed on the upper side of a first emission area EMA of the first subpixel PX1. A second contact electrode CNE2_3 may contact first end portions of second light-emitting elements ED2 disposed on the upper side of the first emission area EMA1.

A third contact electrode CNE3_3 may include first and second extension parts CN_E1 CN_E2 and a first connecting part CN_B1 and may contact the first light-emitting elements ED1. The first extension part CN_E1 may contact the second end portions of the first light-emitting elements ED1 disposed on the upper side of the emission area, and the second extension part CN_E2 may contact first end portions of first light-emitting elements ED1 disposed on the lower side of the first emission area EMA1. The first connecting part CN_B1 may be disposed on a second part RM_S of a first electrode RME1_3 and on a third electrode RME3_3.

Similarly, a fifth contact electrode CNE5_3 may include fifth and sixth extension parts CN_E5 and CN_E6 and a third connecting part CN_B3 and may contact the second light-emitting elements ED2. The fifth extension pat CN_E5 may contact first end portions of second light-emitting elements ED2 disposed on the lower side of the first emission area EMA1, and the sixth extension part CN_E6 may contact second end portions of the second light-emitting elements ED2 disposed on the upper side of the first emission area EMA1. The third connecting part CN_B3 may be disposed on a second part RM_S of a fourth electrode RME4_3 and on a second electrode RME2_3.

A fourth contact electrode CNE4_3 may include third and fourth extension parts CN_E3 and CN_E4 and a second connecting part CN_B2 and may contact the first light-emitting elements ED1 and the second light-emitting elements ED2. The third extension CN_E3 may contact first end portions of the second light-emitting elements ED2 disposed on the lower side of the first emission area EMA1, and the fourth extension part CN_E4 may contact second end portions of the first light-emitting elements ED1 disposed on the lower side of the first emission area EMA1. The second connecting part CN_B2 may be disposed between a second bank BNL2 and light-emitting elements (ED1 and ED2) disposed on the lower side of the first emission area EMA1, and the fourth contact electrode CNE4_2 may be disposed to surround the fifth extension part CN_E5.

In the embodiment of FIG. 12, the first light-emitting elements ED1 and the second light-emitting elements ED2 may be connected in series, and multiple first light-emitting element groups ED #1, between which the first light-emitting elements ED1 and the second light-emitting elements ED2 are divided, may also be connected in series.

According to the above-described embodiments, the first electrode RME1 includes two first parts RM_W and one second part RM_S disposed between the two first parts RM_W, and the light-emitting elements ED may be densely arranged as two groups disposed on the upper and lower sides of the center of the first subpixel PX1. However, the shape of the electrodes of the display device 10 is not particularly limited. For example, one of the electrodes may be configured to include a relatively large number of parts that face the other electrode with different widths and may thus be able to arrange the light-emitting elements ED at a particular location. Various embodiments of the electrodes of the display device 10 will hereinafter be described.

Figure 13:
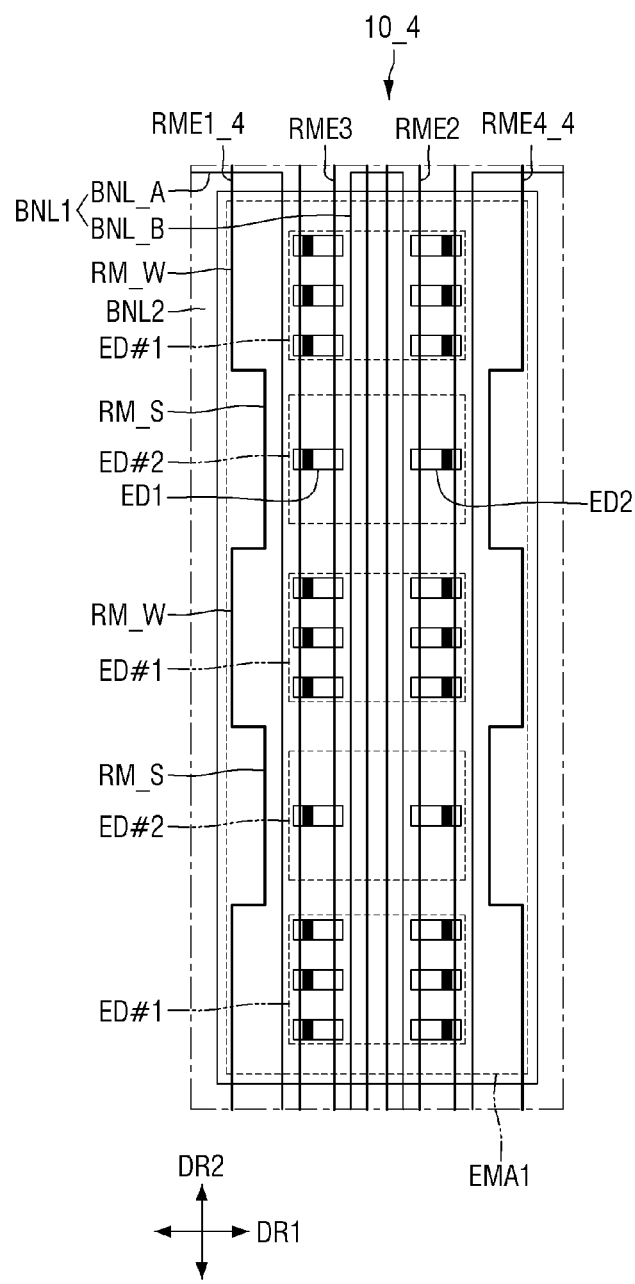
FIGS. 13 and 14 are schematic plan views illustrating the shapes and the arrangements of electrodes and light-emitting elements of each of display devices according to other embodiments of the disclosure.
Figure 14:
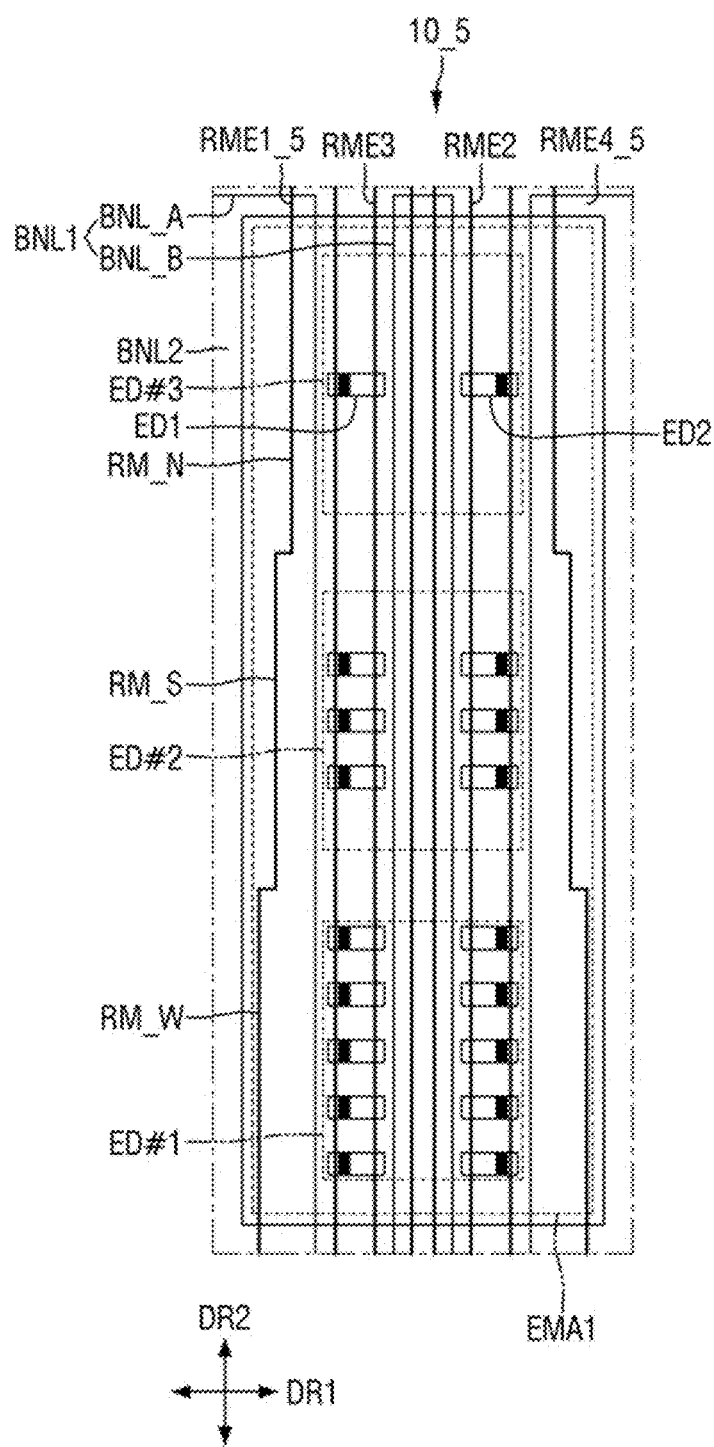

FIGS. 13 and 14 are schematic plan views illustrating the shapes and the arrangements of electrodes and light-emitting elements of each of display devices according to other embodiments of the disclosure. For convenience, FIGS. 13 and 14 illustrate light-emitting elements (ED1 and ED2), electrodes (RME1, RME2, RME3, and RME4), and parts of banks (BNL1 and BNL2) in a first emission area EMA1 of a first subpixel PX1 of each of display devices 10_4 and 10_5, but do not illustrate contact electrodes and first areas CBA. This also applies to FIGS. 15 through 27, and the shapes of various embodiments of the electrodes of the display device 10 will hereinafter be described with reference to FIGS. 13 through 27. In the embodiments of FIGS. 13 through 27, as in the embodiments of FIGS. 10 and 12, an entire fourth electrode RME4 except for an electrode contact RM_C may be symmetrical with a first electrode RME1, and second and third electrodes RME2 and RME3 may extend in a direction. First parts RM_W and one or more second parts RM_S of the first electrode RME1 will hereinafter be described in detail, and descriptions of the second, third, and fourth electrodes RME2, RME3, and RME4 will be omitted.

Referring to FIGS. 13 and 14, the display devices 10_4 and 10_5 may include first electrodes RME1_4 and RME1_5, respectively, and each of the first electrodes RME1_4 and RME1_5 may include a relatively large number of parts having different widths.

Referring to FIG. 13, the first electrode RME1_4 may include a relatively large number of first parts RM_W and may include second parts RM_S, which are disposed between the first parts RM_W. For example, the first electrode RME1_4 may include three first parts RM_W and two second parts RM_S, and the first parts RM_W and the second parts RM_S may be alternately arranged in a second direction DR2. The display device 10_4 may include a relatively large number of first light-emitting element groups ED #1 and a relatively large number of second light-emitting element groups ED #2. As the first electrode RME1_4 includes relatively large numbers of first parts RM_W and second parts RM_S, the first subpixel PX1 may include a relatively large number of light-emitting element groups (ED #1 and ED #2). The distribution of light-emitting elements (ED1 and ED2) is more uniform in the first emission area EMA1 in the embodiment of FIG. 14 than in the embodiment of FIG. 10. In a case where the second light-emitting element groups ED #2 are not provided and the second parts RM_S of the first electrode RME1_4 are used as contact electrode paths for connecting the light-emitting elements (ED1 and ED2) in series, the luminance of each subpixel PXn may be further improved.

Referring to the first subpixel PX1 of the display device 10_5 of FIG. 14, the first electrode RME1_5 may include first and second parts RM_W and RM_S and may further include a third part RM_N, which has a smaller width than the second part RM_S. The width of the first electrode RME1_5 may decrease in a second direction DR2 and may be smaller than the width of a second electrode RME2 or RME3 that faces the third part RM_N. First and second light-emitting element groups ED #1 and ED #2 may be disposed on the first and second parts RM_W and RM_S, respectively, of the first electrode RME1_5, similarly to their respective counterparts from some of the above-described embodiments. As the third part RM_N of the first electrode RME1_5 may have a smaller width than the second part RM_S and the second or third electrode RME2 or RME3, a relatively small number of light-emitting elements (ED1 and ED2) may be arranged because of the flow of ink toward the second part RM_S or other electrodes. For example, the first electrode RME1_5 may include the first and second parts RM_W and RM_S and the third part RM_N, which have a smaller width than the first and second parts RM_W and RM_S, and a third light-emitting element group ED #2, which has a lower light-emitting element density than the first and second light-emitting element groups ED #1 and ED #2, may be further provided. As the first electrode RME1_5 further includes the third part RM_N, the first subpixel PX1 may include the first, second, and third light-emitting element groups ED #1, ED #2, and ED #3, and the light-emitting elements (ED1 and ED2) may be distributed at a density that sequentially varies in the second direction DR2.

The shape of one or more first parts RM_W of each of first and second electrodes RME1 and RME4 of each subpixel PXn are not limited to the above-described embodiments. As another example, each of the first and fourth electrodes RME1 and RME4 may include multiple first part RM_W and multiple second parts RM_S and may thus form a particular pattern, and the shape of the first parts RM_W may vary.

Figure 15:
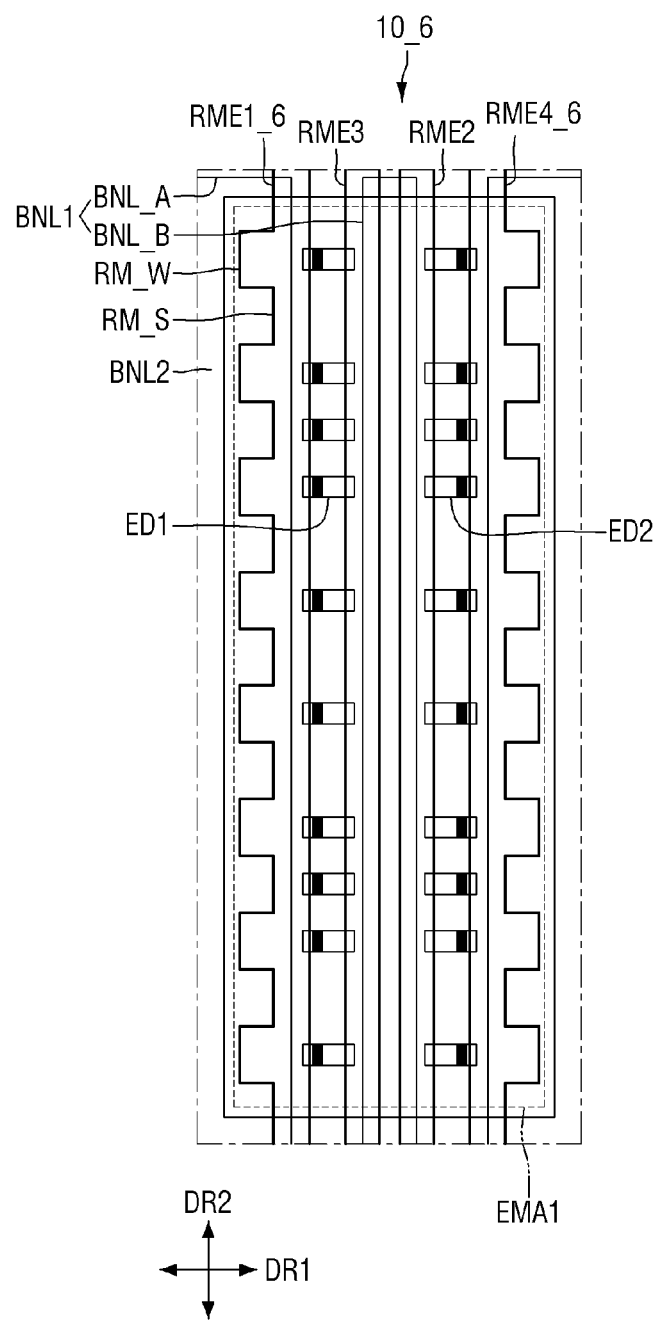
FIGS. 15 through 17 are schematic plan views illustrating the shapes and the arrangements of electrodes and light-emitting elements of each of display devices according to other embodiments of the disclosure.
Figure 16:
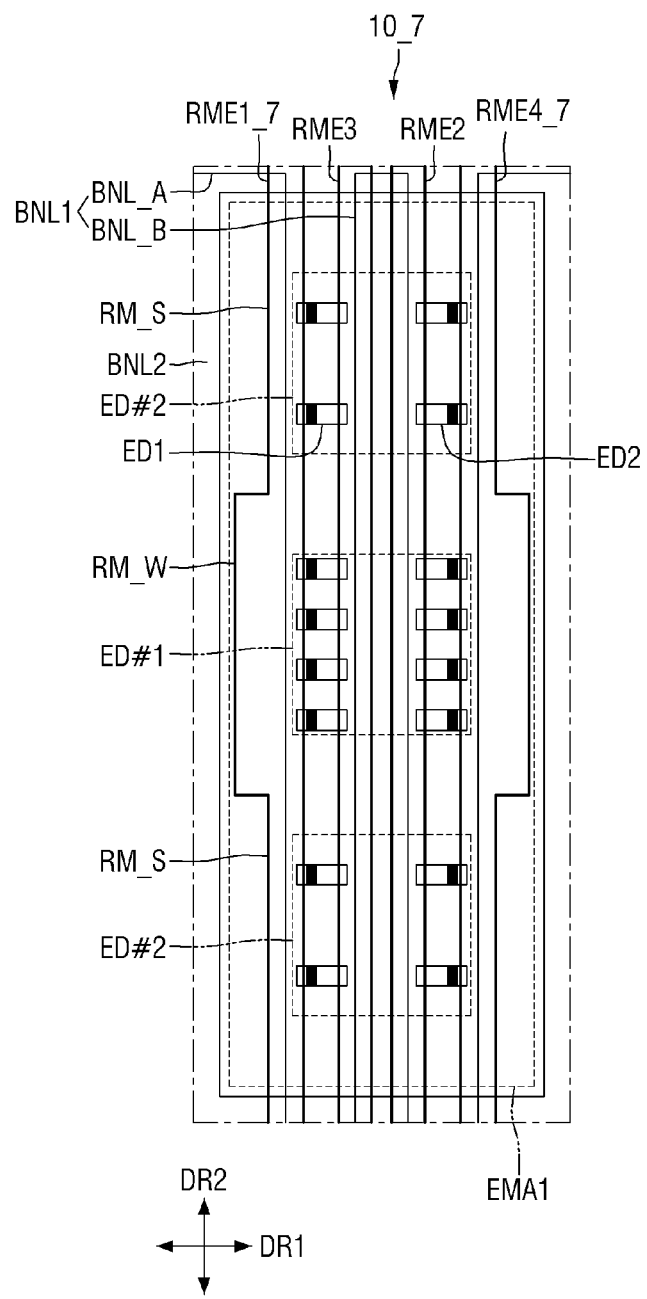
Figure 17:
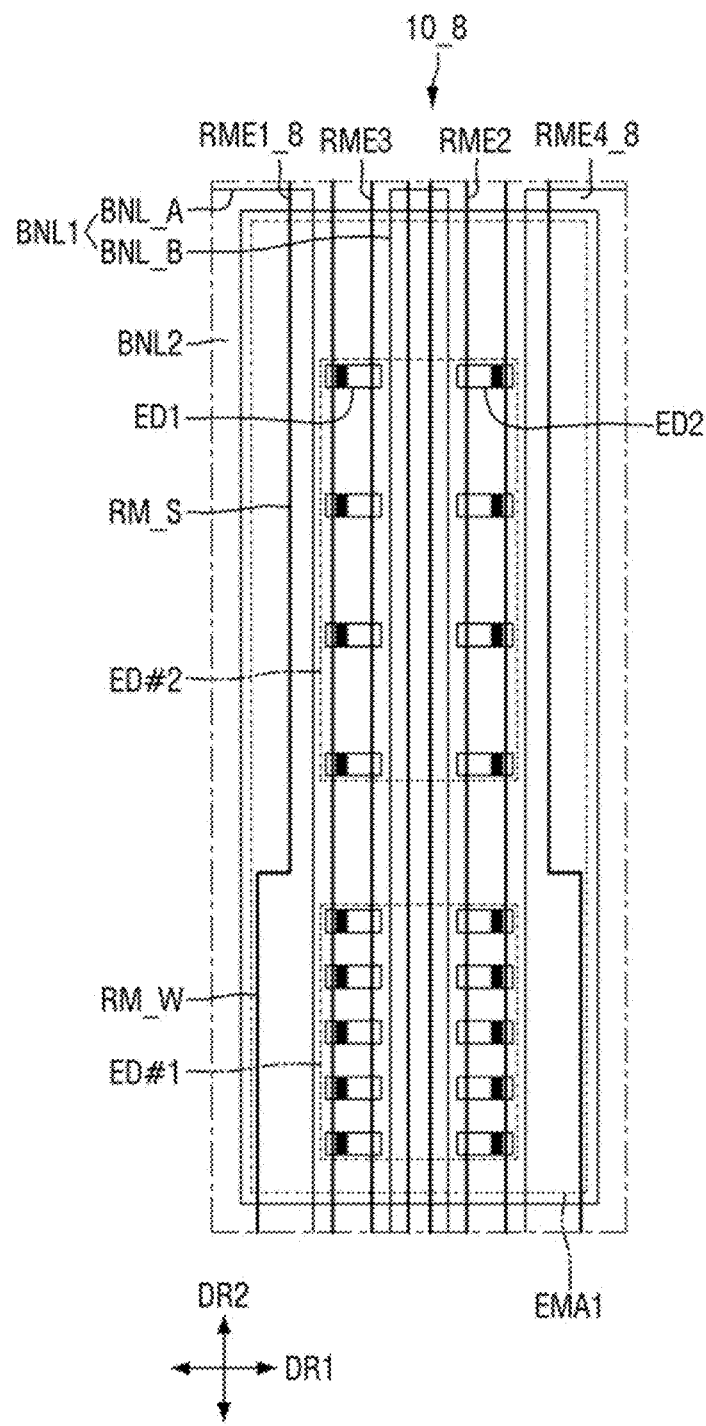

FIGS. 15 through 17 are schematic plan views illustrating the shapes and the arrangements of electrodes and light-emitting elements of each of display devices according to other embodiments of the disclosure.

Referring to a first subpixel PX1 of a display device 10_6 of FIG. 15, a first electrode RME1_6 may include a relatively large number of first parts RM_W and a relatively large number of second parts RM_S, and the first parts RM_W and the second parts RM_S may be alternately arranged. In the display device 10_6, an ink flow for moving light-emitting elements (ED1 and ED2) may be uniform regardless of locations on the first electrode RME1_6, and the light-emitting elements (ED1 and ED2) may be relatively and evenly arranged in the first subpixel PX1. According to the embodiment of FIG. 15, ink flows may be generated between electrodes (RME1_6, RME2, RME3, and RME4_6), and as a result, the light-emitting elements (ED1 and ED2) may be evenly distributed, instead of being classified into any particular light-emitting element group, as compared to a case where the first electrode RME1_6 and the electrode that the first electrode RME1_6 faces have the same shape. Also, ink flows that are irrelevant to locations on the first electrode RME1_6 may prevent light-emitting elements (ED1 and ED2) with dipoles in ink from being arranged in a state of being agglomerated.

Referring to a first subpixel PX1 of a display device 10_7 of FIG. 16, a first electrode RME1_7 may include one first part RM_W and two second parts RM_S, which are connected via the first part RM_W. The first part RM_W and the second parts RM_S may be integral with each other. Light-emitting elements (ED1 and ED2) may be classified into a first light-emitting element group ED #1, which is disposed at the center, in a second direction DR2, of a first emission area EMA of the first subpixel PX1, and second light-emitting element groups ED #2, which are disposed on the upper and lower sides of the center of the first emission area EMA1. Most of the light-emitting elements (ED1 and ED2) may be disposed in the middle of the first emission area EMA1, and the emission centers of the light-emitting elements (ED1 and ED2) may generally coincide with the center of the first subpixel PX1. According to the embodiment of FIG. 16, the number of light-emitting elements (ED1 and ED2) that are lost because of being disposed on both sides, in the second direction DR2, of the first emission area EMA1 where no contact electrodes are disposed may be reduced.

Referring to a first subpixel PX1 of a display device 10_8 of FIG. 17, a first electrode RME1_8 may include one first part RM_W and one second part RM_S, which are disposed separately on the upper and lower sides, respectively, of a first emission area EMA of the first subpixel PX1. A first light-emitting element group ED #1 may be disposed on one side, in the second direction DR2, of the first emission area EMA1, i.e., on the lower side of the first emission area EMA1, and a second light-emitting element group ED #2 may be disposed on the other side, in the second direction DR2, of the first emission area EMA1, i.e., on the upper side of the first emission area EMA1. The emission center of the first emission area EMA1 may not coincide with the center of the first subpixel PX1 but may be disposed off-center with respect to the first subpixel PX1. In a case where the display device 10_8 further includes a substrate that is opposite to a first substrate SUB and a color control structure for outputting or converting light emitted from the first subpixel PX1, the display device 10_8 may be modified in various manners to correspond to the color control structure in connection with the alignment between each subpixel PXn and the color control structure.

The shape of one or more first parts RM_W of each of first and second fourth electrodes RME1 and RME4 of each subpixel PXn may not have a linear shape. As another example, the outer sides of the first parts RM_W may be inclined or curved so that the first and second fourth electrodes RME1 and RME4 may have a varying width. Display devices having, in each subpixel PXn, first parts RM_W with a varying width will hereinafter be described.

FIGS. 18 through 27 are schematic plan views illustrating the shapes and the arrangements of electrodes and light-emitting elements of each of display devices according to other embodiments of the disclosure.

Figure 18:
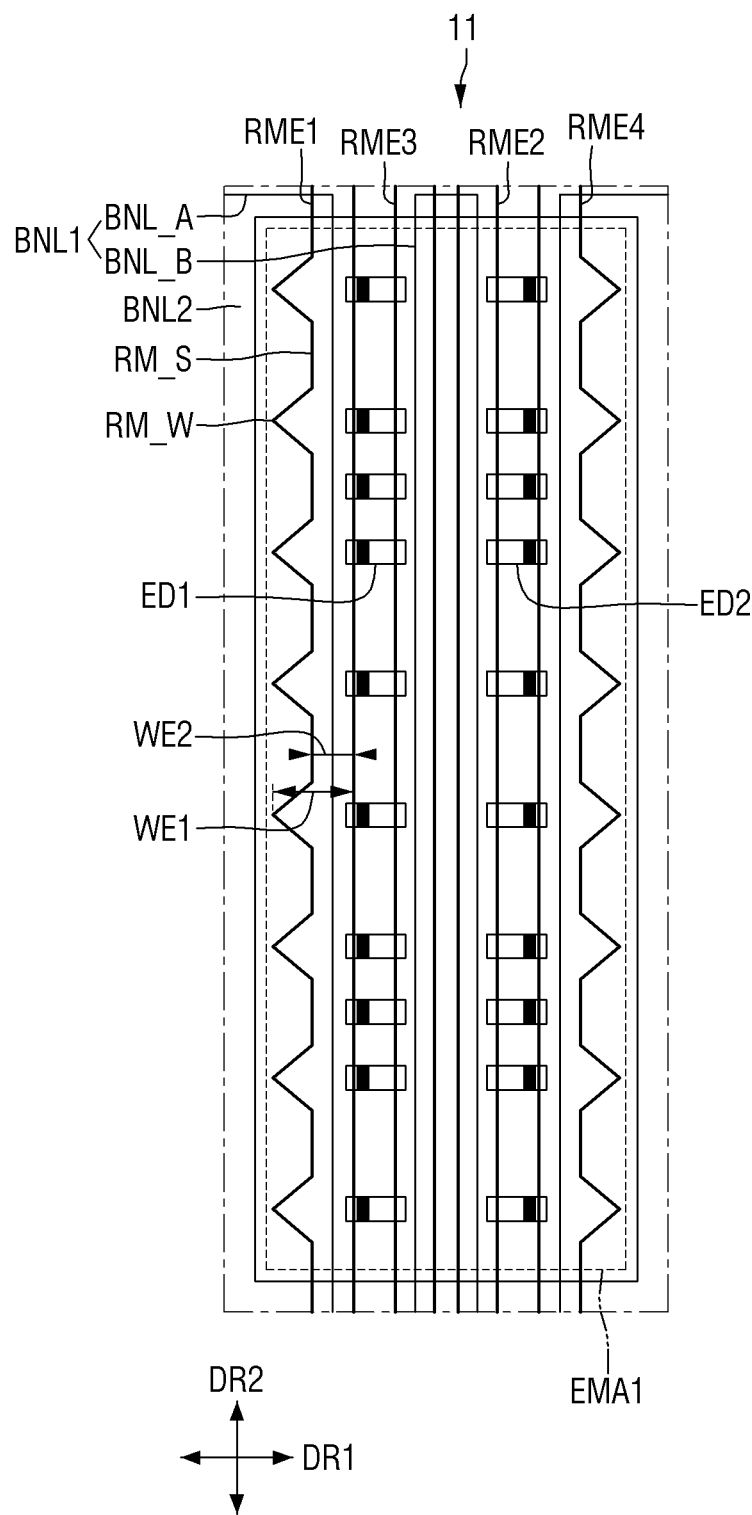
FIGS. 18 through 27 are schematic plan views illustrating the shapes and the arrangements of electrodes and light-emitting elements of each of display devices according to other embodiments of the disclosure.

Referring to a display device 11 of FIG. 18, a first electrode RME1, similar to its counterpart of FIG. 15, includes first parts RM_W and second parts RM_S. However, in the embodiment of FIG. 18, unlike in the embodiment of FIG. 15, the first parts RM_W may not extend straight in a second direction DR2. Instead, each of the first parts RM_W may have inclined outer sides. For example, the width of the first parts RM_W may not be uniform but may vary from one location to another location. As each of the first parts RM_W has a pair of inclined outer sides, each of the first parts RM_W may have a protruding triangular shape in a plan view and may have a maximum width WE1 at the point where the pair of inclined outer sides meet. The display device 11 differs from the display device 10_7 of FIG. 16 in the shape of the first parts RM_W. The first parts RM_W may have a variable width, but as long as the first parts RM_W have a greater width than a width WE2 of the second parts RM_S, the first parts RM_W may properly generate the flow of ink and may thus move light-emitting elements (ED1 and ED2) to a particular location.

The first parts RM_W may not have a triangular shape and may have various other shapes such as another polygonal shape or a curved shape, if desired.

Figure 19:
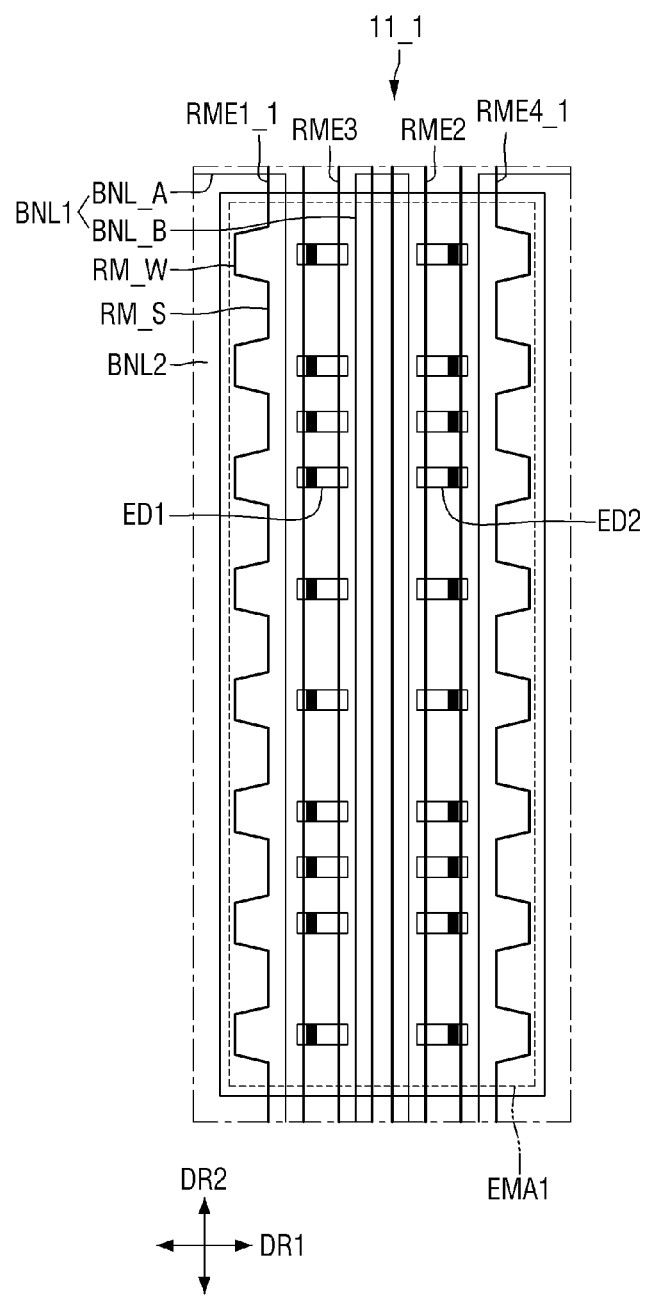

Referring to a display device 11_1 of FIG. 19, each of first parts RM_W of a first electrode RME1_1 may have inclined outer sides and a straight side extending in a second direction DR2. The display device 11_1 differs from the display device 11 of FIG. 18 at least in that the first parts RM_W of the first electrode RME1_1 have a non-triangular polygonal shape in a plan view, and the width of the first parts RM_W changes more considerably than the width of the first parts RM_W of FIG. 18.

Figure 20:
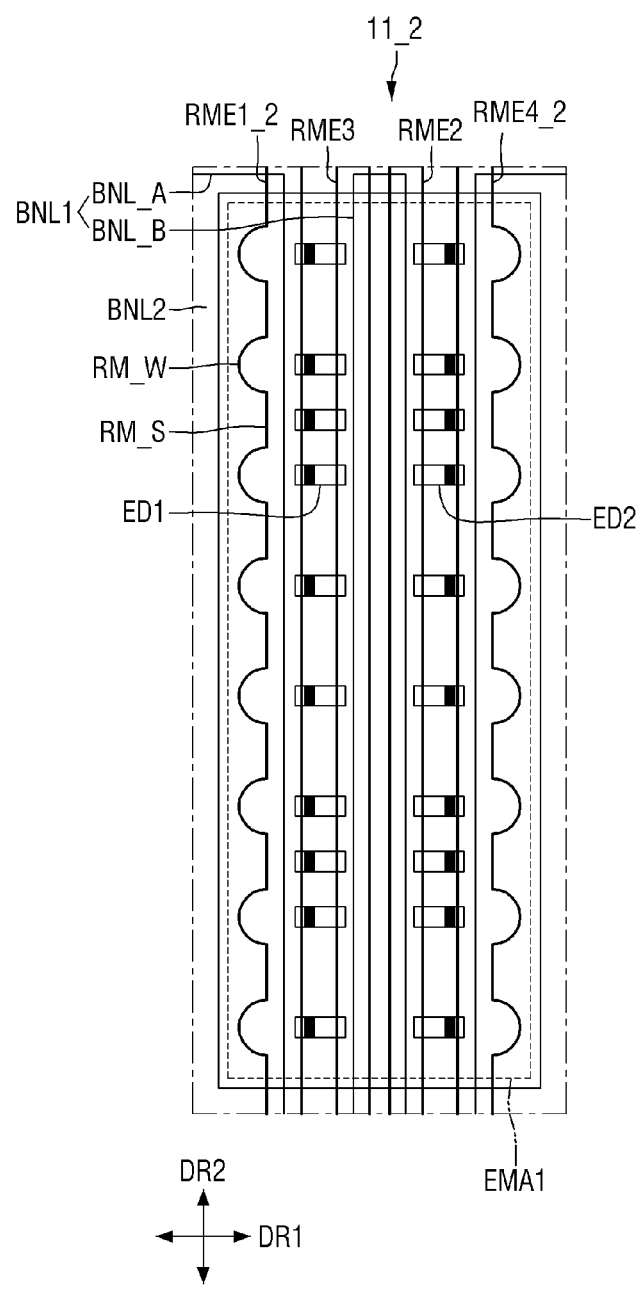

Referring to a display device 11_2 of FIG. 20, each of first parts RM_W of a first electrode RME1_1 may have a curved outer side. The display device 11_2 differs from the display device 11 of FIG. 18 at least in that the first parts RM_W have a semicircular shape in a plan view, and the width of the first parts RM_W changes more considerably than the width of the first parts RM_W of FIG. 18.

Figure 21:
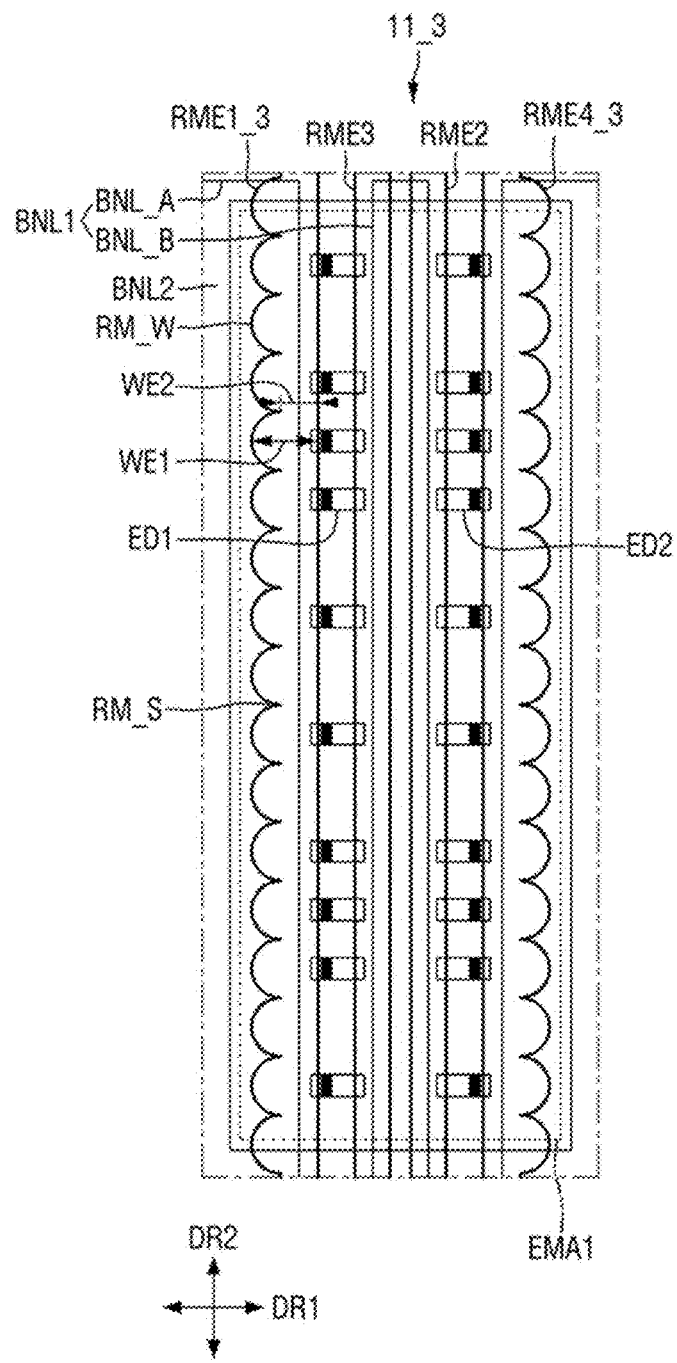

Referring to a display device 11_3 of FIG. 21, first parts RM_W of a first electrode RME1_3 may be formed to adjoin one another, and second parts RM_S of the first electrode RME1_3 may be formed at the boundaries between the first parts RM_W to have a small width. The width of the first electrode RME1_3 may constantly vary in a second direction DR2, instead of being uniformly maintained. Accordingly, the flow of ink may be formed on the entire surface of the first electrode RME1_3, the agglomeration of light-emitting elements (ED1 and ED2) may be prevented, and as a result, the light-emitting elements (ED1 and ED2) may be uniformly distributed.

Figure 22:
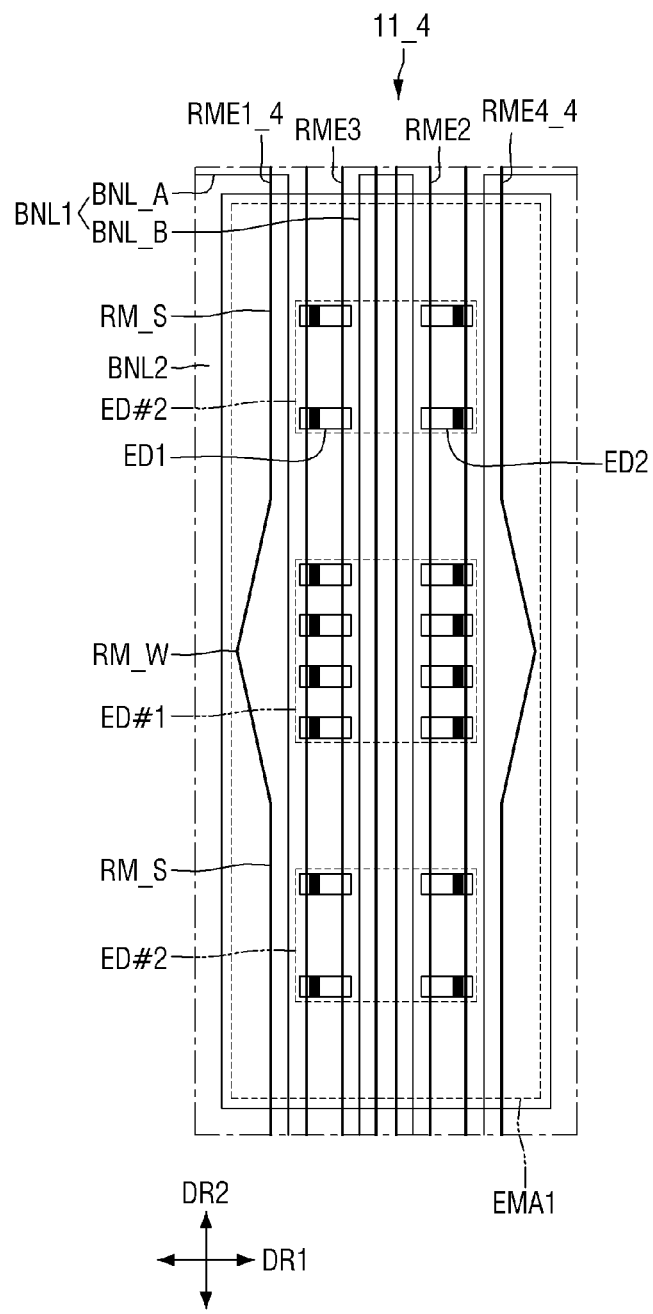

Referring to a display device 11_4 of FIG. 22, a first part RM_W of a first electrode RME14, similar to the first parts RM_W of FIG. 18, may have a pair of inclined outer sides, and the first electrode RME1_4, similar to the first electrode RME1_7, may include one first part RM_W and two second parts RM_S and may have the first part RM_W located at the center of a first emission area EMA1 of a first subpixel PX1. As the width of the first part RM_W varies in a second direction DR2, the width of the first parts RM_W changes more considerably than the width of the first parts RM_W of FIG. 18.

Figure 23:
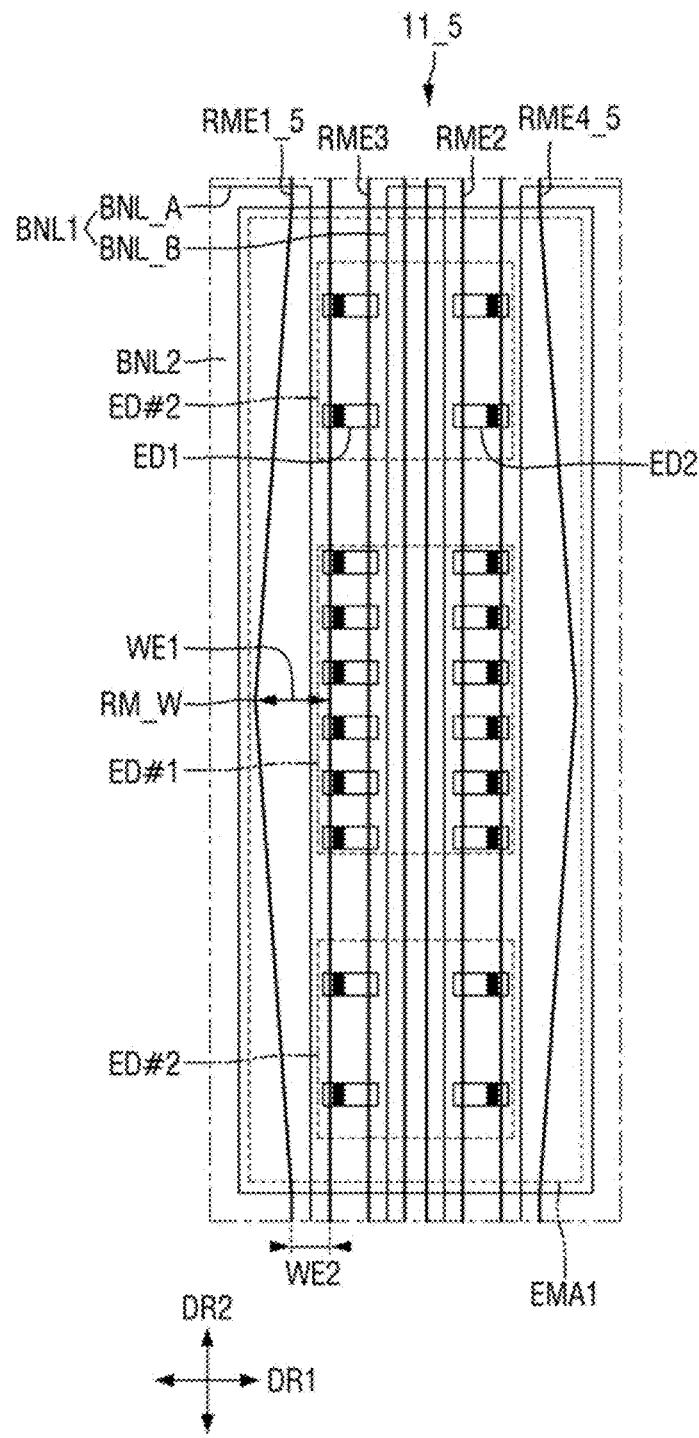

Referring to a display device 11_5 of FIG. 23, a first part RM_W of a first electrode RME1_5 may further extend in a second direction DR2 to be disposed in and across a first emission area EMA1 of a first subpixel PX1, and second parts of the first electrode RME1_5 may be disposed on the outside of the first emission area EMA1. The embodiment of FIG. 23 differs from the embodiment of FIG. 22 in the length of the first part RM_W. In the display device 11_5, as the first part RM_W has a maximum width WE1 near the center of the first emission area EMA1, a first light-emitting element group ED #1 may be disposed near the center of the first emission area EMA1. Second light-emitting element groups ED #1 with a relatively low light-emitting element density may be formed on both sides, in the second direction DR2, of the center of the first emission area EMA1. The second light-emitting element groups ED #1 may be disposed on the first part RM_W but may have a lower light-emitting element density than the first light-emitting element group ED #1. For example, the first light-emitting element group ED #1 and the second light-emitting element groups ED #2 may be classified by their light-emitting element densities, not by their locations on the first electrode RME1_5. Since the first part RM_W is disposed in and across the first emission area EMA1, the distribution of light-emitting elements (ED1 and ED2) may be relatively uniform throughout the first emission area EMA1.

Figure 24:
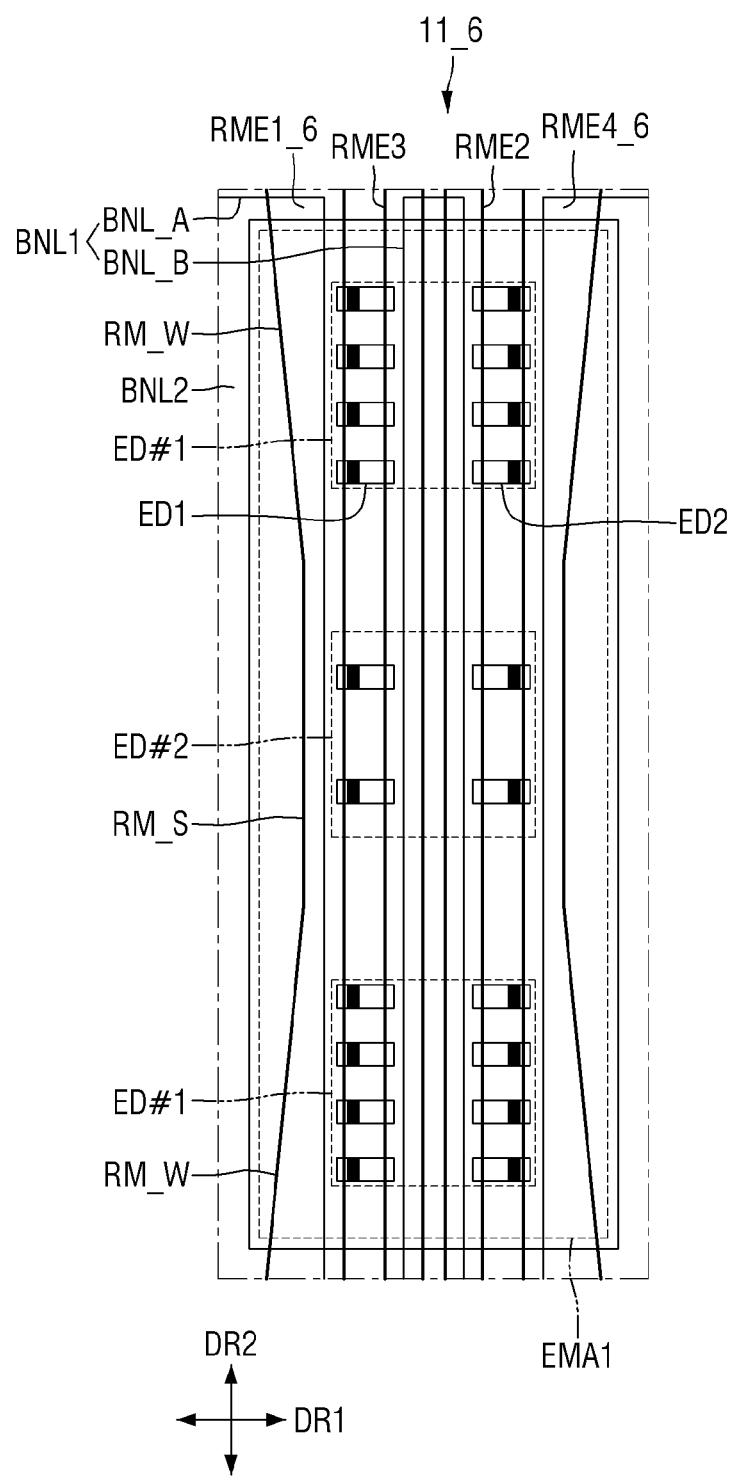

Referring to a display device 11_6 of FIG. 24, a first electrode RME1_6 may have two first parts RM_W and a second part RM_S disposed between the first parts RM_W, and the outer sides of the first parts RM_W may be inclined so that the width of the first parts RM_W may vary. The display device 11_6 differs from the display device 10 of FIG. 3 at least in that the width of the first parts RM_W varies.

Figure 25:
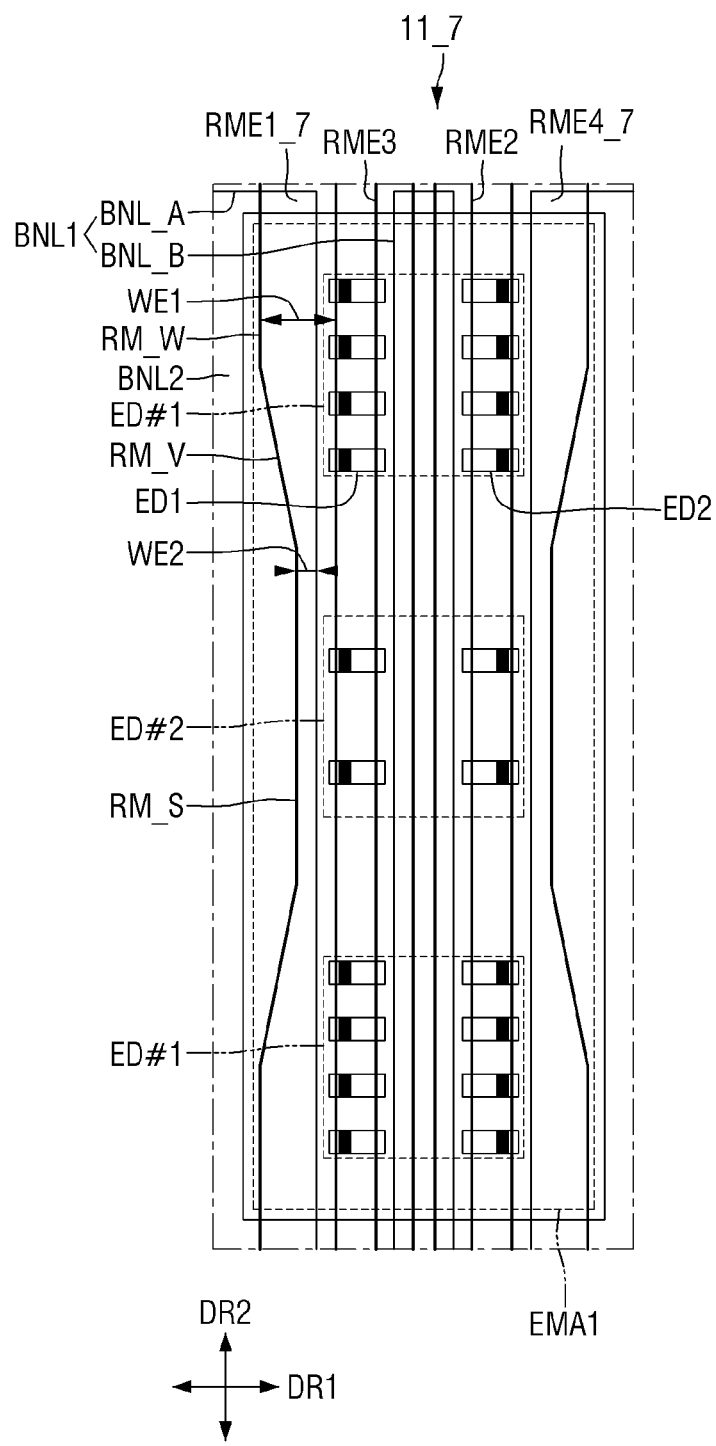

Referring to a display device 11_7 of FIG. 25, a first electrode RME1_7 may include first parts RM_W having a uniform width and a second part RM_S having a uniform width and may further include fourth parts RM_V, which have a varying width between the first parts RM_W and the second part RM_S. The embodiment of FIG. 25 differs from the embodiment of FIG. 3 in that the first electrode RME1_7 further includes the fourth parts RM_V. As the first electrode RME1_7 further includes the fourth parts RM_V between the first parts RM_W and the second part RM_S, the difference in light-emitting element density between first light-emitting element groups ED #1 and a second light-emitting element group ED #2 may be reduced.

Figure 26:
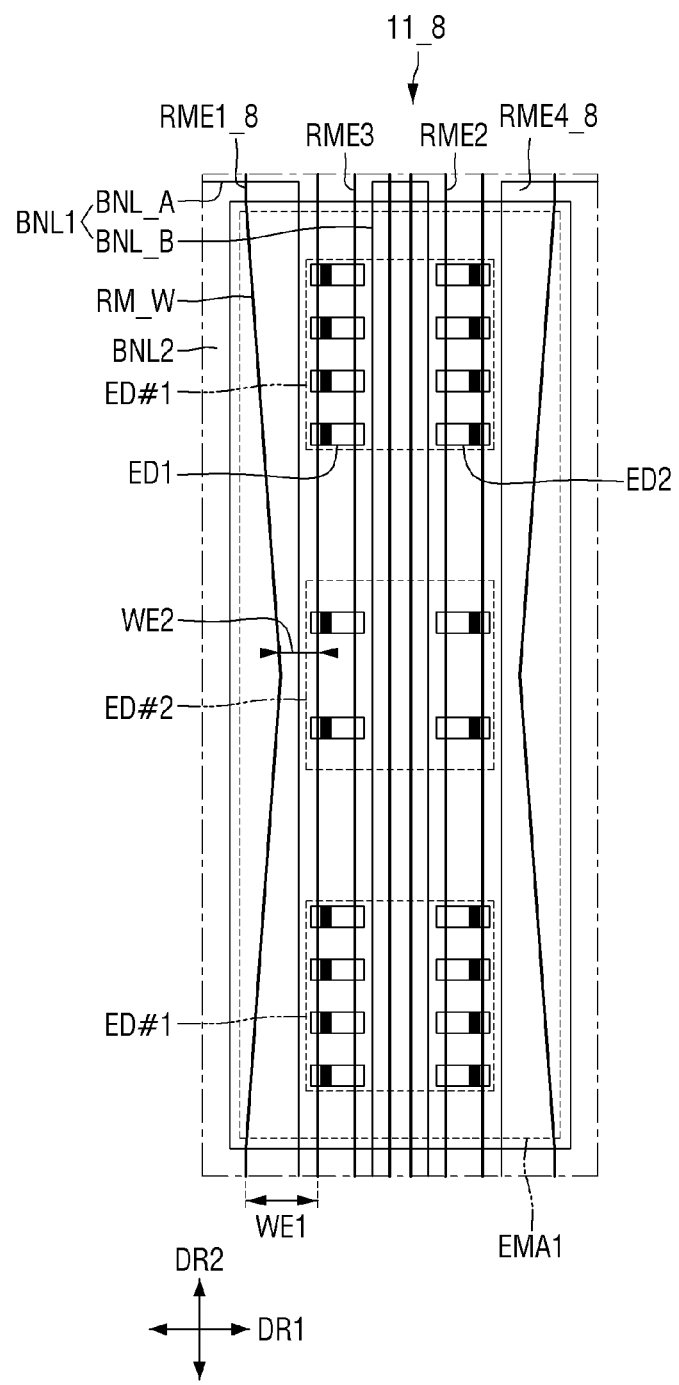

Referring to a display device 11_8 of FIG. 26, first parts RM_W of a first electrode RME1_8 may be disposed in and across a first emission area EMA1 of a first subpixel PX1, and a second part RM_S of the first electrode RME1_8 may be disposed on the outside of the first emission area EMA1. The embodiment of FIG. 26 may be the combination of the embodiments of FIGS. 23 and 24. As the first parts RM_W are disposed in and across the first emission area EMA1 so that the width of the first electrode RME1_8 constantly varies from one location to another location, the distribution of light-emitting elements (ED1 and ED2) may be relatively uniform throughout the first emission area EMA1.

Figure 27:
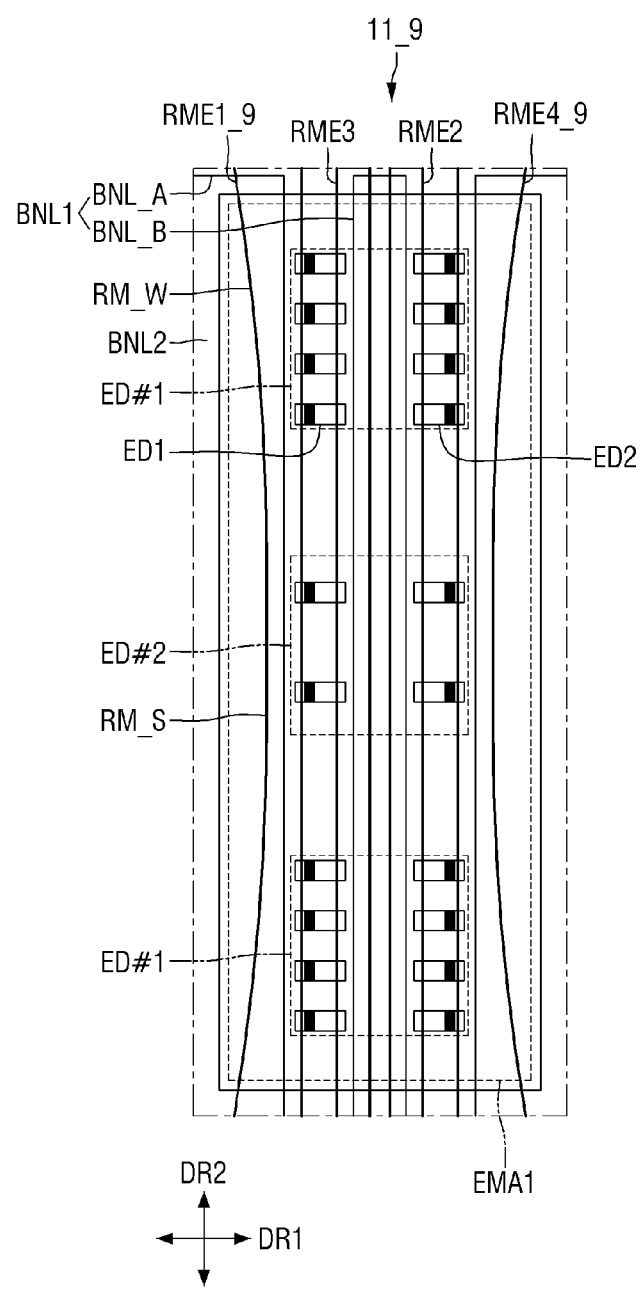

Referring to a display device 11_9 of FIG. 27, the outer sides of first parts RM_W of a first electrode RME1_9 may be curvedly inclined. The width of the first parts RM_W may vary in a second direction DR2, but the amount by which the width of the first portions RM_W varies may not be uniform but varying. The embodiment of FIG. 27 is substantially identical to the embodiment of FIG. 26, and thus, a detailed description thereof will be omitted.

First and second electrodes RME1 and RME2 of each subpixel PX1 may not have a linear shape but may have a circular shape. For example, one of the first and second electrodes RME1 and RME2 may surround the other electrode, and light-emitting elements ED may be disposed in the gap between the first and second electrodes RME1 and RME2. The width of the first and second electrodes RME1 and RME2, which are formed in the shape of concentric circles with different diameters, may vary from one location to another location, and the first and second electrodes RME1 and RME2, similar to their counterparts of any one of the above-described embodiments, may prevent the agglomeration of the light-emitting elements ED.

Figure 28:
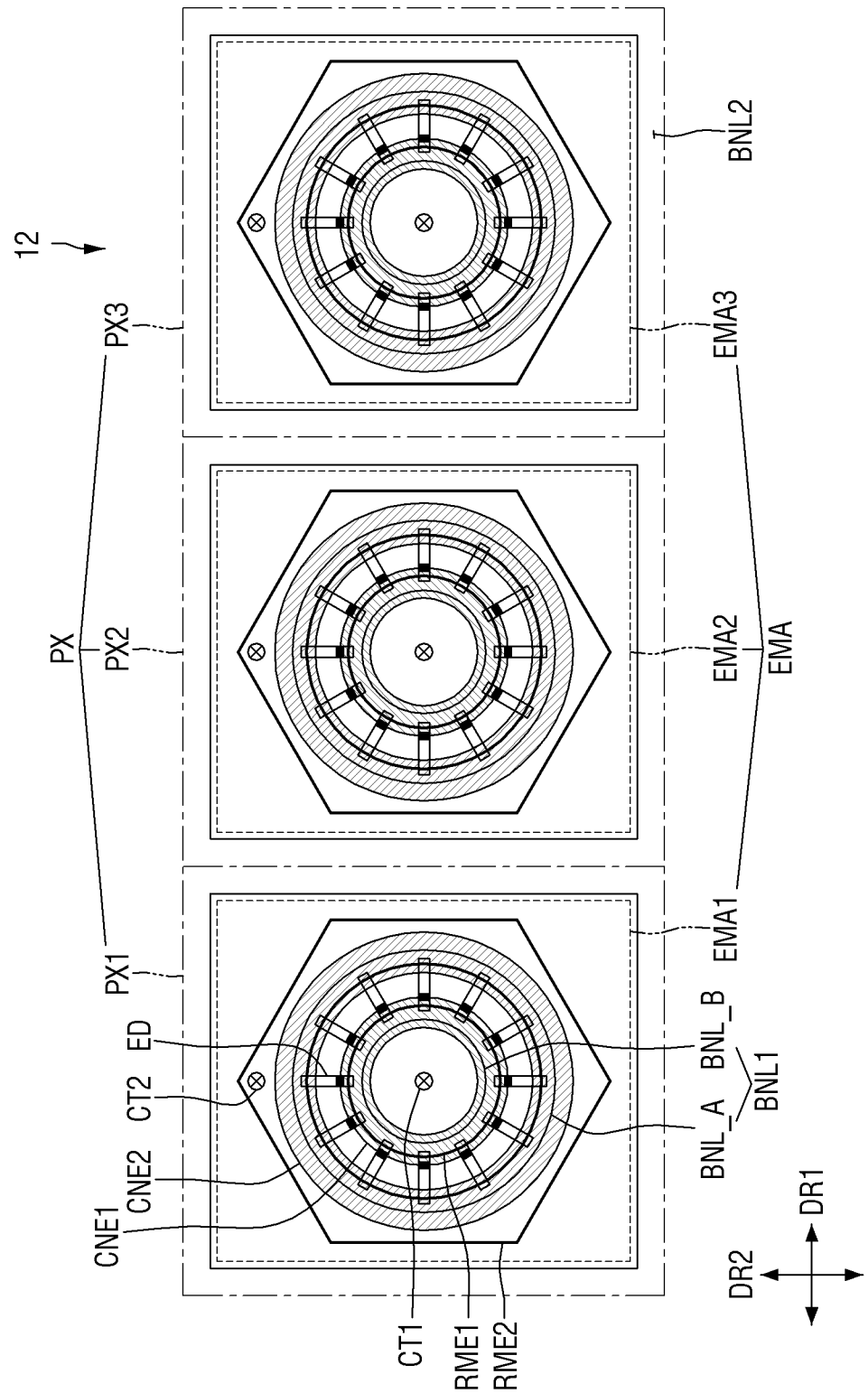
FIG. 28 is a schematic plan view of a pixel of a display device according to another embodiment of the disclosure.
Figure 29:
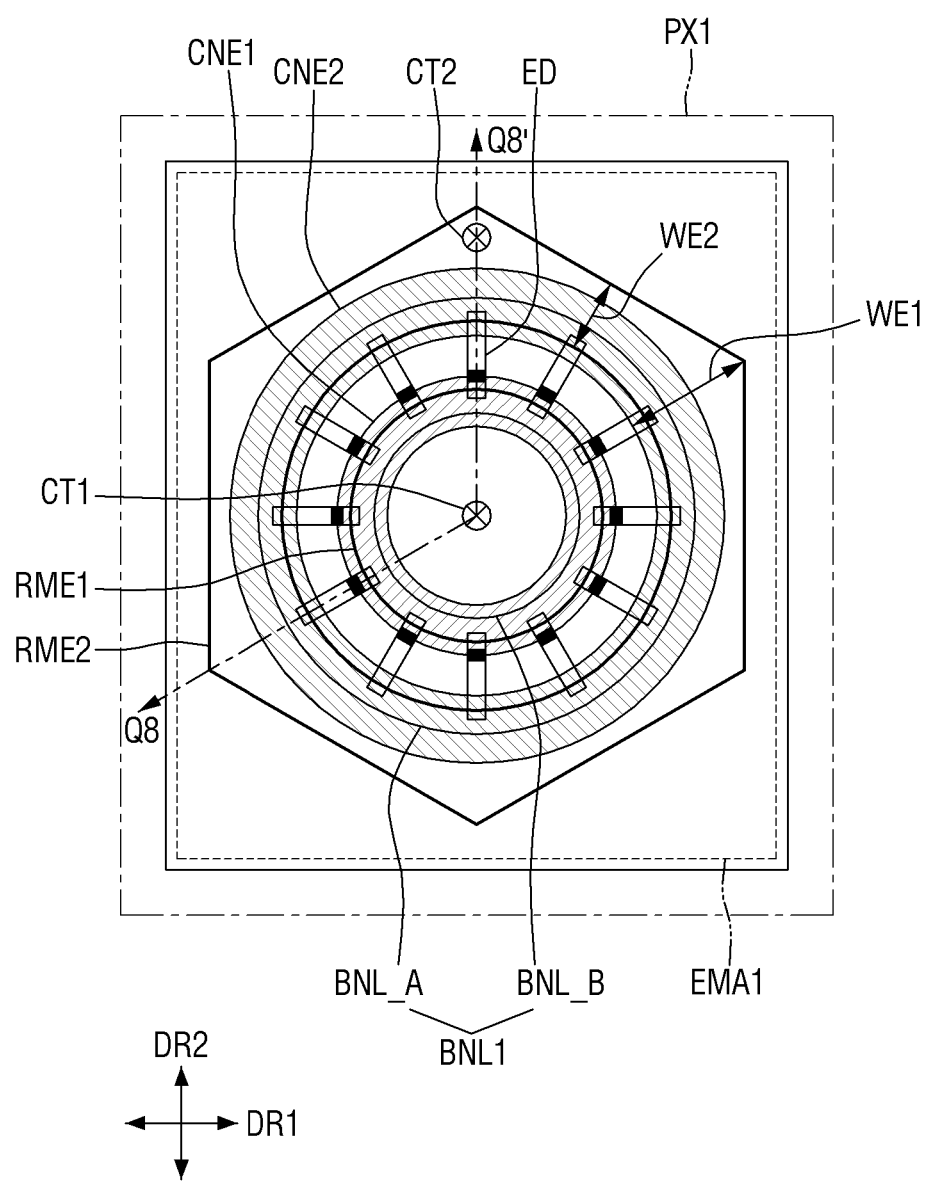
FIG. 29 is a schematic plan view of a first subpixel of FIG. 28.
Figure 30:
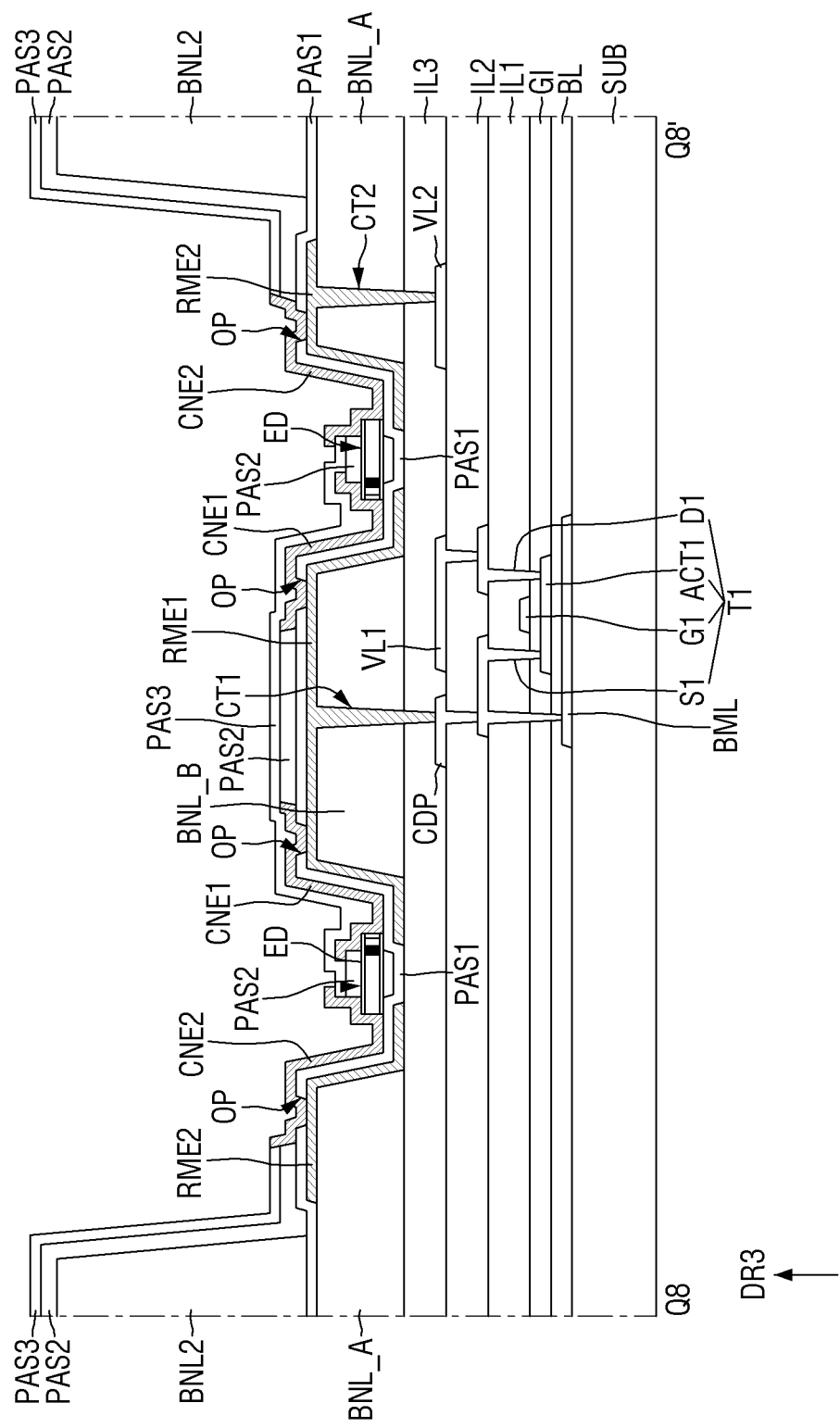
FIG. 30 is a schematic cross-sectional view taken along line Q8-Q8' of FIG. 29.

FIG. 28 is a schematic plan view of a pixel of a display device according to another embodiment of the disclosure. FIG. 29 is a schematic plan view of a first subpixel of FIG. 28. FIG. 30 is a schematic cross-sectional view taken along line Q8-Q8' of FIG. 29. FIG. 30 illustrates a cross-sectional view taken across first and second electrodes RME1 and RME2 and light-emitting elements ED of FIG. 29.

Referring to a display device 12 of FIGS. 28 through 30, a first electrode RME1 may have a circular shape, and a second electrode RME2 may be formed to be spaced apart from, and surround, the outer side of the first electrode RME1. Light-emitting elements ED may be disposed between the first and second electrodes RME1 and RME2, and first and second sub-banks BNL_A and BNL_B of a first bank BNL1 and contact electrodes (CNE1 and CNE2) may have a shape corresponding to the shape of electrodes (RME1 and RME2).

Specifically, the first sub-bank BNL_A may include at least one hole. The first sub-bank BNL_A may be disposed in and beyond a first subpixel PX1 into neighboring subpixels PXn of the first subpixel PX1 and may include at least one hole in a first emission area EMA1. The first sub-bank BNL_A is illustrated as including a hole in the first emission area EMA1, but the disclosure is not limited thereto.

The second sub-bank BNL_B may be disposed in the hole of the first sub-bank BNL_A. The second sub-bank BNL_B may be formed in a circular shape to have a smaller diameter than the hole of the first sub-bank BNL_A. The second sub-bank BNL_B may be spaced apart from, and face, the sidewall of the hole of the first sub-bank BNL_A. For example, the first and second sub-banks BNL_A and BNL_B may be spaced apart from, and face, each other. Light-emitting elements ED may be disposed between the first and second sub-banks BNL_A and BNL_B.

The first electrode RME1 may be disposed on the second sub-bank BNL_B. The first electrode RME1 may have a circular shape and may be disposed to cover or overlap the second sub-bank BNL_B. The first electrode RME1 may be formed such that the center of the first electrode RME1 may coincide with the center of the second sub-bank BNL_B. The first electrode RME1 may be electrically connected to a first conductive pattern CDP via a first contact hole CT1 that penetrates the second sub-bank BNL_B and a third interlayer insulating layer IL3. The first electrode RME1 may be disposed to cover or overlap an outer side surface of the second sub-bank BNL_B that is spaced apart from, and faces, the first sub-bank BNL_A, and the first and second electrodes RME1 and RME2 may be spaced apart, and face, each other, between the first and second sub-banks BNL_A and BNL_B.

The second electrode RME2 is disposed on the first sub-bank BNL_A. The second electrode RME2 may be disposed to overlap the first sub-bank BNL_A and may include at least one electrode hole corresponding to the hole of the first sub-bank BNL_A. The electrode hole of the second electrode RME2 may have a smaller diameter such that the hole of the first sub-bank BNL_A may be partially exposed, and the second electrode RME2 may be disposed to overlap the sidewall of the hole of the first sub-bank BNL_A. The second electrode RME2 may be formed on the first sub-bank BNL_A and may be electrically connected to a second voltage line VL2 through a second contact hole CT2 that penetrates the first sub-bank BNL_A and the third interlayer insulating layer IL3.

The light-emitting elements ED may be disposed between the first and second electrodes RME1 and RME2 and may be arranged along the outer circumference of the first electrodes RME1. For example, the light-emitting elements ED may be disposed such that first end portions thereof may face the center of the first electrode RME1 and surround the center of the first electrode RME1, along the outer circumference of the first electrode RME1. Both end portions of each of the light-emitting elements ED may be disposed on the first and second electrodes RME1 and RME2 and may be electrically connected to the first and second electrodes RME1 and RME2 via the contact electrodes (CNE1 and CNE2). As one of the electrodes (RME1 and RME2) surrounds the other electrode, the direction faced by the first end portions of the light-emitting elements ED is not particularly limited to either a first direction DR1 or a second direction DR2. Thus, light emitted from the first emission area EMA1 may proceed in various directions.

First and second contact electrodes CNE1 and CNE2 may be disposed on the first and second electrodes RME1 and RME2, respectively. The first electrode RME1 may be disposed along the outer circumference of the first electrode RME1, which has a circular shape, to contact the first end portions of the light-emitting elements ED and the first electrode RME1, and the second electrode RME2 may be disposed along the outer circumference of the electrode hole of the second electrode RME2 to contact second end portions of the light-emitting elements and the second electrode RME2. For example, the first and second contact electrodes CNE1 and CNE2 may be formed in a ring shape.

As the first electrode RME1 overlaps the first conductive pattern CDP, which is disposed below the first electrode RME1, through the first contact hole CT1, which is located at the center of the first electrode RME1, the width of the first electrode RME1 may be equal to the radius of the first electrode RME1. As already mentioned above, two opposing electrodes, e.g., the first and second electrodes RME1 and RME2, may induce the flow of ink or the alignment of the light-emitting elements at a particular location depending on the relative widths thereof. For example, the second electrode RME1 may have a shape that may generate the flow of ink, conforming to the shape of the first electrode RME1, which is disposed in the electrode hole of the second electrode RME2.

For example, in a case where the first electrode RME1 has a circular or disk shape, the second electrode RME2 may have a polygonal shape with a circular electrode hole. The second electrode RME2, unlike the first electrode RME1, may have a varying width. For example, the second electrode RME2 may include first parts having a first width WE1, which is relatively large, and second parts with a second width WE2, which is relatively small. In a case where the second electrode RME2 has a hexagonal shape, the first parts may be parts of the second electrode RME2 having the first width WE1 as their maximum width from the electrode hole of the second electrode RME2 may correspond to the first parts, and the second parts may be parts of the second electrode RME2 having the second width WE2 as their minimum width from the electrode hole of the second electrode RME2. The second electrode RME2, unlike the first electrode RME1, may not have a uniform width and may include parts with a smaller width than the radius of the first electrode RME1.

In a case where the first width WE1 of the first parts of the second electrode RME2 is greater than the radius of the first electrode RME1, the flow of ink between the first electrode RME1 and the first parts of the second electrode RME2 may be directed toward the second electrode RME2. In a case where the second width WE2 of the second parts of the second electrode RME2 is smaller than the radius of the first electrode RME1, the flow of ink between the first electrode RME1 and the second parts of the second electrode RME2 may be directed toward the first electrode RME1. Also, the flow of ink may be directed from the second parts to the first parts of the second electrode RME2. The flow of ink may be generated between the first and second electrodes RME1 and RME2, depending on the location on the second electrode RME2, and as a result, the light-emitting elements ED may be prevented from being arranged in a state of being agglomerated. Although not specifically illustrated, the light-emitting elements ED may form different light-emitting element groups (ED #1 and ED #2) for different parts of the second electrode RME1 with different widths (i.e., the first and second widths WE1 and WE2) and may be arranged at different densities.

The embodiment of FIGS. 28 through 30 differs from the embodiment of FIG. 3 at least in that the first electrode RME1 has a circular or disk shape and the second electrode RME2 has a polygonal shape with a circular electrode hole. In a case where one of the first and second electrodes RME1 and RME2 surrounds the other electrode and has different widths from one location to another location, the flow of ink may be generated, and the agglomeration of the light-emitting elements ED and the alignment of the light-emitting elements ED at a particular location may not be induced. The second electrode RME2 is illustrated as having a hexagonal shape, but the disclosure is not limited thereto. The shapes of the first and second electrodes RME1 and RME2 may vary such that the first and second electrodes RME1 and RME2 have different widths from each other or from one location to another location to align the light-emitting elements ED at a particular location and prevent the agglomeration of the light-emitting elements ED.

Figure 31:
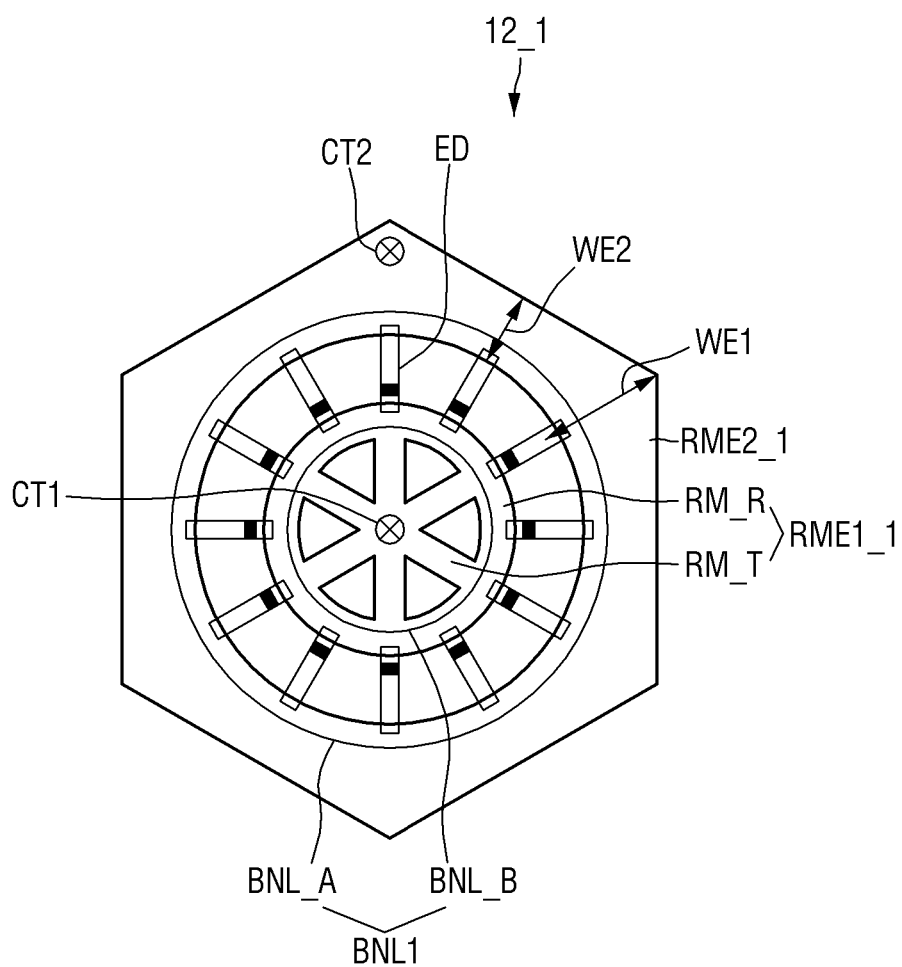
FIG. 31 is a schematic plan view illustrating the shapes of electrodes of a display device according to another embodiment of the disclosure.

FIG. 31 is a schematic plan view illustrating the shapes of electrodes of a display device according to another embodiment of the disclosure. For convenience, FIG. 31 illustrates only light-emitting elements ED, electrodes (RME1_1 and RME2_1), and a first bank BNL1, but not contact electrodes and a second bank BNL2, and this also applies to FIGS. 32 through 34. Display devices according to other embodiments of the disclosure will hereinafter be described with reference to FIGS. 31 through 34, focusing mainly on the shape of electrodes thereof.

Referring to a display device 12_1 of FIG. 31, a first electrode RME1_1 may include an outer part RM_R, which has a predetermined width from the center of a first contact hole CT1 and has a ring shape, and protruding parts RM_T, which protrude from the outer part RM_R toward the first contact hole CT1. A second electrode RME2_1, similar to its counterpart of FIG. 30, may have a polygonal shape with a circular electrode hole and may have a varying width from one location to another location. The embodiment of FIG. 31 differs from the embodiment of FIG. 30 at least in that the first electrode RME1_1 has a ring shape, rather than a circular or disk shape, and includes a ring-shaped outer part RM_R and protruding parts RM_T connected to the ring-shaped outer part RM_R.

The outer part RM_R of the first electrode RME1_1 may have a predetermined width and may be arranged along the outer side of a second sub-bank BNL_B. As another example, the outer part RM_R of the first electrode RME1_1 may be disposed to face the inner side of the electrode hole of the second electrode RME2_1 and may have a ring shape. The protruding parts RM_T may protrude from the inner side of the outer part RM_R through the first contact hole CT1, which is formed at the center of the second sub-bank BNL_B. The protruding parts RM_T of the first electrode RME1_1 may be connected to a first conductive pattern CDP, which is disposed below the first electrode RME1_1, through the first contact hole CT1. Even though the first electrode RME1_1 further includes the protruding parts RM_T, the first electrode RME1_1 may not entirely cover or overlap the second sub-bank BNL_B. The first electrode RME1_1 may generally have a ring shape, but the area of part of the first electrode RME1_1 that overlaps the second sub-bank BNL_B may vary depending on the shape of the protruding parts RM_T. For example, the first electrode RME1_1 may have a different width in regions where the protruding parts RM_T are disposed around the first contact hole CT1 than in regions where only the outer part RM_R is disposed.

The protruding parts RM_T of the first electrode RME1_1 may be formed to correspond to first parts of the second electrode RME2_1 with a relatively large width. For example, in a case where the second electrode RME2_1, similar to its counterpart of FIG. 31, has a hexagonal shape, parts of the second electrode RME2_1 where the apexes of the hexagonal shape are located may be the first parts of the second electrode RME2_1. Six protruding parts RM_T of the first electrode RME1_1 may be formed to correspond to the first parts of the second electrode RME2_1. However, the disclosure is not limited to this example, and the number of protruding parts RM_T of the first electrode RME1_1 may vary depending on the shape of the second electrode RME2_1. In another example, the second electrode RME2_1 may have various other polygonal shapes such as a triangular or rectangular shape, and the first electrode RME1_1 may include a number of protruding parts RM_T corresponding to the shape of the second electrode RME2_1.

In a case where the first electrode RME1_1 includes the outer part RM_R, the first electrode RME1_1 may further include at least one protruding part RM_T to be connected to the first conductive pattern CDP through the first contact hole CT1. Parts of the first electrode RME1_1 where the protruding parts RM_T are formed may have a greater width than the outer part RM_R and may generate the flow of ink between the first and second electrodes RME1_1 and RME2_1. Parts of the second electrode RME2_1 corresponding to the protruding parts RM_T of the first electrode RME1_1 may have a relatively large width to prevent the light-emitting elements ED from being moved by the flow of ink, generated by the protruding parts RM_T toward the inside of the outer part RM_R of the first electrode RME1_1. As the first electrode RME1_1 includes the protruding parts RM_T and the second electrode RME2_1 has a polygonal shape with a circular electrode hole and thereby has a varying width from one location to another location, the flow of ink may be generated. Also, differences between the widths of the first and second electrodes RME1_1 and RME2_1 may be reduced or minimized, and the light-emitting elements ED may be prevented from being drawn to any particular electrode. Also, the number of light-emitting elements ED that fail to be arranged on the electrodes (RME1_1 and RME2_1) and are lost by being moved toward the inside of the outer part RM_R may be reduced because of the presence of the protruding parts RM_T of the first electrode RME1_1.

A second electrode RME2 of each subpixel PXn may also include a ring-shaped outer part RM_R and one or more protruding parts RM_T for connection to a second contact hole CT2.

Figure 32:
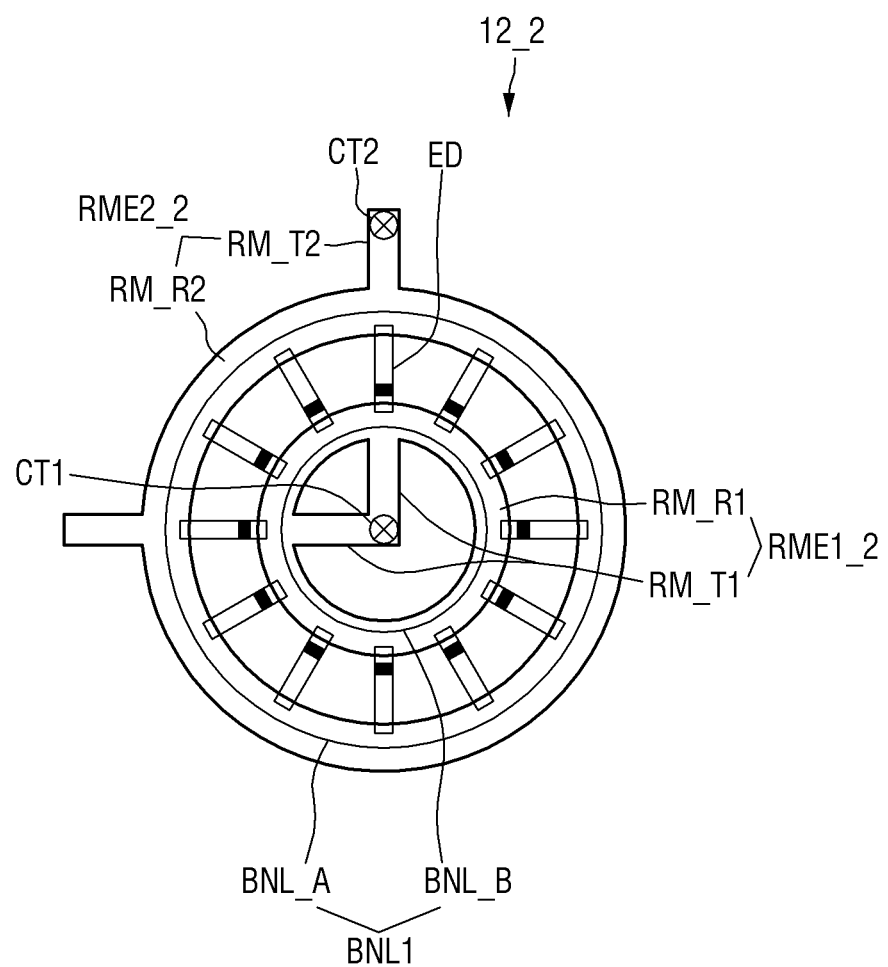
FIGS. 32 through 34 are schematic plan views illustrating the shapes of electrodes of each of display devices according to other embodiments of the disclosure.
Figure 33:
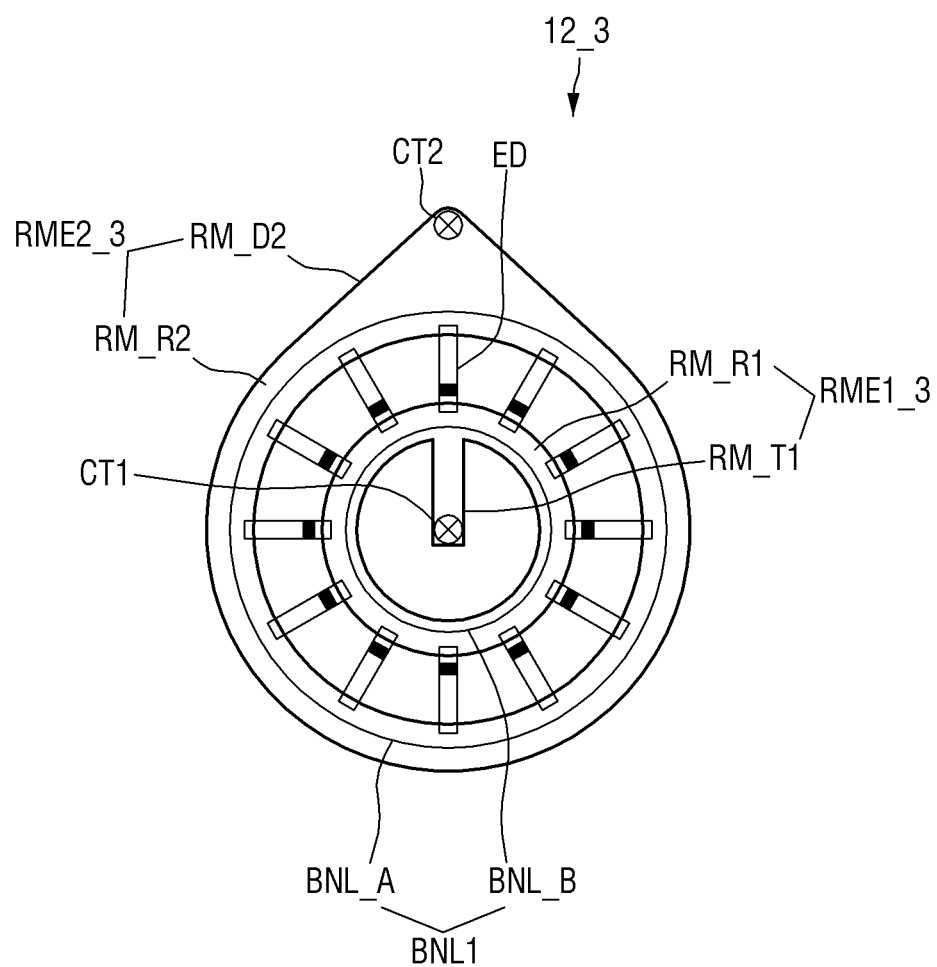
Figure 34:
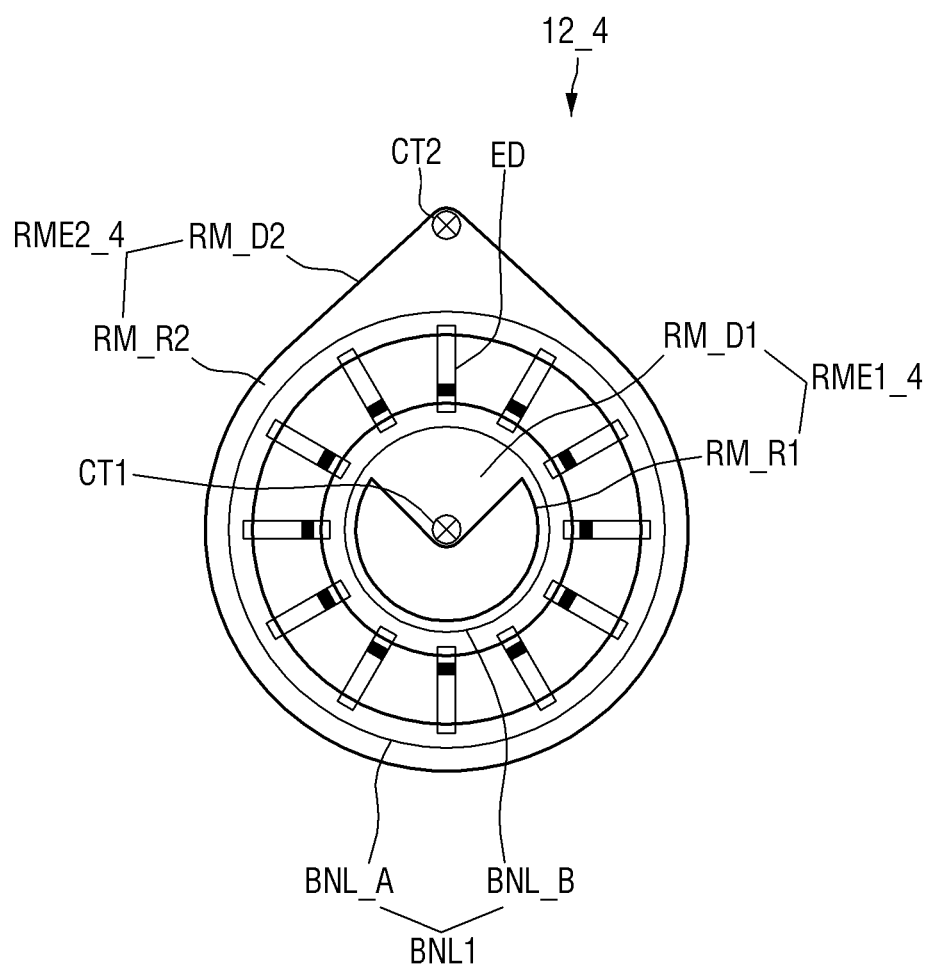

FIGS. 32 through 34 are schematic plan views illustrating the shapes of electrodes of each of display devices according to other embodiments of the disclosure.

Referring to a display device 12_2 of FIG. 32, each of first and second electrodes RME1_2 and RME2_2 may include a ring-shaped outer part RM_R1 or RM_R2 and at least one protruding part RM_T1 or RM_T2 for connection to a first or second contact hole CT1 or CT2. Specifically, the first electrode RME1_2 may include a first outer part RM_R1 and at least one first protruding part RM_T1, and the second electrode RME2_2 may include a second outer part RM_R2 and at least one second protruding part RM_T2. The embodiment of FIG. 32 differs from the embodiment of FIG. 31 in the number of first protruding parts RM_T1 of the first electrode RME1_2 and the shape of the second electrode RME2_2.

The first electrode RME1_2 may include at least one first protruding part RM_T1, which protrudes from the first outer part RM_R1 toward the first contact hole CT1. One or more first protruding parts RM_T1 may be formed. FIG. 32 illustrates that two first protruding parts RM_T1 are disposed to extend in first and second directions DR1 and DR2, but the number of first protruding parts RM_T1 of the first electrode RME1_2 is not particularly limited.

Similarly, the second electrode RME2_2 may include a second outer part RM_R2 and at least one second protruding part RM_T2. The second outer part RM_R2 may be spaced apart from the first outer part RM_R1 and have a predetermined width and may be disposed to cover the inner side of a first sub-bank BNL_A with a hole formed therein. In some embodiments, the second outer part RM_R2 may have a shape identical to the first outer part RM_R1. The second protruding part RM_T2 may protrude in an outward direction from the second outer part RM_R2 or in an opposite direction to the first protruding part RM_T1. The second protruding part RM_T2 may protrude toward the second contact hole CT2 and may be connected to a second voltage line VL2 through the second contact hole CT2. Also, the second protruding part RM_T2 may be formed to correspond to the first protruding part RM_T1. In a case where the first electrode RME1_2 includes two first protruding parts RM_T1, the second electrodes RME2_2 may include two second protruding parts RM_T2 accordingly. The second protruding part RM_T2 may be formed at a location where it can be aligned with the first protruding part RM_T1. The first and second protruding parts RM_T1 and RM_T2 of the first and second electrodes RME1_2 and RME2_2 may correspond to first parts of the first and second electrodes RME1_2 and RME2_2 with a relatively large width. The first and second electrodes RME1_1 RME2_1 may include the first and second protruding parts RM_T1 and RM_T2, respectively, to be connected to their respective underlying conductive layers through the first and second conductive holes CT1 and CT2, respectively, and may be formed to correspond to each other to minimize the difference in width therebetween.

Referring to a display device 12_3 of FIG. 33, a second electrode RME2_3 may include a second outer part RM_R2 and an expanded part RM_D2, which protrudes outwardly from the second outer part RM_R2 to correspond to a first protruding part RM_T1 of a first electrode RME1_3 but may have a greater area than the first protruding part RM_T1. The embodiment of FIG. 33 differs from the embodiment of FIG. 32 at least in that the second electrode RME2_3 includes the expanded part RM_D2, instead of a second protruding part RM_T2. The expanded part RM_D2 may have a greater area than the first protruding part RM_T1 of the first electrode RME1_3. As the width or area of the first protruding part RM_T1 of the first electrode RME1_3 differs from the width or area of the expanded part RM_D2 of the second electrode RME2_3, the flow of ink may be generated. Since the second electrode RME2_3 includes the expanded part RM_D2 to correspond to the first protruding part RM_T1 of the first electrode RMe1_3, light-emitting elements ED may be prevented from being lost by moving to the inside of the first outer part RM_R1, and the alignment of the light-emitting elements ED at a particular location may be induced due to the difference in width between the first protruding part RM_T and the expanded part RM_D2.

Referring to a display device 12_4 of FIG. 34, first and second electrodes RME1_4 and RME2_4 may include outer parts (RM_R1 and RM_R2) and expanded parts (RM_D1 and RM_D2). Specifically, the first electrode RME1_4 may include a first outer part RM_R1 and a first expanded part RM_D1, and the second electrode RME2_4 may include a second outer part RM_R2 and a second expanded part RM_D2. The embodiment of FIG. 34 differs from the embodiment of FIG. 33 at least in that not only the second electrode RME2_4, but also the first electrode RME1_4, includes an expanded part with a relatively large area.

As first and second electrodes RME1 and RME2 of each subpixel PXn have a circular shape, each subpixel PXn may not necessarily be arranged in first and second directions DR1 and DR2. For example, subpixels PXn of a pixel PX may be arranged in a direction between the first and second directions DR1 and DR2, and second electrodes RME2 of the subpixels PXn may be electrically connected to one another through the same contact hole CT2.

Figure 35:
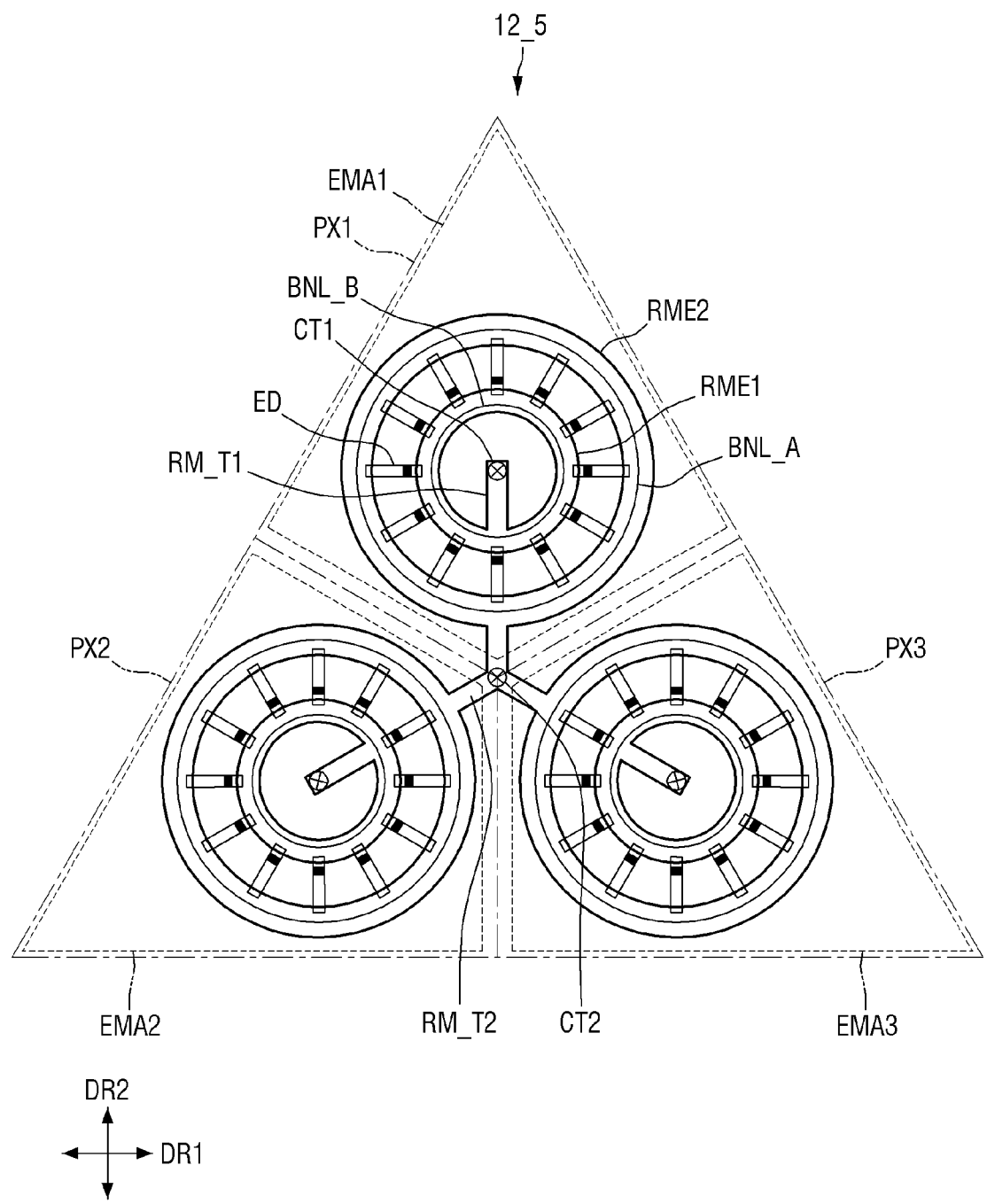
FIGS. 35 through 37 are schematic plan views of electrodes disposed in a pixel of each of display devices according to other embodiments of the disclosure.
Figure 36:
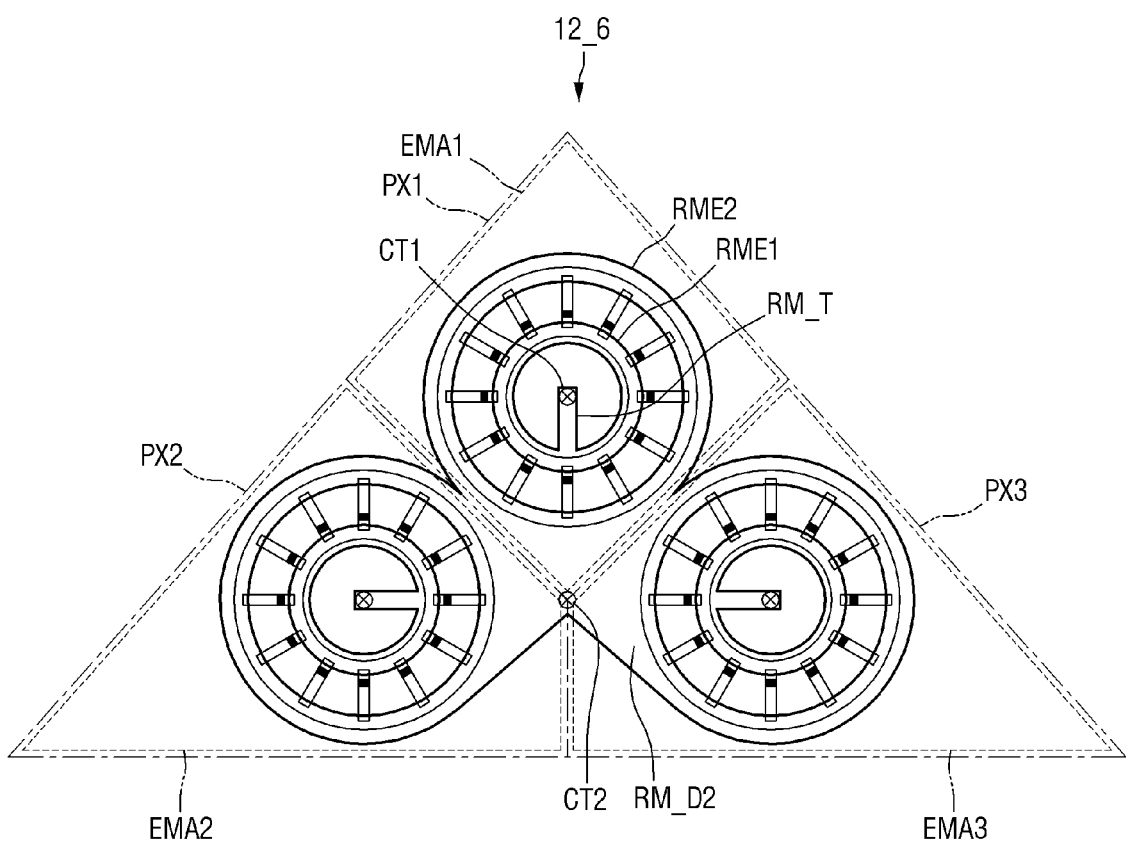
Figure 37:
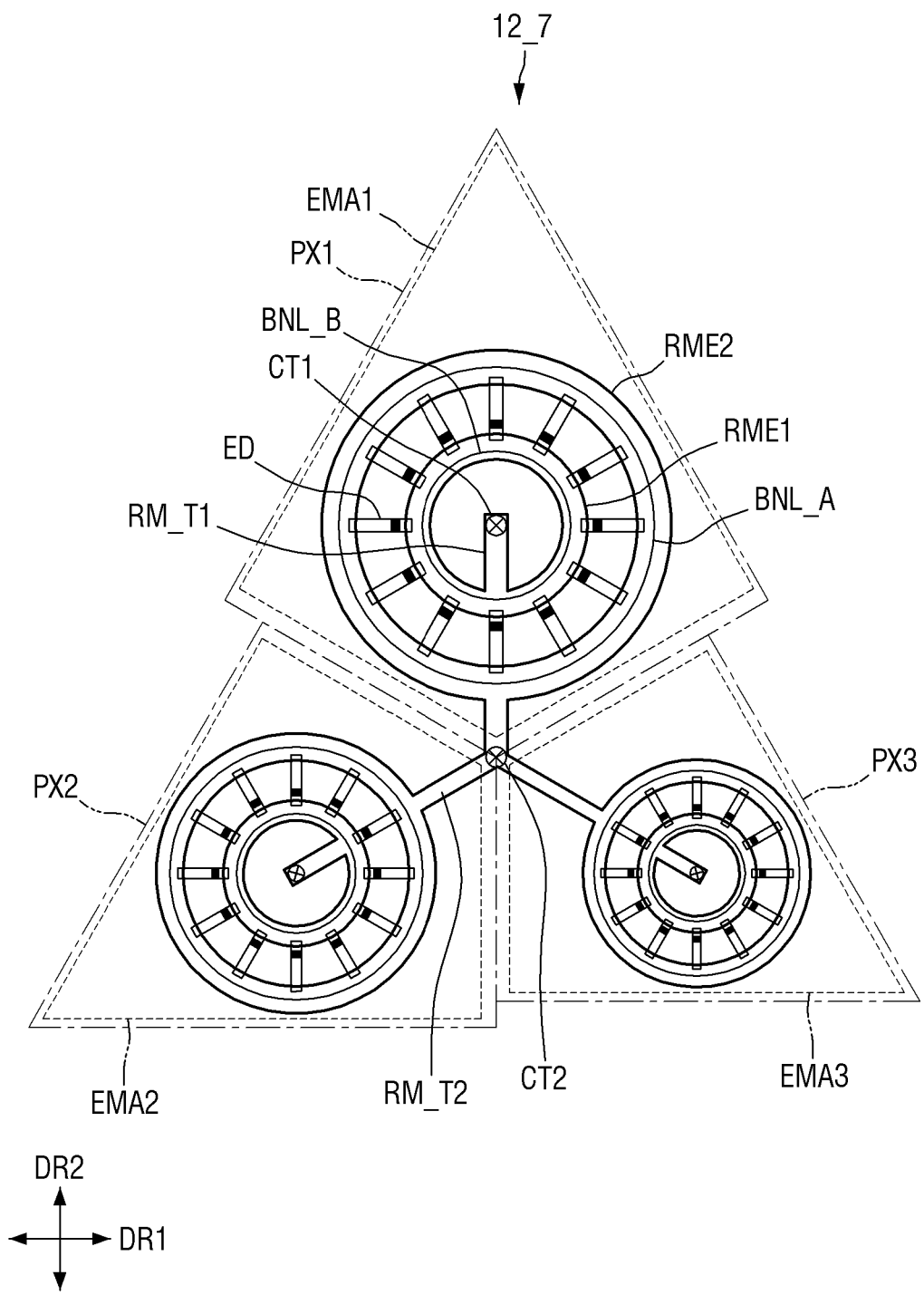

FIGS. 35 through 37 are plan views of electrodes disposed in a pixel of each of display devices according to other embodiments of the disclosure.

Referring to a display device 12_5 of FIG. 35, first and second electrodes RME1 and RME2 of each subpixel PXn may have a similar structure to their respective counterparts of FIG. 32, but may include only one protruding part, i.e., a first or second protruding part RM_T1 or RM_T2. Subpixels PXn of a pixel PX, i.e., first, second, and third subpixels PX1, PX2, and PX3, may not be arranged side-by-side in a first direction DR1. For example, the second subpixel PX2 may be disposed diagonally on a lower left side of the first subpixel PX1, and the third subpixel PX3 may be disposed diagonally on a lower right side of the first subpixel PX1. The second and third subpixels PX2 and PX3 may be disposed side-by-side in the first direction DR1. Accordingly, the display device 12_5 may have a PENTILE™ structure in which the first, second, and third subpixels PX1, PX2, and PX3 are arranged diagonally with respect to one another, rather than a structure where the first, second, and third subpixels PX1, PX2, and PX3 are repeatedly arranged one after another in the first direction.

A second contact hole CT2 may be formed at the point where the first, second, and third subpixels PX1, PX2, and PX3 meet, i.e., the center of the pixel PX, and second electrodes RME2 of the first, second, and third subpixels PX1, PX2, and PX3 may protrude toward the second contact hole CT2. Second protruding parts RM_T2 of second electrodes RME2 of different subpixels PXn may be connected to one another at the point where the first, second, and third subpixels PX1, PX2, and PX3 meet. For example, the second electrodes RME2 of the first, second, and third subpixels PX1, PX2, and PX3 may all be electrically connected to one another at the boundary between the first, second, and third subpixels PX1, PX2, and PX3. Even though the second electrode RME2 of the first, second, and third subpixels PX1, PX2, and PX3 are all connected to one another, the first, second, and third subpixels PX1, PX2, and PX3 may emit light independently in response to electrical signals applied to the first electrodes RME1 of the first, second, and third subpixels PX1, PX2, and PX3. Also, the first protruding parts RM_T1 of the first electrodes RME1 of the first, second, and third subpixels PX1, PX2, and PX3 may be formed to correspond to the second protruding parts RM_T2 of the first, second, and third subpixels PX1, PX2, and PX3.

Referring to a display device 12_6 of FIG. 36, first and second electrodes RME1 and RME2 of each subpixel PXn may have a similar shape to their respective counterparts of FIG. 33, and in the embodiment of FIG. 36, unlike in the embodiment of FIG. 35, subpixels PXn of a pixel PX may be arranged in a PENTILE™ structure. Expanded parts RM_D of the second electrodes RME of different subpixels PXn may be formed to protrude toward a second contact hole CT2 and may be electrically connected to one another.

Referring to a display device 12_7 of FIG. 37, different subpixels PXn of a pixel PX may have different sizes depending on the color or wavelength of light emitted from light-emitting elements ED thereof. The embodiment of FIG. 37 is substantially identical to the embodiment of FIG. 36 in the shape of electrodes (RME1 and RME2) of each subpixel PXn and the arrangement of subpixels PXn and differs from the embodiment of FIG. 36 at least in the size of the electrodes (RME1 and RME2). Accordingly, first, second, and third subpixels PX1, PX2, and PX3 may have different sizes, and first, second, and third emission areas EMA1, EMA2, and EMA3 of the first, second, and third subpixels PX1, PX2, and PX3 may also have different sizes. The first, second, and third subpixels PX1, PX2, and PX3 may include groups of light-emitting elements ED that emit light of different wavelength ranges, and the first, second, and third emission areas EMA1, EMA2, and EMA3 may emit light of different colors. The size of emission areas (EMA1, EMA2, and EMA3) may vary depending on the color of light emitted from the emission areas (EMA1, EMA2, and EMA3). FIG. 37 illustrates that the first subpixel PX1 is greater than the second and third subpixels PX2 and PX3 and the second subpixel PX2 is greater than the third subpixel PX3, but the disclosure is not limited thereto. The size of subpixels (PX1, PX2, and PX3) and the size of the emission areas (EMA1, EMA2, and EMA3) may vary depending on the color of light emitted from light-emitting elements ED. In some embodiments, each pixel PX may include subpixels PXn having a smallest size. By controlling the size of each subpixel PXn depending on the color of light emitted from an emission area EMA of a corresponding subpixel PXn, any deviation in each color visible to a user may be reduced.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
    a first electrode and a second electrode disposed on a substrate, spaced apart from each other in a first direction, and extending in a second direction; and
    a plurality of light-emitting elements disposed on the first and second electrodes and spaced apart from one another in the second direction, wherein
    the first electrode includes:
        at least one first part having a greater width than the second electrode in the first direction, at least one light-emitting element among the plurality of light emitting elements overlapping the at least one first part in a third direction perpendicular to both the first direction and the second direction; and
        at least one second part having a smaller width than the at least one first part in the first direction, at least one light-emitting element among the plurality of light emitting elements overlapping the at least one second part in the third direction.

2. The display device of claim 1, further comprising:
    a first contact electrode disposed on the first electrode and electrically contacting the plurality of light-emitting elements; and
    a second contact electrode disposed on the second electrode and electrically contacting the plurality of light-emitting elements.

3. The display device of claim 2, wherein
    the plurality of light-emitting elements include at least one first light-emitting element that includes a first end portion electrically contacting the first contact electrode and at least one second light-emitting element that includes a second end portion electrically contacting the second contact electrode, and
    the display device further comprises a third contact electrode electrically contacting a second end portion of the at least one first light-emitting element and a first end portion of the second light-emitting element.

4. The display device of claim 1, wherein, in a view in a third direction perpendicular to both the first direction and the second direction,
    a first edge of the at least one first part of the first electrode and a first edge of the at least one second part of the first electrode face the second electrode in the first direction,
    the first edge of the at least one first part and the first edge of the at least one second part are aligned with each other and linearly extend in the second direction, and
    a second edge of the at least one first part of the first electrode is offset in the first direction from a second edge of the at least one second part of the first electrode.

5. The display device of claim 4, wherein more light-emitting elements overlap the at least one first part of the first electrode in the third direction than overlap the at least one second part of the first electrode in the third direction.

6. The display device of claim 5, wherein
the at least one first part of the first electrode includes a plurality of first parts, and
the at least one second part is disposed between at least two of the plurality of first parts.

7. The display device of claim 5, wherein
the at least one second part of the first electrode includes a plurality of second parts, and
the at least one first part is disposed between at least two of the plurality of second parts.

8. The display device of claim 5, wherein the width of the at least one first part of the first electrode varies along the second direction.

9. The display device of claim 4, wherein
the at least one first part of the first electrode includes a plurality of first parts,
the at least one second part of the first electrode includes a plurality of second parts, and
the plurality of first parts and the plurality of second parts are alternately arranged along the second direction.

10. The display device of claim 9, wherein
the plurality of first parts are disposed to adjoin one another, and
the plurality of second parts are disposed at boundaries between the plurality of first parts.

11. A display device, comprising:
a first electrode and a second electrode disposed on a substrate, spaced apart from each other in a first direction, and extending in a second direction; and
a plurality of light-emitting elements disposed on the first and second electrodes and spaced apart from one another in the second direction, wherein
the first electrode includes:
  at least one first part having a greater width than the second electrode in the first direction; and
  at least one second part having a smaller width than the at least one first part in the first direction,
a first side of the at least one first part of the first electrode faces the second electrode in the first direction and is coplanar with a first side of the at least one second part of the first electrode, and
a second side of the at least one first part of the first electrode protrudes in the first direction away from the first side of the at least one first part of the first electrode more than a second side of the at least one second part of the first electrode.

12. The display device of claim 11, wherein
the plurality of light-emitting elements include:
  a first light-emitting element group including at least one light-emitting element, which includes a first end portion disposed on the at least one first part of the first electrode and a second end portion disposed on the second electrode; and
  a second light-emitting element group including at least one light-emitting element, which includes a first end portion disposed on the at least one second part of the first electrode and a second end portion disposed on the second electrode, and
the first light-emitting element group has a greater number of light-emitting elements per unit area than the second light-emitting element group.

13. The display device of claim 12, wherein:
the at least one first part of the first electrode includes a plurality of first parts, and
the at least one second part is disposed between at least two of the plurality of first parts.

14. The display device of claim 12, wherein;
the at least one second part of the first electrode includes a plurality of second parts, and
the at least one first part is disposed between at least two of the plurality of second parts.

15. The display device of claim 12, wherein the width of the at least one first part of the first electrode varies along the second direction.

16. The display device of claim 11, wherein
the first electrode further includes at least one third part having a smaller width in the first direction than the at least one second part, and
the at least one third part, the at least one second part, and the at least one first part are sequentially arranged in the second direction.

17. The display device of claim 11, wherein
the first electrode further includes at least one fourth part having a smaller width in the first direction than the at least one first part and having a greater width in the first direction than the at least one second part, and
the width of the at least one fourth part varies along the second direction.

18. The display device of claim 11, wherein
the at least one first part of the first electrode includes a plurality of first parts,
the at least one second part of the first electrode includes a plurality of second parts, and
the plurality of first parts and the plurality of second parts are alternately arranged in the second direction.

19. The display device of claim 18, wherein
the plurality of first parts are disposed to adjoin one another, and
the plurality of second parts are disposed at boundaries between the plurality of first parts.

20. A display device, comprising:
a first electrode and a second electrode disposed on a substrate, spaced apart from each other in a first direction, and extending in a second direction;
a third electrode disposed between the first and second electrodes and having a width equal to a width of the second electrode;
a fourth electrode disposed between the second and third electrodes; and
a plurality of light-emitting elements disposed on the first and third electrodes or on the second and fourth electrodes, the plurality of light emitting elements being spaced apart from one another in the second direction,
wherein the first and fourth electrodes each respectively include:
  at least one first part having a greater width than the second electrode in the first direction; and
  at least one second part having a smaller width than the at least one first part in the first direction.

* * * * *